US010314185B2

(12) United States Patent
Cavenagh et al.

(10) Patent No.: US 10,314,185 B2
(45) Date of Patent: Jun. 4, 2019

(54) PROTECTIVE ENCLOSURE FOR ENCASING AN ELECTRONIC DEVICE

(71) Applicant: Otter Products, LLC, Fort Collins, CO (US)

(72) Inventors: Ryan J. Cavenagh, Fort Collins, CO (US); Jeremy L. Dennis, Fort Collins, CO (US); Cameron D. Magness, Fort Collins, CO (US); Lucas B. Weller, Fort Collins, CO (US); Hsiao Lu Sun, Fort Collins, CO (US)

(73) Assignee: Otter Products, LLC, Fort Collins, CO (US)

( * ) Notice: Subject to any disclaimer, the term of this patent is extended or adjusted under 35 U.S.C. 154(b) by 0 days.

(21) Appl. No.: 16/003,932

(22) Filed: Jun. 8, 2018

(65) Prior Publication Data

US 2018/0295736 A1   Oct. 11, 2018

Related U.S. Application Data

(63) Continuation of application No. 15/811,310, filed on Nov. 13, 2017, now Pat. No. 10,064,298.

(60) Provisional application No. 62/421,478, filed on Nov. 14, 2016.

(51) Int. Cl.
| | |
|---|---|
| *G06F 1/16* | (2006.01) |
| *H05K 5/02* | (2006.01) |
| *H05K 5/00* | (2006.01) |
| *H04B 1/3888* | (2015.01) |
| *H04M 1/02* | (2006.01) |
| *H04M 1/18* | (2006.01) |
| *A45C 11/00* | (2006.01) |

(52) U.S. Cl.
CPC ............ *H05K 5/0226* (2013.01); *A45C 11/00* (2013.01); *H04B 1/3888* (2013.01); *H04M 1/022* (2013.01); *H04M 1/185* (2013.01); *H05K 5/0004* (2013.01); *H05K 5/0021* (2013.01); *H05K 5/0086* (2013.01); *A45C 2011/002* (2013.01); *G06F 1/1616* (2013.01); *H04M 1/0268* (2013.01)

(58) Field of Classification Search
CPC .................................................... G06F 1/1656
USPC ........................................ 361/679.55, 679.56
See application file for complete search history.

(56) References Cited

U.S. PATENT DOCUMENTS

| | | | | |
|---|---|---|---|---|
| 4,984,706 A | * | 1/1991 | Cadwell ................ | E05D 11/105 220/829 |
| 5,632,373 A | * | 5/1997 | Kumar .................. | G06F 1/1628 206/305 |
| 5,966,647 A | | 10/1999 | Sawai | |
| 6,109,434 A | | 8/2000 | Howard | |

(Continued)

FOREIGN PATENT DOCUMENTS

| | | |
|---|---|---|
| WO | 1994000037 A1 | 1/1994 |
| WO | 1999041958 A1 | 8/1999 |

*Primary Examiner* — Anthony Q Edwards

(57) ABSTRACT

A protective enclosure for an electronic device includes a first case portion that may be adapted to surround at least a portion of a top device portion and a second case portion that may be adapted to surround at least a portion of a bottom device portion. The protective enclosure may also include a first hinge member coupled to a portion of the first case portion and a portion of the second case portion, and the first hinge member may pivot about a first hinge axis that is coaxially aligned with or parallel to a device hinge axis.

18 Claims, 48 Drawing Sheets

(56) References Cited

U.S. PATENT DOCUMENTS

| | | |
|---|---|---|
| 6,267,236 B1 | 7/2001 | Seok |
| 7,343,184 B2 | 3/2008 | Rostami |
| 7,444,176 B2 | 10/2008 | Oda et al. |
| 7,609,512 B2 | 10/2009 | Richardson et al. |
| 7,850,032 B2 | 12/2010 | Carnevali et al. |
| 7,886,903 B1 * | 2/2011 | Wurzelbacher, Jr. ............ G06F 1/1616 206/320 |
| 7,933,122 B2 | 4/2011 | Richardson et al. |
| 8,261,933 B2 | 9/2012 | Kidd et al. |
| 8,310,826 B2 | 11/2012 | Wu et al. |
| 8,498,103 B2 * | 7/2013 | Graneto, III ............ G06F 1/1656 206/320 |
| 8,965,458 B2 | 2/2015 | Richardson et al. |
| 9,025,317 B2 | 5/2015 | Richardson et al. |
| 9,232,674 B2 * | 1/2016 | Wang .................... H05K 7/00 |
| 9,735,595 B2 | 8/2017 | Colahan et al. |
| 2002/0065054 A1 | 5/2002 | Humphreys et al. |
| 2003/0095374 A1 | 5/2003 | Richardson |
| 2003/0114184 A1 | 6/2003 | Wilson |
| 2004/0180706 A1 | 9/2004 | Pan |
| 2004/0256535 A1 | 12/2004 | Desch |
| 2004/0262179 A1 | 12/2004 | Gartrell et al. |
| 2005/0045505 A1 | 3/2005 | Vandevenne et al. |
| 2005/0139498 A1 | 6/2005 | Goros |
| 2006/0160586 A1 | 7/2006 | Cheng |
| 2006/0175370 A1 | 8/2006 | Arney et al. |
| 2006/0177048 A1 | 8/2006 | Tsutaichi et al. |
| 2007/0201689 A1 | 8/2007 | Uramoto et al. |
| 2007/0205122 A1 | 9/2007 | Oda et al. |
| 2008/0032758 A1 | 2/2008 | Rostami |
| 2008/0053851 A1 | 3/2008 | Ko et al. |
| 2008/0083631 A1 | 4/2008 | Tsang et al. |
| 2008/0121321 A1 * | 5/2008 | Tiner ............ A45C 1/06 150/131 |
| 2008/0125197 A1 | 5/2008 | Hongo et al. |
| 2008/0302687 A1 | 12/2008 | Sirichai et al. |
| 2009/0009945 A1 | 1/2009 | Johnson et al. |
| 2009/0032421 A1 | 2/2009 | Sween et al. |
| 2009/0034169 A1 | 2/2009 | Richardson et al. |
| 2009/0050499 A1 | 2/2009 | Calco et al. |
| 2009/0194445 A1 | 8/2009 | Mongan et al. |
| 2009/0211775 A1 | 8/2009 | Yamaguchi et al. |
| 2009/0233658 A1 | 9/2009 | Murayama et al. |
| 2009/0236246 A1 | 9/2009 | Ai |
| 2009/0314400 A1 | 12/2009 | Liu |
| 2010/0096284 A1 | 4/2010 | Bau |
| 2010/0110629 A1 | 5/2010 | Dietz et al. |
| 2010/0122924 A1 | 5/2010 | Andrews |
| 2010/0238119 A1 | 9/2010 | Dubrovsky et al. |
| 2011/0157800 A1 | 6/2011 | Richardson et al. |
| 2011/0228459 A1 | 9/2011 | Richardson et al. |
| 2012/0043234 A1 | 2/2012 | Westrup |
| 2012/0088557 A1 | 4/2012 | Liang |
| 2012/0154288 A1 | 6/2012 | Walker |
| 2012/0199501 A1 | 8/2012 | Gette et al. |
| 2012/0261304 A1 | 10/2012 | Busri |
| 2014/0043737 A1 | 2/2014 | Chen et al. |
| 2014/0262875 A1 | 9/2014 | Carnevali |
| 2015/0156297 A1 | 6/2015 | Crawford et al. |
| 2015/0257285 A1 | 9/2015 | Wilson et al. |
| 2016/0234951 A1 | 8/2016 | Chen et al. |
| 2016/0299532 A1 | 10/2016 | Gheorghiu et al. |
| 2017/0250719 A1 | 8/2017 | Stryker et al. |
| 2017/0257961 A1 | 9/2017 | Chen et al. |

\* cited by examiner

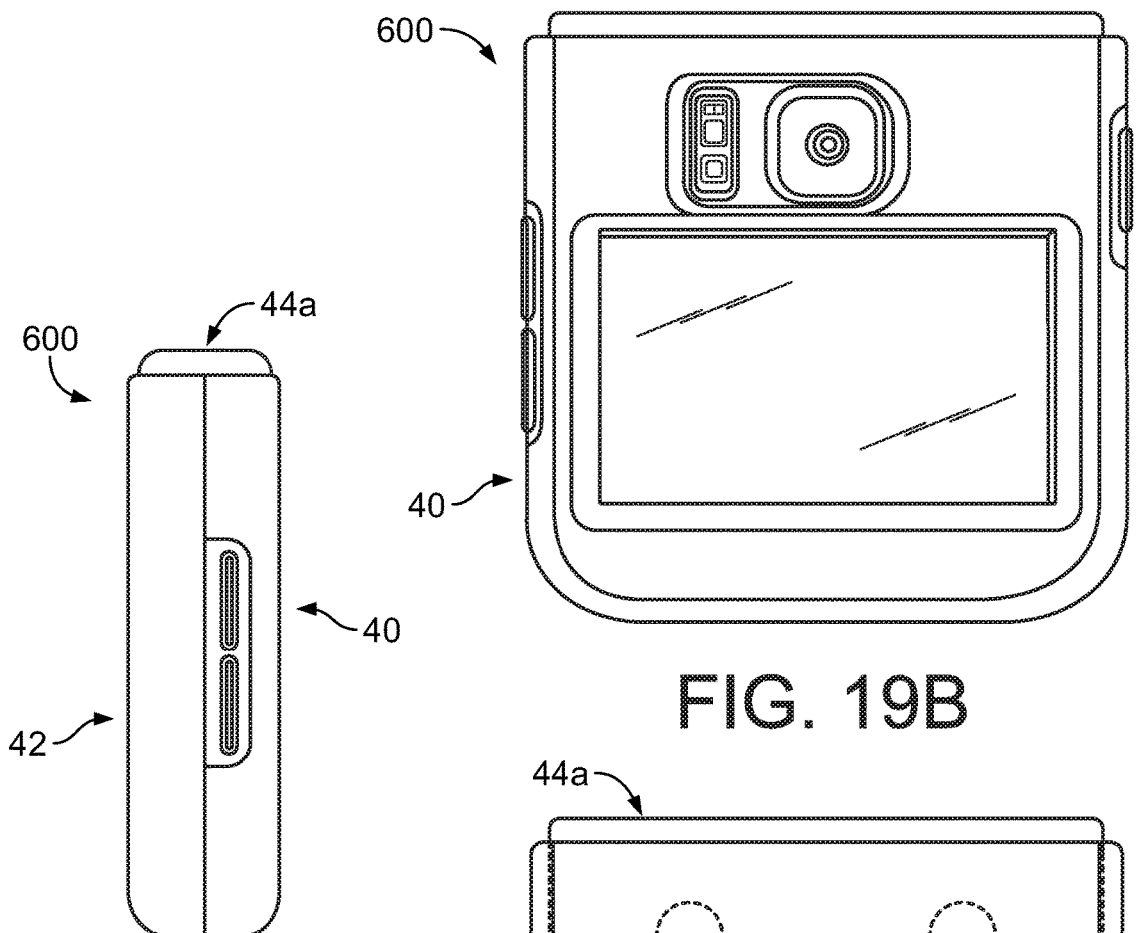
FIG. 19B
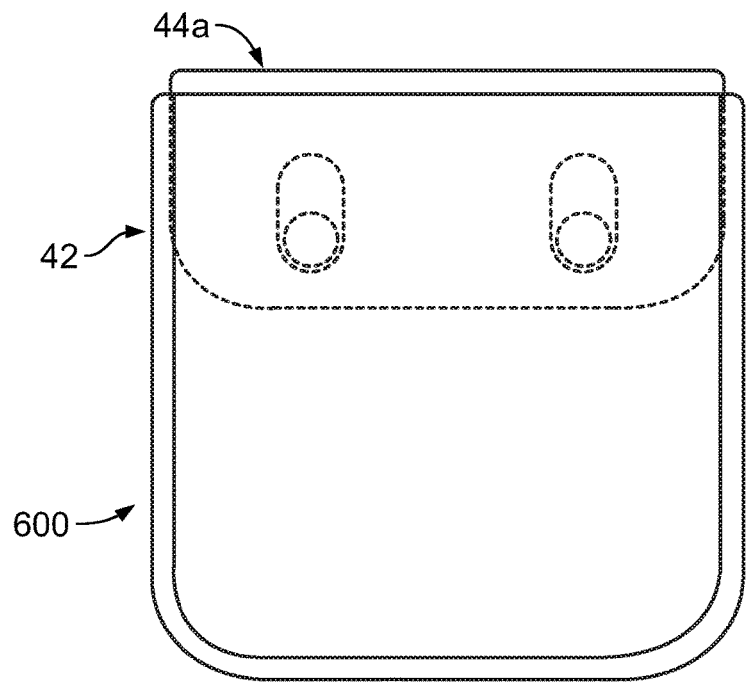
FIG. 19A
FIG. 19C

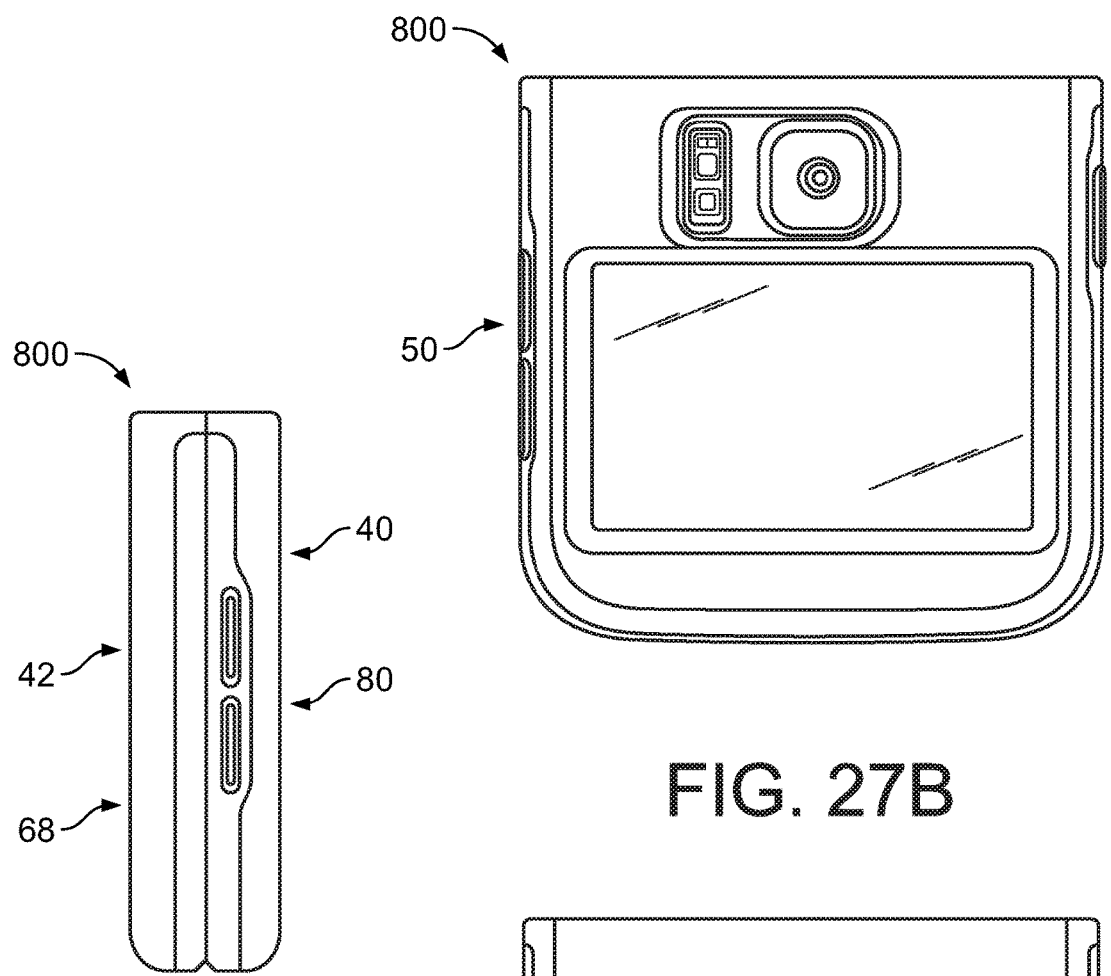
FIG. 27A
FIG. 27B
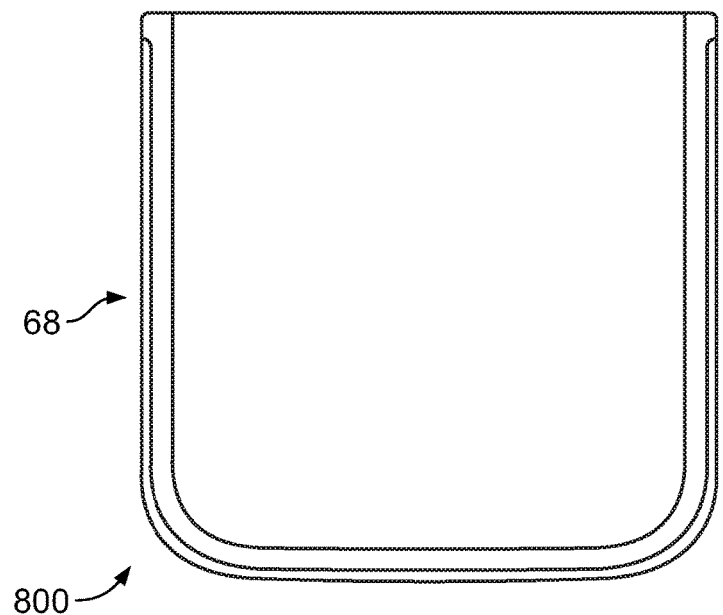
FIG. 27C

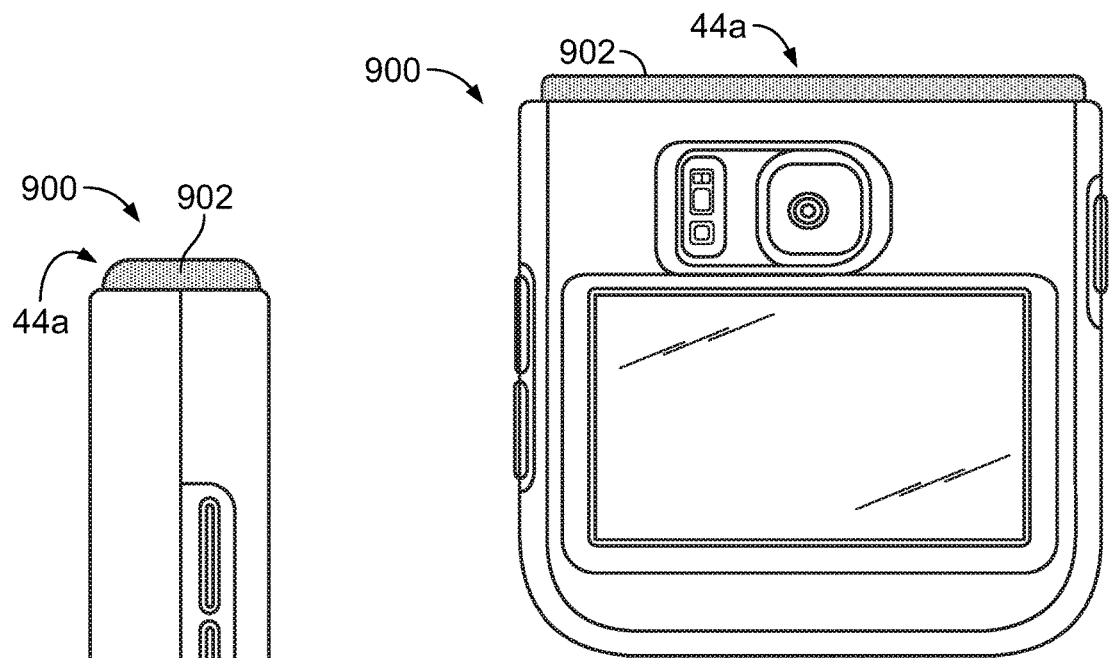
FIG. 31A
FIG. 31B
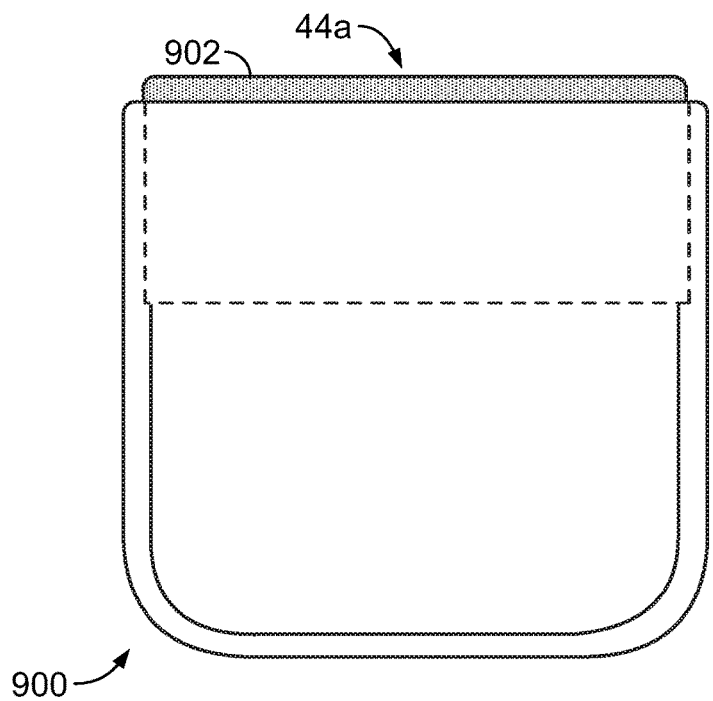
FIG. 31C

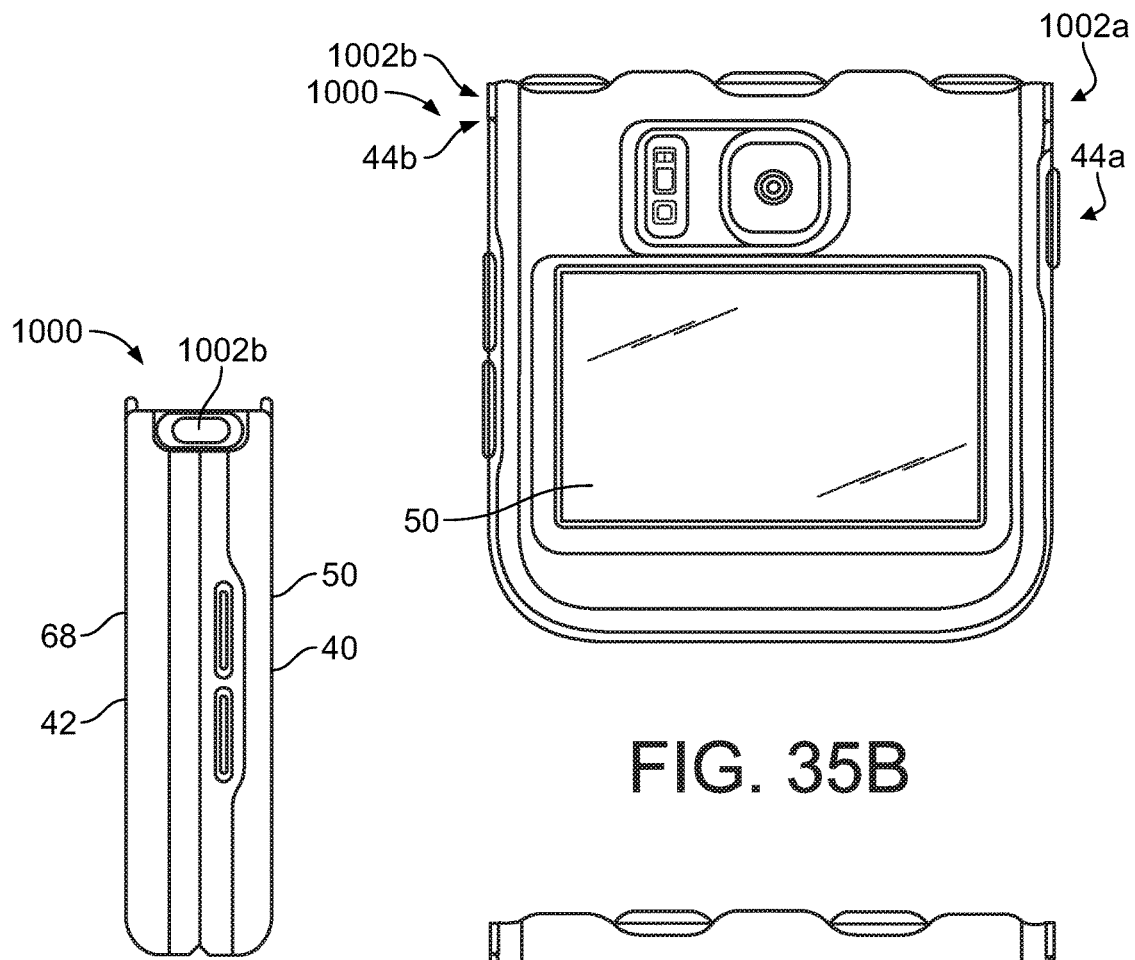
FIG. 35A
FIG. 35B
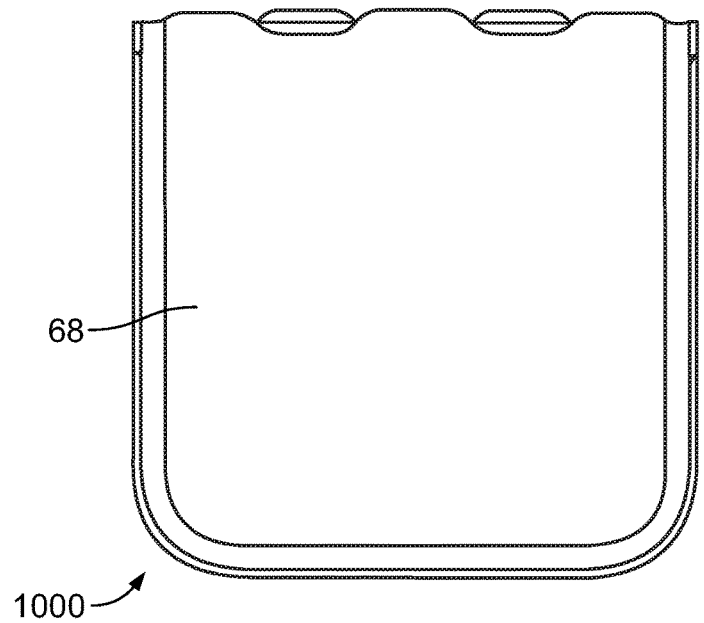
FIG. 35C

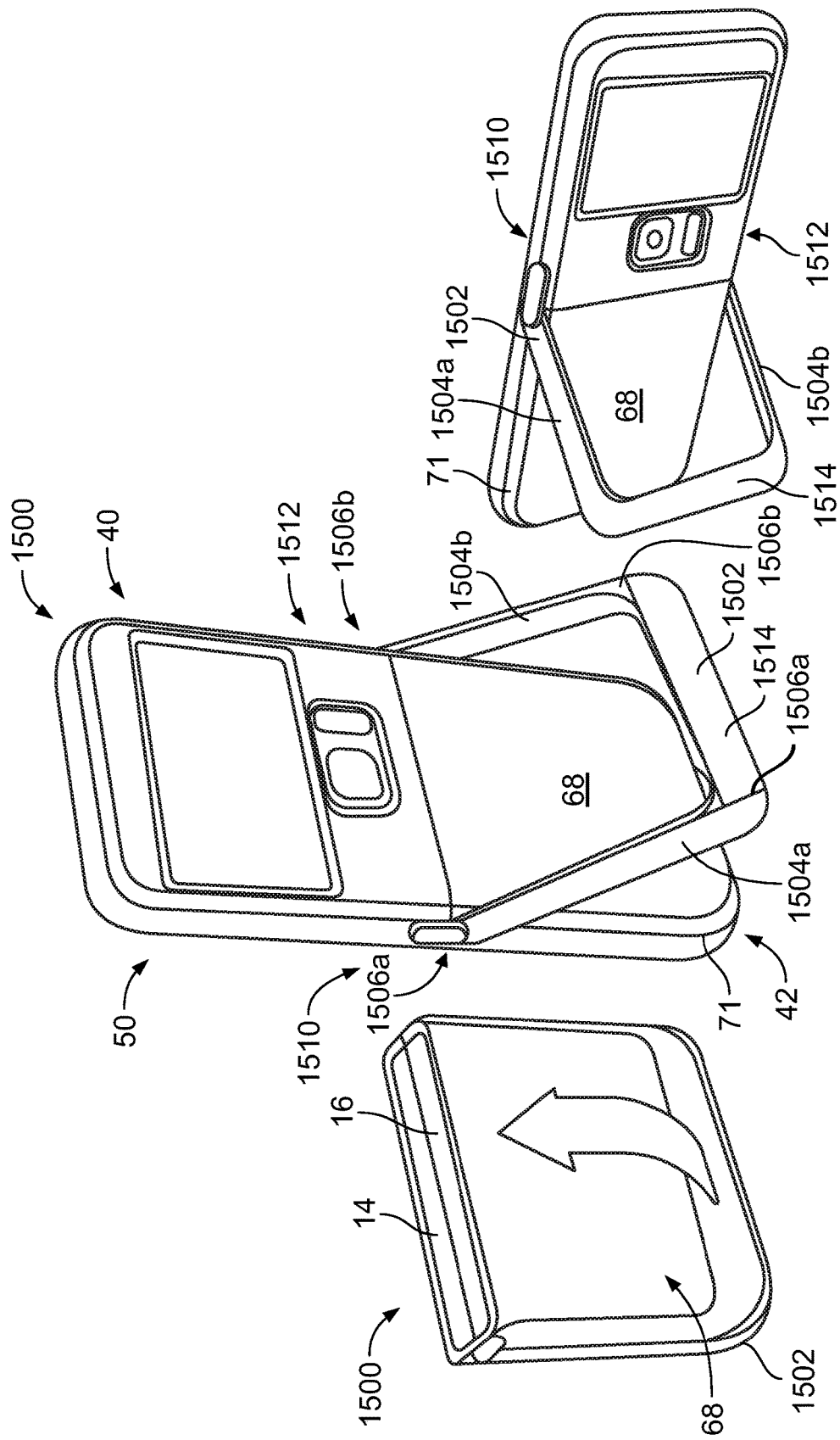

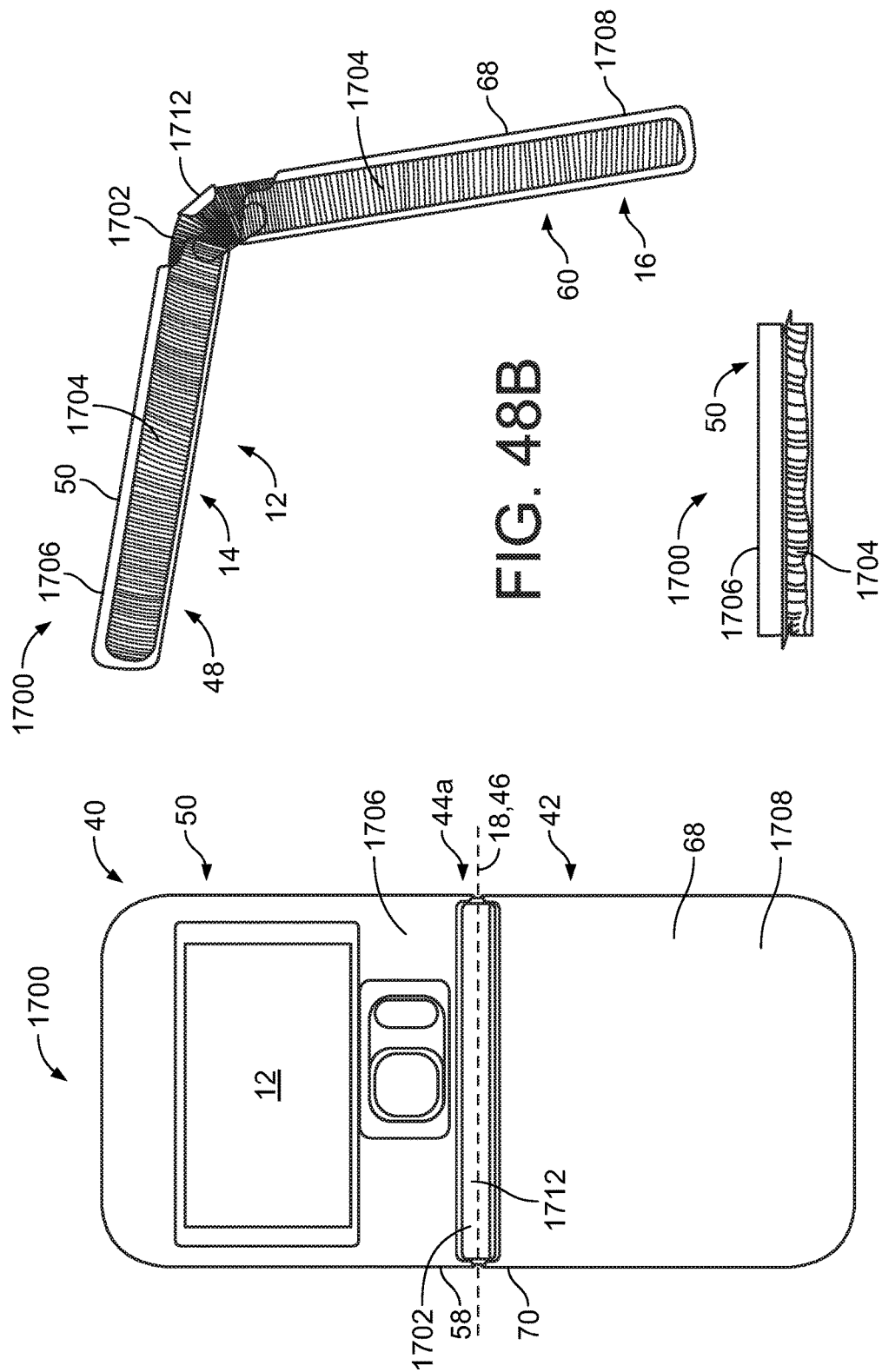

PROTECTIVE ENCLOSURE FOR ENCASING AN ELECTRONIC DEVICE

CROSS-REFERENCE TO RELATED APPLICATIONS

This application claims priority under 35 U.S.C. § 120 to, and is a continuation of, U.S. patent application Ser. No. 15/811,310 filed Nov. 13, 2017, entitled "Protective Enclosure for Encasing an Electronic Device", which claims the benefit of priority under 35 U.S.C. § 119(e) to U.S. Provisional Application No. 62/421,478 filed on Nov. 14, 2016, the contents of which are incorporated herein by reference in their entirety.

FIELD OF THE DISCLOSURE

This disclosure relates generally to a protective enclosure for protecting one or more objects, such as an object in need of protection from the elements, mishandling, and/or other mistreatment.

BACKGROUND

Rain, dirt, dust, mud, snow, and water in all of its forms can be damaging to various objects. Additionally, objects that are fragile or otherwise breakable can be damaged by mistreatment and/or other inappropriate handling, such as by dropping. It is, therefore, useful to have a protective enclosure within which an object in need of protection may be housed so as to protect it from inclement conditions, mistreatment, and/or inappropriate handling. Types of objects in need of such protection are electronic devices and/or the components thereof, precious items, perishable entities, and the like.

With respect to electronic devices, such devices are well known and widely used. For instance, a mobile telephone or tablet computer are electronic devices that are convenient tools that allow people to communicate with one another while on the go and away from traditional telephone landlines or Internet connections. For instance, mobile devices allow people to communicate via voice, text message, short message service (SMS), instant messaging (IM), and the like. Other such portable devices include computers, personal digital assistants, smartphones, electronic digital readers, electronic game devices, video recorders, cameras, and the like. While these devices may be portable and handy to use, they suffer from some drawbacks. For example, they are often expensive and contain fragile electronic components that make them prone to damage due to inclement weather and/or mishandling.

Accordingly, there is a need in the art for a mechanism whereby an object, such as a portable device, for instance, an electronic device and/or the components thereof, may be protected from inclement weather and/or errant handling and/or other damage that may result from contacting a fluid, such as water, dirt, dust, mud, snow, and the like. The present disclosure is directed to an apparatus and system for a protective enclosure or for encasing an object, such as a device and/or the components thereof in a manner that offers protection for the device from adverse environmental conditions, inclement weather, mishandling and/or damage, such as from contacting a fluid, such as water.

BRIEF DESCRIPTION OF THE DRAWINGS

FIGS. 16, 17, 18, 19A, 19B, and 19C are various views of an embodiment of a protective enclosure for an electronic device;

FIGS. 24, 25, 26, 27A, 27B, and 27C are various views of an embodiment of a protective enclosure for an electronic device;

FIGS. 28, 29, 30, 31A, 31B, and 31C are various views of an embodiment of a protective enclosure for an electronic device;

FIGS. 32, 33, 34, 35A, 35B, and 35C are various views of an embodiment of a protective enclosure for an electronic device;

FIGS. 46A, 46B, and 46C are various views of an embodiment of a protective enclosure for an electronic device;

FIGS. 48A, 48B, and 48C are various views of an embodiment of a protective enclosure for an electronic device.

DETAILED DESCRIPTION

Figure 1:
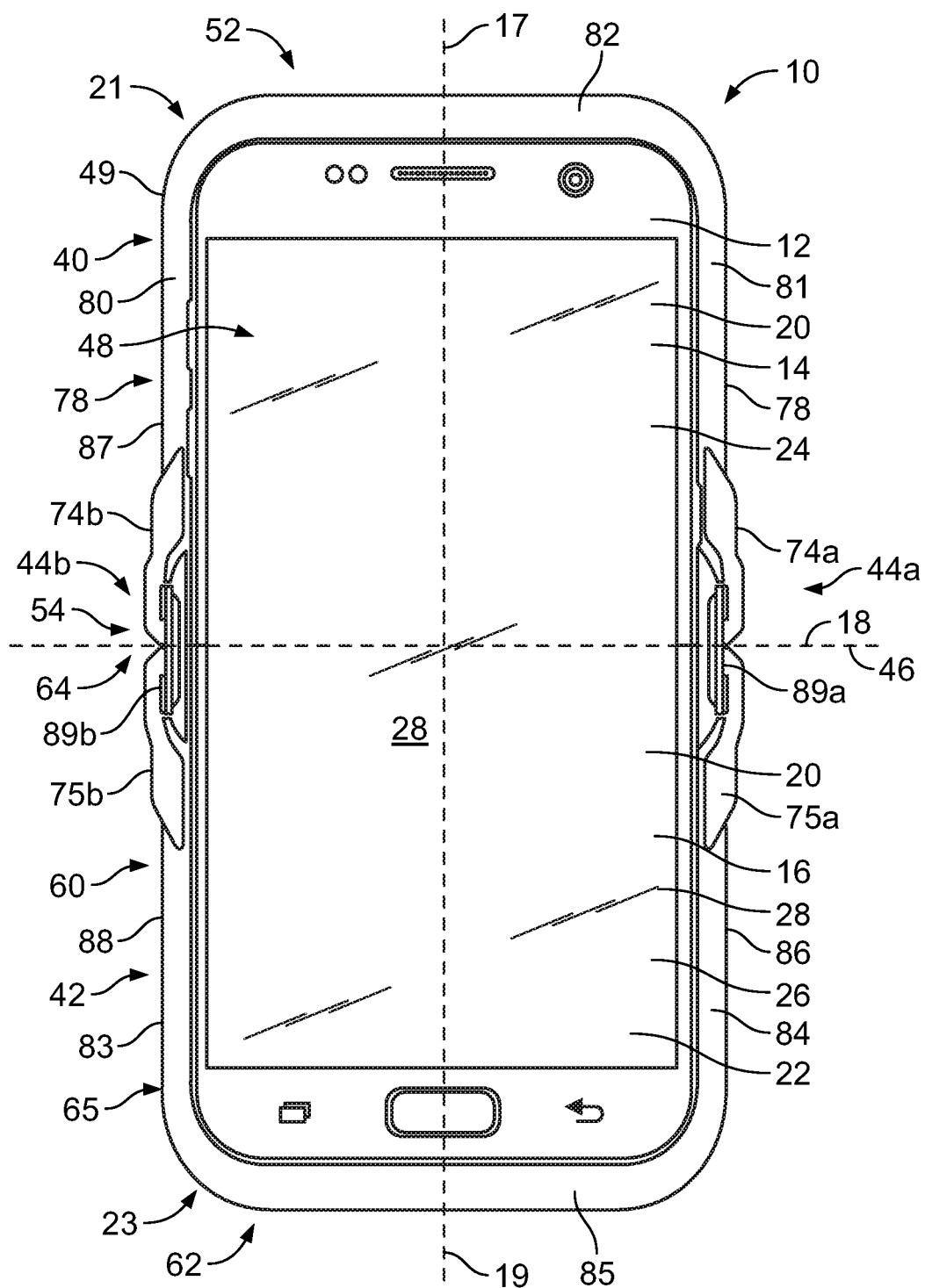
FIGS. 1, 2, 3A and 3B are various views of an embodiment of a protective enclosure for an electronic device.

The subject matter described herein relates generally to a housing, or protective enclosure, for encasing an object. It is to be understood that although the singular "object" is used herein, the term encompasses one or more objects. The object or objects may be any object that is capable of being fit within the protective enclosure and/or in need of protecting from one or more adverse environmental conditions, inclement weather, mishandling and/or damage, such as damage from contacting a liquid, such as water, or damage from dropping. The protective enclosure may be of any appropriate size and dimension so long as it is capable of enclosing the object and protecting it, for instance, from adverse environmental conditions and/or rough treatment. The object may be fabricated, e.g., a textile; manufactured: e.g., an electronic or mechanical device; synthesized; naturally occurring; processed; perishable, e.g., a food product; a precious item; and the like. The object may be a single object, like an electronic device, or may be a plurality of objects, such as components that make up an electronic device.

The protective enclosure may be in the form of any typical container known and used in the art for containing the particular object. For example, the protective enclosure may be a case configured for encasing a device, such as an electronic device, that may be, for example, a mobile telephone device, a mobile computing device, and/or a smart phone. The electronic device may have an interactive screen, such as a touch screen. In some instances, the protective enclosure may fit over at least a portion of an existing housing of the electronic device. In other instances, the protective enclosure is part of a device, such as an electronic device, which encloses or encases various components of the electronic device. For example, the protective enclosure may be the protective enclosure of a mobile device, or other electronic device, that encases the electronic components of the mobile telephone device (or other electronic device).

In certain embodiments two or more portions of the protective enclosure are configured for being coupled together so as to from a waterproof seal and/or shockproof structure. By a water-resistant or waterproof seal, it is meant that a seal is formed by the coupling of the top member with the bottom member in which the seal does not substantially allow the passage of liquid, e.g., water, from one side of the protective enclosure (e.g., outside of or exterior to the protective enclosure) to the other side of the protective enclosure (e.g., inside of or in an interior of the protective enclosure). By a shock resistant or shockproof structure, it is meant that one or more members of the protective enclosure functions to reduce the amount of or change the characteristics of a mechanical load imparted on the protective case so as to reduce the probability of damage to the particular object.

It is to be understood that although a particular embodiment is presented herein, such as a protective enclosure for encasing the electronic device, such as a smart phone, therein, the object to be housed may be any of a number of different objects, as described above, and the protective enclosure may, therefore, have a number of different shapes, sizes, and configurations without departing from the nature of the disclosure. For instance, as depicted herein below, the protective enclosure may include two separate members, e.g., separate individual top and bottom members, that are configured for being removably coupled together so as to surround an electronic device and thereby encase the electronic device. In certain instances (not shown), the top and bottom members may not be separate members, but rather may be members that are joined, for instance, by a common hinge element, or a single member configured for being folded upon itself and thereby forming the protective enclosure. Hence, the scope of the protective enclosures and systems described herein with respect to the particular embodiments set forth in reference to the figures is not intended to be unduly limiting.

Accordingly, FIG. 1 illustrates a front view of an embodiment of a protective enclosure 10 that may be adapted to at least partially enclose an electronic device 12. The electronic device 12 may be a foldable device that may include a top device portion 14 and a bottom device portion 16, and the top device portion 14 and the bottom device portion 16 may be pivotably displaceable about a device hinge axis 18 from or between an open first position (illustrated in FIGS. 1 and 2) and a closed second position (illustrated in FIGS. 3A and 3B).

In use, the electronic device 12 may be utilized in any of several configurations, including a configuration in which the device hinge axis 18 is oriented horizontally relative to a user, and the top device portion 14 may be on a top side of the device hinge axis 18 and the bottom device portion 16 may be on a bottom side of the device hinge axis 18 (or vice versa). Alternatively (or additionally), the electronic device 12 may be viewed in a configuration in which the device hinge axis 18 is orientated vertically relative to a user, and the top device portion 14 may be on a left side of the device hinge axis 18 and the bottom device portion 16 may be on a right side of the device hinge axis 18 (or vice versa).

Figure 2:
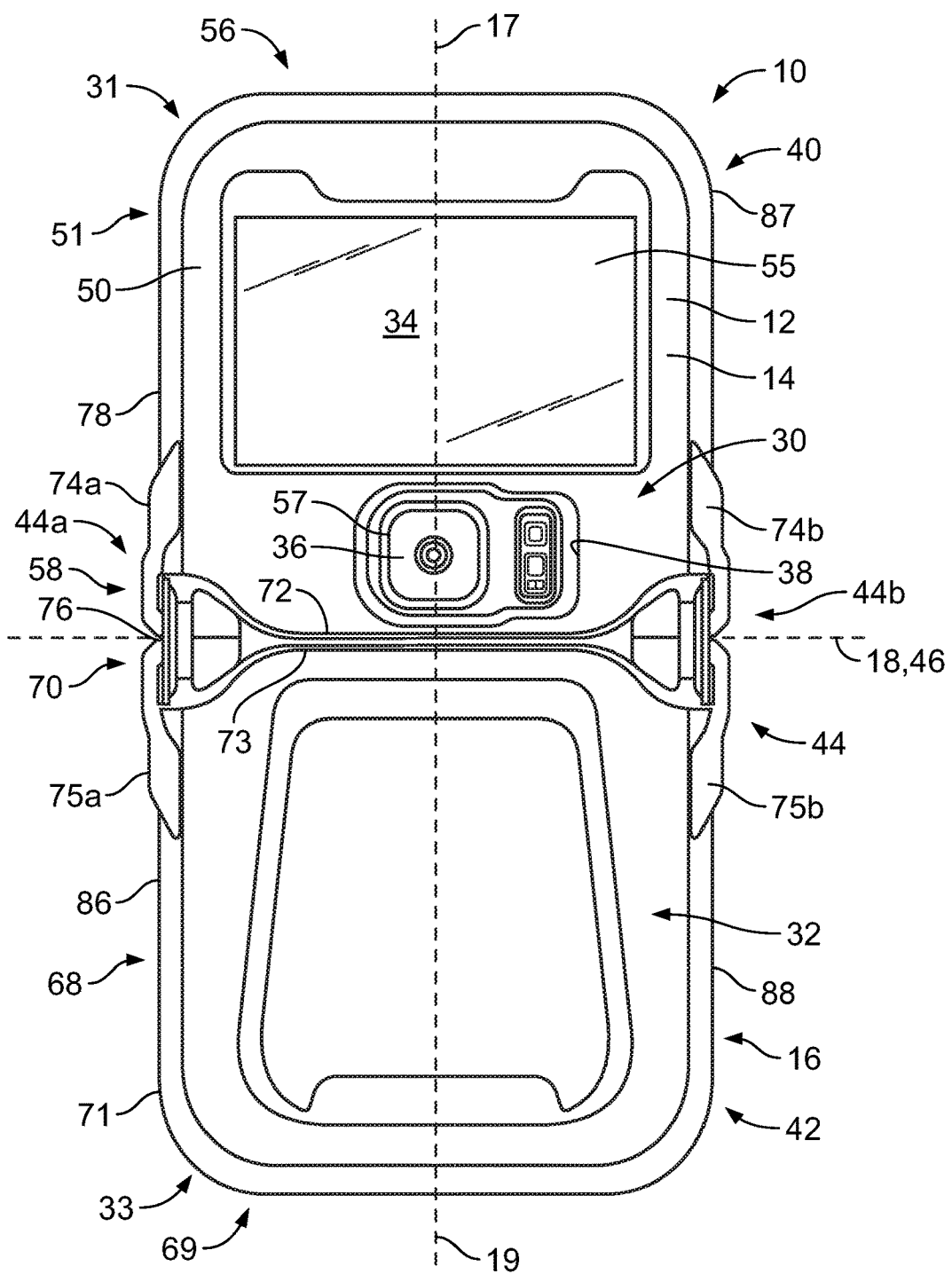
Figure 3A:
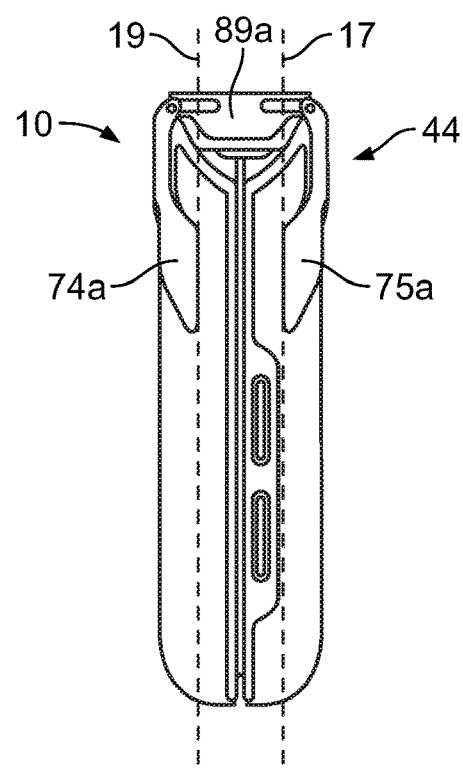
Figure 3B:
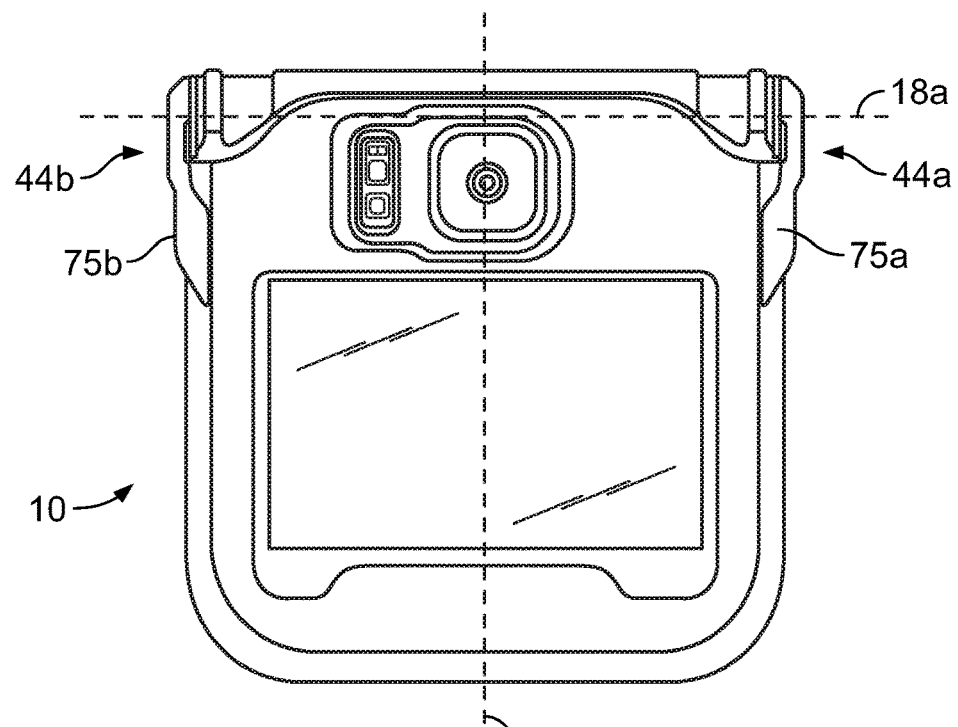

More specifically, FIG. 1 illustrates an inner view of the electronic device 12 within an embodiment of protective enclosure 10 with the electronic device 12 in the open first position. FIG. 2 illustrates an outer view of the electronic device 12 within the embodiment of the protective enclosure 10 of FIG. 1 with the electronic device 12 in the open first position. FIG. 3A illustrates a side view of the electronic device 12 within the embodiment of the protective enclosure 10 of FIG. 1 with the electronic device 12 in the closed second position. FIG. 3B illustrates a front view of the electronic device 12 within the embodiment of the protective enclosure 10 of FIG. 1 with the electronic device 12 in the closed second position.

The top device portion 14 and the bottom device portion 16 may be pivotably coupled by a device hinge (not shown). The top device portion 14 may extend (or generally extend) along a top device axis 17 and the bottom device portion 16 may extend (or generally extend) along a bottom device axis 19, and the top device axis 17 and the bottom device axis 19 may be normal to the device hinge axis 18. In the open first position, the top device axis 17 and the bottom device axis 19 may be co-axially aligned or may form an obtuse angle when viewed along the device hinge axis 18. In the closed second position illustrated in FIG. 3A, the top device axis 17 and the bottom device axis 19 may be parallel and/or offset or may form an acute angle when viewed along the device hinge axis 18.

As illustrated in FIG. 1, the electronic device 12 may include an inner surface 20 of the top device portion 14 and an inner surface 22 of the bottom device portion 16. The inner surface 20 of the top device portion 14 may be defined (or at least partially defined) by a top inner perimeter edge 21 (which is covered or obscured in FIG. 1 by the protective enclosure 10 but would be identifiable to one having ordinary skill in the art) and the inner surface 22 of the bottom device portion 16 may be defined (or at least partially defined) by a bottom inner perimeter edge 23 (which is covered or obscured in FIG. 1 by the protective enclosure 10 but would be identifiable to one having ordinary skill in the art). At least a portion of the inner surface 20 of the top device portion 14 may be or include a top inner device display 24 and at least a portion of the inner surface 22 of the bottom device portion 16 may be a bottom inner device display 26. When the electronic device is in the open first position, the top inner device display 24 and the bottom inner device display 26 may cooperate to define at least one main inner device display 28. When the electronic device 12 is in the closed second position, all or a portion of the top inner device display 24 may be adjacent to or in contact with all or a portion of the bottom inner device display 26. In some cases, electronic device 12 may include a bendable or foldable display which bends or folds when electronic device 12 is transitioned between various positions or configurations.

The portion of the inner surface 20 of the top device portion 14 that may correspond to the top inner device display 24 may be planar (or substantially planar) and the portion of the inner surface 22 of the bottom device portion 16 that may correspond to the bottom inner device display 26 may be planar (or substantially planar), and the portion of the inner surface 20 of the top device portion 14 (e.g., the top inner device display 24) and the portion of the inner surface 22 of the bottom device portion 16 (e.g., the bottom inner device display 26) may be co-planar (or substantially co-planar) in the first open position such that the inner main device display 24 is planar (or substantially planar) in the open first position.

As illustrated in FIG. 2, the electronic device 12 may include an outer surface 30 of the top device portion 14 and the outer surface 30 may be opposite to the inner surface 20 of the top device portion 14. The electronic device 12 may also include an outer surface 32 of the bottom device portion 16 and the outer surface 30 may be opposite to the inner surface 22 of the bottom device portion 16. The outer surface 30 of the top device portion 14 may be defined (or at least partially defined) by a top outer perimeter edge 31 (which is covered or obscured in FIG. 2 by the protective enclosure 10 but would be identifiable to one having ordinary skill in the art) and the outer surface 32 of the bottom device portion 16 may be defined (or at least partially defined) by a bottom outer perimeter edge 33 (which is covered or obscured in FIG. 2 by the protective enclosure 10 but would be identifiable to one having ordinary skill in the art).

One or both of the outer surface 30 of the top device portion 14 and the outer surface 32 of the bottom device portion 16 may have an outer device display 34. One or both of the outer surface 30 of the top device portion 14 and the outer surface 32 of the bottom device portion 16 may also have a camera 36 and a flash 38. For example, in the embodiment of the electronic device 12 illustrated in FIG. 2, the outer surface 30 of the top device portion 14 includes the outer device display 34, the camera 36, and the flash 38. Any number of additional displays and/or additional control and/or audio features are contemplated on any portion or combination of portions of the electronic device 12.

Turning to a first embodiment of the protective enclosure 10 in more detail, FIG. 1 illustrates a first case portion 40 that may be adapted to surround at least a portion of the top device portion 14 and a second case portion 42 that may be adapted to surround at least a portion of the bottom device portion 16. The protective enclosure 10 may also include a first hinge member 44a coupled to a portion of the first case portion 40 and a portion of the second case portion 42, the first hinge member 44a pivoting (or being adapted to pivot) about a first hinge axis 46 that is coaxially aligned with or parallel to the device hinge axis 18. So configured, the protective enclosure 10 may enclose—and therefore protect—a portion of the top device portion 14 and the bottom device portion 16 when the electronic device 12 is in the open first position. In some embodiments, the protective enclosure 10 may be shock resistant and/or water resistant (or waterproof). Further, when the top device portion 14 and the bottom device portion 16 are pivoted about the device hinge axis 18 such that the electronic device 12 is in the closed second position, the first case portion 40 and the second case portion 42 may pivot about the first hinge axis 46 to remain in protective engagement with the electronic device 12. In addition, various controls of the electronic device 12 are engageable and/or accessible when the electronic device 12 is in the open first position or the closed second position. A control of electronic device 12 may be actuated by a user through a hole or opening in any of the components of protective enclosure 10 and/or may be actuated by transmission of a force through a flexible portion of protective enclosure 10 that is positioned near the control.

The first case portion 40 of the protective enclosure 10 may have or include a first inner case portion 48 that surrounds (or is adapted to surround) at least a portion of the inner surface 20 of the top device portion 14. The first inner case portion 48 may extend (or generally extend) along the top device axis 17 from a first end 52 to a second end 54 that is opposite the first end 52 and that may be at or adjacent to the device hinge axis 18 and/or the first hinge axis 46. In some embodiments, the first inner case portion 48 may have (or may be at least partially defined by) a first inner perimeter edge 49 that may generally correspond in shape to the top inner perimeter edge 21 that defines the inner surface 20 of the top device portion 14.

In some embodiments, the first inner case portion 48 may extend around (or around portions of) the first inner perimeter edge 49 along a first lateral segment 80 that extends generally parallel to the top device axis 17, a second lateral segment 81 that is offset from the first lateral segment 80 and that extends generally parallel to the top device axis 17, and an upper segment 82 that extends normal to the top device axis 17 and between an end of the first lateral segment 80 and an end of the second lateral segment 81. The first lateral segment 80, the second lateral segment 81, and the upper segment 82 cooperate to form a frame or window surrounding the top inner device display 24 of the top device portion 14. The frame or window may also allow access to (e.g., provide cut outs, contoured portions, etc.) to audio, video, and/or other control features on or adjacent to the inner surface 20 of the top device portion 14. In other embodiments (not shown), the first inner case portion 48 may include a transparent portion that extends across the top inner device display 24 that is adapted to align or overlap with or cover at least a portion of the top inner device display 24 to protect the top inner device display 24.

The first inner case portion 48 may include any material or combination of materials. In some embodiments, the first inner case portion 48 may include an opaque (or transparent or semi-transparent) material that may be rigid, semi-rigid, flexible, or semi-flexible to provide protection to the inner surface 20 of the top device portion 14. Any portion of the first inner case portion 48 may include a cushion portion to provide protection to the electronic device 12.

As illustrated in FIG. 2, the first case portion 40 may also have a first outer case portion 50 that surrounds (or is adapted to surround) at least a portion of the outer surface 30 of the top device portion 14. The first outer case portion 50 may extend (or generally extend) along the top device axis 17 from a first end 56 to a second end 58 that is opposite the first end 56 and that may be at or adjacent to the device hinge axis 18 and/or the first hinge axis 46. In some embodiments, the first outer case portion 50 may have (or may be at least partially defined by) a first outer perimeter edge 51 that may generally correspond in shape to the top outer perimeter edge 31 that defines the outer surface 30 of the top device portion 14. The first outer perimeter edge 51 may also correspond in shape to the first inner perimeter edge 49 when viewed normal to the top device axis 17 and/or the device hinge axis 18.

The first outer case portion 50 may include any material or combination of materials. For example, the first outer case portion 50 may include a first transparent portion 55 that is adapted to align or overlap with or cover at least a portion of the outer device display 34. In some embodiments, the first outer case portion 50 may also include a second transparent portion 57 that is adapted to align or overlap with or cover at least a portion of the camera 36 and/or flash 38. In some embodiments, the first transparent portion 55 and/or the second transparent portion 57 may be a transparent membrane that may be made from or comprise a transparent material or semi-transparent material. In some embodiments, the first transparent portion 55 and/or the second transparent portion 57 may be apertures or cut-aways in the first outer case portion 50. In some embodiments, the first outer case portion 50 may include an opaque (or transparent or semi-transparent) material that extends from or adjacent to the outer device display 34 to the first outer perimeter edge 51. Any portion of the first outer case portion 50 (such as a portion that extends along at least a portion of the first outer perimeter edge 51) may include a cushion portion to provide protection to the electronic device 12. The first outer case portion 50 (or portions of the first outer case portion 50) may be rigid or may be flexible to provide protection to the outer surface 30 of the top device portion 14.

As illustrated in FIG. 1, the second case portion 42 of the protective enclosure 10 may have or include a second inner case portion 60 that surrounds (or is adapted to surround) at least a portion of the inner surface 22 of the bottom device portion 16. The second inner case portion 60 may extend (or generally extend) along the bottom device axis 19 from a first end 62 to a second end 64 that is opposite the first end 62 and that may be at or adjacent to the device hinge axis 18 and/or the first hinge axis 46. In some embodiments, the second inner case portion 60 may have (or may be at least partially defined by) a second inner perimeter edge 65 that may generally correspond in shape to the bottom inner perimeter edge 23 that defines the inner surface 22 of the bottom device portion 16.

The second end 64 (or a portion of the second end 64) may be coupled to or integrally formed with the second end 54 (or a portion of the second end 54) of the first inner case portion 48. However, in some embodiments, the second end 64 (or a portion of the second end 64) may be spaced from the second end 54 (or a portion of the second end 54) of the first inner case portion 48.

In some embodiments, the second inner case portion 60 may extend around (or around portions of) the first inner perimeter edge 49 along a first lateral segment 83 that extends generally parallel to the top device axis 17, a second lateral segment 84 that is offset from the first lateral segment 83 and that extends generally parallel to the top device axis 17, and a lower segment 85 that extends normal to the top device axis 17 and between an end of the first lateral segment 83 and an end of the second lateral segment 84. The first lateral segment 83, the second lateral segment 84, and the lower segment 85 cooperate to form a frame or window surrounding the bottom inner device display 26 of the bottom device portion 16. The frame or window may also allow access to (e.g., provide cut outs, contoured portions, etc.) to audio, video, and/or other control features on or adjacent to the inner surface 22 of the bottom device portion 16. In some embodiments, the first lateral segment 83, the second lateral segment 84, and the lower segment 85 of the second inner case portion 60 and the first lateral segment 80, the second lateral segment 81, and the upper segment 82 of the first inner case portion 48 may cooperate to form a frame or window surrounding the main inner device display 28 of the electronic device portion 12. In other embodiments (not shown), the second inner case portion 60 may include a transparent portion that extends across the bottom inner device display 26 that is adapted to align or overlap with or cover at least a portion of the bottom inner device display 26 to protect the top bottom inner device display 26.

The second inner case portion 60 may include any material or combination of materials. In some embodiments, the second inner case portion 60 may include an opaque (or transparent or semi-transparent) material that may be rigid, semi-rigid, flexible, or semi-flexible to provide protection to the inner surface 22 of the bottom device portion 16. Any portion of the second inner case portion 60 may include a cushion portion to provide protection to the electronic device 12.

As illustrated in FIG. 2, the second case portion 42 may also have a second outer case portion 68 that surrounds (or is adapted to surround) at least a portion of the outer surface 32 of the bottom device portion 16. The second outer case portion 68 may extend (or generally extend) along the bottom device axis 19 from a first end 69 to a second end 70 that is opposite the first end 69 and that may be at or adjacent to the device hinge axis 18 and/or the first hinge axis 46. In some embodiments, the second outer case portion 68 may have (or may be at least partially defined by) a second outer perimeter edge 71 that may generally correspond in shape to the bottom outer perimeter edge 33 that defines the outer surface 32 of the bottom device portion 16. The second outer perimeter edge 71 may also correspond in shape to the second inner perimeter edge 65 when viewed normal to the bottom device axis 19 and/or the device hinge axis 18.

The second outer case portion 68 may include any material or combination of materials. For example, the second outer case portion 68 may include an opaque (or transparent or semi-transparent) material, and any portion of the second outer case portion 68 (such as a portion that extends along at least a portion of the second outer perimeter edge 71) may include a cushion portion to provide protection to the electronic device 12. The second outer case portion 68 (or portions of the second outer case portion 68) may be rigid or may be flexible to provide protection to the outer surface 32 of the bottom device portion 16.

The second end 70 (or a portion of the second end 70) of the second outer case portion 68 may be spaced from the second end 58 (or a portion of the second end 58) of the first outer case portion 50 such that the first outer perimeter edge 51 includes a bottom edge 72 (that extends along or adjacent to the second end 58 of the first outer case portion 50) and the second outer perimeter edge 51 includes a top edge 73 (that extends along or adjacent to the second end 70 of the second outer case portion 52).

In some embodiments, the top device portion 14 of the electronic device 12 may be inserted through or between the gap between the top edge 73 of the second outer case portion 68 and the bottom edge 72 of the first outer case portion 50. Accordingly, the top device portion 14 is disposed in a "pocket" formed by the first inner case portion 48 and the first outer case portion 50. Also (or alternatively), the bottom device portion 16 of the electronic device 12 may be inserted through or between the gap between the top edge 73 of the second outer case portion 52 and the bottom edge 72 of the first outer case portion 50. Accordingly, the bottom device portion 16 is disposed in a "pocket" formed by the second inner case portion 60 and the second outer case portion 68. In other embodiments, the first inner case portion 48 may be flexible and may be pulled or stretched over corresponding portions of the top inner perimeter edge 21 of the top device portion 14 and/or the second inner case portion 60 may be flexible and may be pulled over corresponding portions of the bottom inner perimeter edge 23 of the bottom device portion 16. In other embodiments (not shown), the second end 70 (or a portion of the second end 70) of the second outer case portion 68 may be may be coupled to or integrally formed with the second end 54 (or a portion of the second end 54) of the first inner case portion 48.

The first inner case portion 48 may be secured to the first outer case portion 50 in any manner known in the art. For example, the first inner case portion 48 may be integrally formed with the first outer case portion 50. In other examples, the first inner case portion 48 may be coupled to the first outer case portion 50 using stitching, mechanical fasteners, adhesives, co-molding, and/or ultrasonic welding, for example. In still further examples, the first inner case portion 48 may be removably secured to the first outer case portion 50 (such as using snaps or latches) to form a shell around the top device portion 14. The second inner case portion 60 may be secured to the second outer case portion 68 in any of these manners.

Referring again to FIG. 1, the protective enclosure 10 may include the first hinge member 44a that may be coupled to (e.g., fixedly secured or removably secured) a portion of the first case portion 40 and coupled to (e.g., fixedly secured or removably secured) a portion of the second case portion 42 to rotatably or pivotably couple the first case portion 40 and the second case portion 42. In some embodiments, the first hinge member 44a may include a first hinge arm 74a and a second hinge arm 75a, and the first hinge arm 74a may be coupled to a portion of the first case portion 40 and the second hinge arm 75a may be coupled to a portion of the second case portion 42.

The first hinge arm 74a may be coupled to any suitable portion of the first case portion 40, such as a portion that is at or adjacent to the second end 58 of the first outer case portion 50 or that is at or adjacent to the second end 54 of the first inner case portion 48. In some embodiments, the first hinge arm 74a may be elongated and may have a first end that may be at or adjacent to the first end 52 of the first inner case portion 48. In other embodiments, the first end of the first hinge arm 74a may be disposed between the first end 52 of the first inner case portion 48 and the second end 54 of the first inner case portion 48. The first hinge arm 74a may have a second end that may be at or adjacent to the second end 54 of the first inner case portion 48. In other embodiments, the second end may be disposed between the first end 52 of the first inner case portion 48 and the second end 54 of the first inner case portion 48. The first hinge arm 74a may extend in a direction generally parallel to the top device axis 17 and may be disposed at, adjacent to, or along a first lateral end 78 of the first case portion 40, and the first lateral end 78 generally corresponds to (or is adjacent to) the position of the second lateral segment 81 of the first inner perimeter edge 49 of the first inner case portion 48.

The second hinge arm 75a may be coupled to any suitable portion of the second case portion 42, such as a portion that is at or adjacent to the second end 70 of the second outer case portion 68 or that is at or adjacent to the second end 64 of the second inner case portion 60. In some embodiments, the second hinge arm 75a may be elongated and may have a first end that may be at or adjacent to the first end 62 of the second inner case portion 60. In other embodiments, the first end of the second hinge arm 75a may be disposed between the first end 62 of the second inner case portion 60 and the second end 64 of the second inner case portion 60. The second hinge arm 75a may have a second end that may be at or adjacent to the second end 64 of the second inner case portion 60. In other embodiments, the second end may be disposed between the first end 62 of the second inner case portion 60 and the second end 64 of the second inner case portion 60. The second hinge arm 75a may extend in a direction generally parallel to the top device axis 17 and may be disposed at, adjacent to, or along a first lateral end 86 of the second case portion 42, and the first lateral end 86 generally corresponds to (or is adjacent to) the position of the second lateral segment 84 of the second inner perimeter edge 65 of the second inner case portion 68.

As illustrated in FIG. 3A, an end of the first hinge arm 74a may be coupled to a first end of an intermediary member 89a (e.g., by a pin and slot mechanism) and an end of the second hinge arm 75a may be coupled to a second end of the intermediary member 89a (e.g., by a pin and slot mechanism) to allow for rotation about the device hinge axis 18 and the first hinge axis 46. In such an embodiment, the first hinge axis 46 may be one or two or more axes that allows rotation of the first hinge arm 74a relative to the second hinge arm 75a. In some embodiments (not shown), the intermediary member 89a may include a spring (e.g., a spiral-wound spring). In other embodiments (not shown), an end of the first hinge arm 74a may be directly pivotably coupled to an end of the second hinge arm 75a such that the first hinge member 44a rotates about the first hinge axis 46. In some examples, protective enclosure 10 may include one or more latches or locking mechanisms for temporarily retaining protective enclosure 10 and electronic device 12 in the configuration illustrated in FIGS. 3A and 3B.

Referring again to FIG. 1, the protective enclosure 10 may also include a second hinge member 44b that may be coupled to (e.g., fixedly secured or removably secured) a portion of the first case portion 40 and coupled to (e.g., fixedly secured or removably secured) a portion of the second case portion 42 to rotatably or pivotably couple the first case portion 40 and the second case portion 42. In some embodiments, the second hinge member 44b may include a first hinge arm 74b and a second hinge arm 75b, and the first hinge arm 74b may be coupled to a portion of the first case portion 40 and the second hinge arm 75a may be coupled to a portion of the second case portion 42.

The first hinge arm 74b may be coupled to any suitable portion of the first case portion 40, such as a portion that is at or adjacent to the second end 58 of the first outer case portion 50 or that is at or adjacent to the second end 54 of the first inner case portion 48. In some embodiments, the first hinge arm 74b may be elongated and may have a first end that may be at or adjacent to the first end 52 of the first inner case portion 48. In other embodiments, the first end may be disposed between the first end 52 of the first inner case portion 48 and the second end 54 of the first inner case portion 48. The first hinge arm 74b may have a second end that may be at or adjacent to the second end 54 of the first inner case portion 48. In other embodiments, the second end may be disposed between the first end 52 of the first inner case portion 48 and the second end 54 of the first inner case portion 48. The first hinge arm 74b may extend in a direction generally parallel to the top device axis 17 and may be disposed at, adjacent to, or along a second lateral end 87 of the first case portion 40, and the second lateral end 87 generally corresponds to (or is adjacent to) the position of the first lateral segment 80 of the first inner perimeter edge 49 of the first inner case portion 48.

The second hinge arm 75b may be coupled to any suitable portion of the second case portion 42, such as a portion that is at or adjacent to the second end 70 of the second outer case portion 68 or that is at or adjacent to the second end 64 of the second inner case portion 60. In some embodiments, the second hinge arm 75b may be elongated and may have a first end that may be at or adjacent to the first end 62 of the second inner case portion 60. In other embodiments, the first end may be disposed between the first end 62 of the second inner case portion 60 and the second end 64 of the second inner case portion 60. The second hinge arm 75b may have a second end that may be at or adjacent to the second end 64 of the second inner case portion 60. In other embodiments, the second end may be disposed between the first end 62 of the second inner case portion 60 and the second end 64 of the second inner case portion 60. The second hinge arm 75*b* may extend in a direction generally parallel to the top device axis 17 and may be disposed at, adjacent to, or along a second lateral end 88 of the second case portion 42, and the second lateral end 88 generally corresponds to (or is adjacent to) the position of the first lateral segment 83 of the second inner perimeter edge 65 of the second inner case portion 68.

As illustrated in FIG. 1, an end of the first hinge arm 74*b* may be coupled to a first end of an intermediary member 89*b* (e.g., by a pin and slot mechanism) and an end of the second hinge arm 75*b* may be coupled to a second end of the intermediary member 89*b* (e.g., by a pin and slot mechanism) to allow for rotation about the device hinge axis 18 and the first hinge axis 46. In such an embodiment, the first hinge axis 46 may be one or two or more axes that allows rotation of the first hinge arm 74*b* relative to the second hinge arm 75*b*. In some embodiments (not shown), the intermediary member 89*b* may include a spring (e.g., a spiral-wound spring). In other embodiments (not shown), an end of the first hinge arm 74*b* may be directly pivotably coupled to an end of the second hinge arm 75*b* such that the first hinge member 44*a* rotates about the first hinge axis 46.

Figure 4:
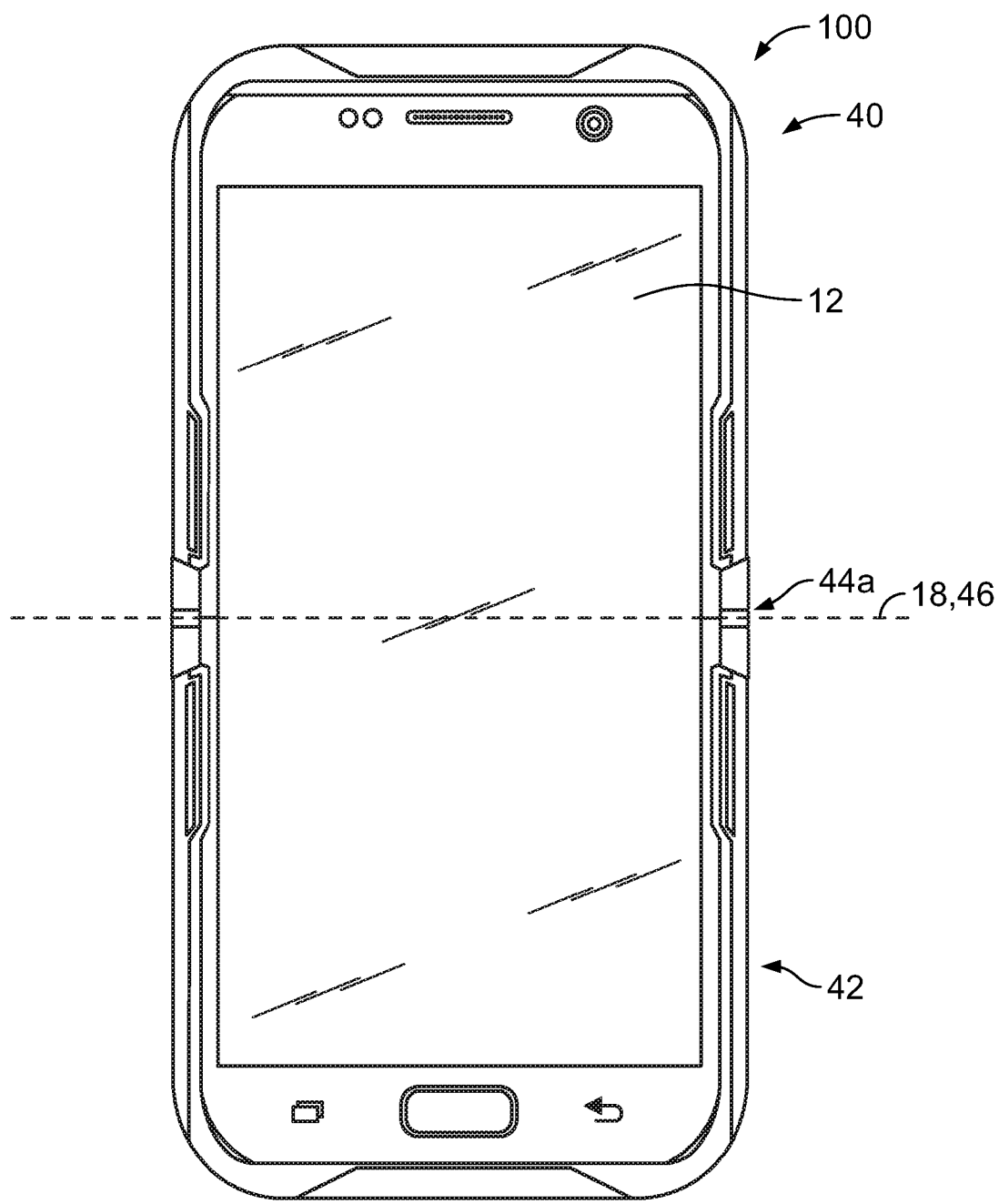
FIG. 4 is a view of an embodiment of a protective enclosure for an electronic device.

FIG. 4 illustrates an inner view of a further embodiment of a protective enclosure 100 with the encased electronic device 12 in the open second position. The protective enclosure 100 may include any or all of the features, functions, elements, or characteristics of the embodiment of the protective enclosure 10 illustrated in FIGS. 1 to 3B, and similar or identical components and elements will have identical reference numbers. Unlike the protective enclosure 10 illustrated in FIGS. 1 to 3B, the first hinge member 44*a* of FIG. 4 extends along an axis that is parallel to (or collinear with) the device hinge axis 18. The first hinge member 44*a* of FIG. 4 may include any known hinge or mechanism that allows the first case portion 40 to pivotably displace relative to the second case portion 42 when the electronic device 12 pivots between the open first position and the closed second position. The first hinge member 44*a* of FIG. 4 may have a first portion coupled to the first case portion 40 and a second portion coupled to the second case portion 42. For example, the first portion of the first hinge member 44*a* coupled to the first case portion 40 may include at least one element adapted to receive a hinge rod (not shown) and the second portion of the first hinge member 44*a* coupled to the second case portion 42 may include at least one element adapted to receive the hinge rod, and the hinge rod may extend along the first hinge axis 46 such that the first case portion 40 pivotably displaces relative to the second case portion 42 along an axis of the hinge rod when the electronic device 12 pivots between the open first position and the closed second position.

Figure 5:
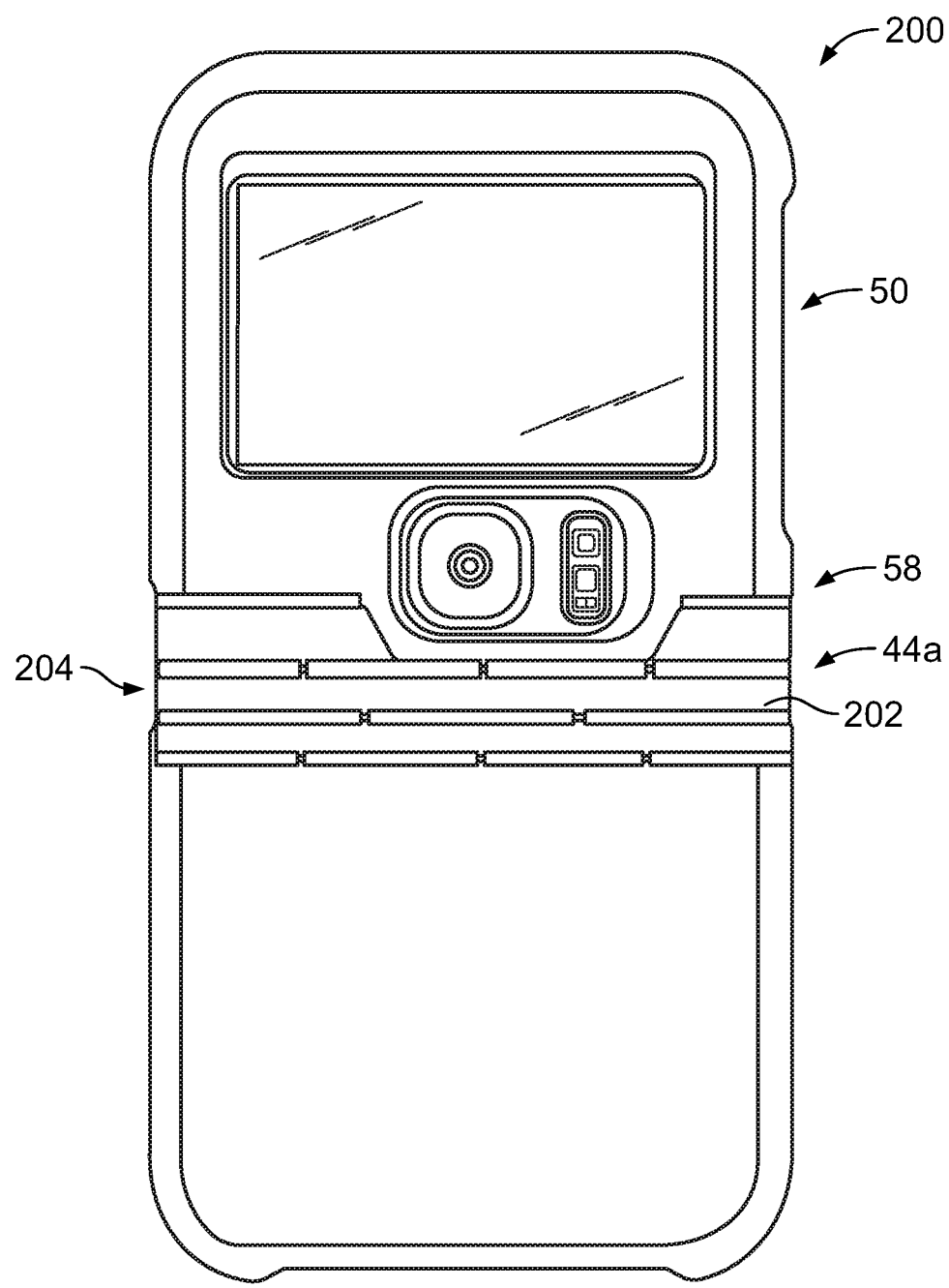
FIGS. 5, 6A and 6B are various views of an embodiment of a protective enclosure for an electronic device.

FIG. 5 illustrates an outer view of a further embodiment of a protective enclosure 200 with the encased electronic device 12 in the open first position. The protective enclosure 200 may include any or all of the features, functions, elements, or characteristics of the embodiment of the protective enclosure 10 illustrated in FIGS. 1 to 3B, and similar or identical components and elements will have identical reference numbers. Unlike the protective enclosure 10 illustrated in FIGS. 1 to 3B, the first hinge member 44*a* of the protective enclosure 200 includes a portion 202 of material that extends from the second end 58 of the first outer case portion 50 to the second end 70 of the second outer case portion 68. The portion 202 of material may be coupled to the second end 58 of the first outer case portion 50 and/or to the second end 70 of the second outer case portion 68. In some embodiments, the portion 202 of material may be integrally and unitarily formed with the second end 58 of the first outer case portion 50 and/or with the second end 70 of the second outer case portion 68. The portion 202 of material may be a single, unitary portion of flexible material or may be an assembly of two or more elements, portions, or types of flexible and non-flexible materials. For example, the portion 202 of material may be two or more hinged segments 204 (e.g., 3 hinged segments), and the hinges may extend in a direction parallel to the device hinge axis 18 and/or the first hinge axis 46. In this embodiment, the first hinge axis 46 may be an overall bending axis (or an effective bending axis) of the portion 202 of material. In some embodiments, one or more recesses may extend along all or a part of the portion 202 of material in a direction parallel to the device hinge axis 18 and/or the first hinge axis 46, and the one or more recesses may assist the portion 202 of material to bend along the first hinge axis 46. In some examples portion 202 of material may be or include a living hinge.

Figure 6A:
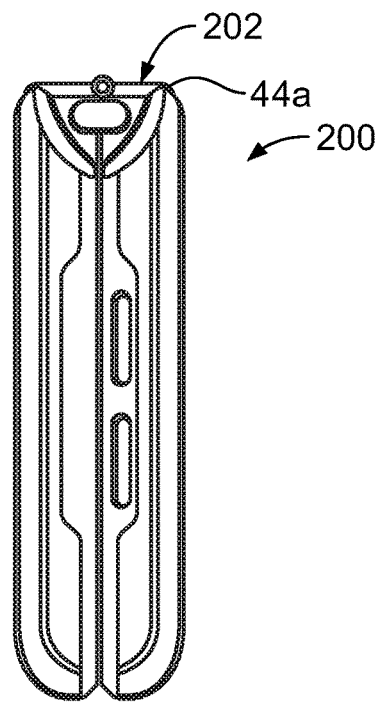
Figure 6B:
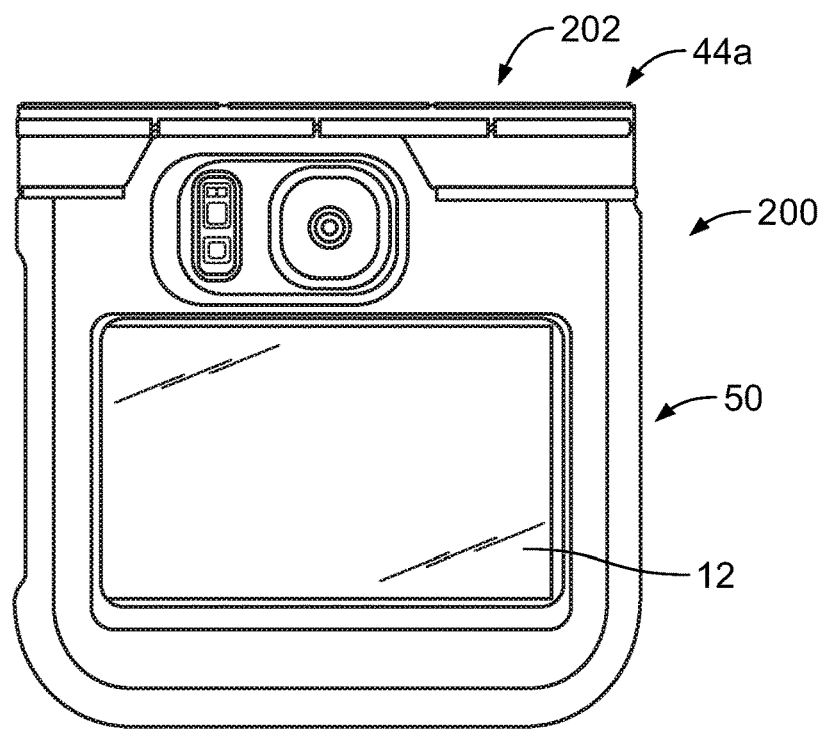

FIG. 6A illustrates a side view of the embodiment of the protective enclosure 200 of FIG. 5 with the encased electronic device 12 in the closed position. FIG. 6B illustrates a front view of the embodiment of the protective enclosure 200 of FIG. 6 with the encased electronic device 12 in the closed position.

Figure 7:
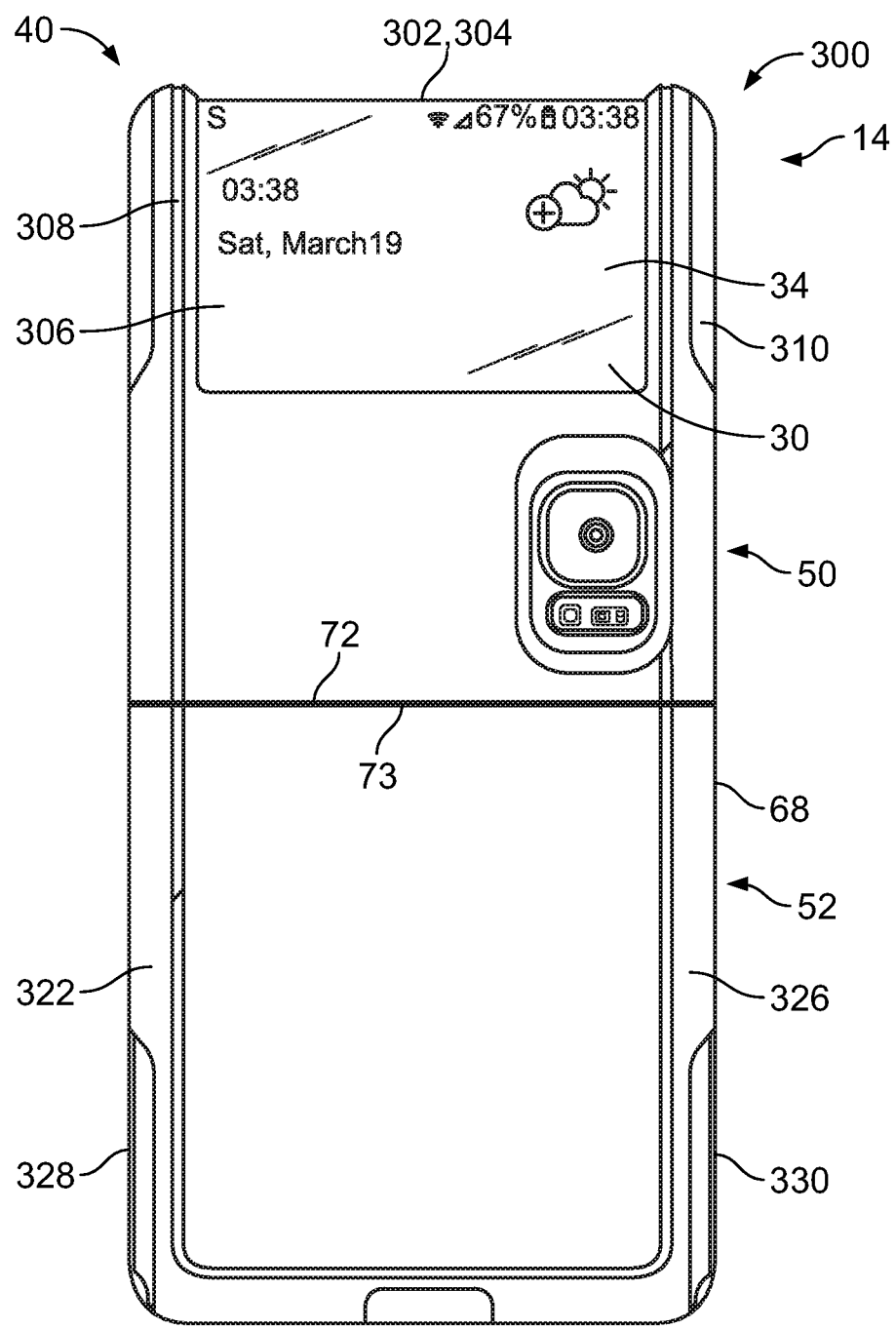
FIGS. 7 to 9 are various views of an embodiment of a protective enclosure for an electronic device.
Figure 8:
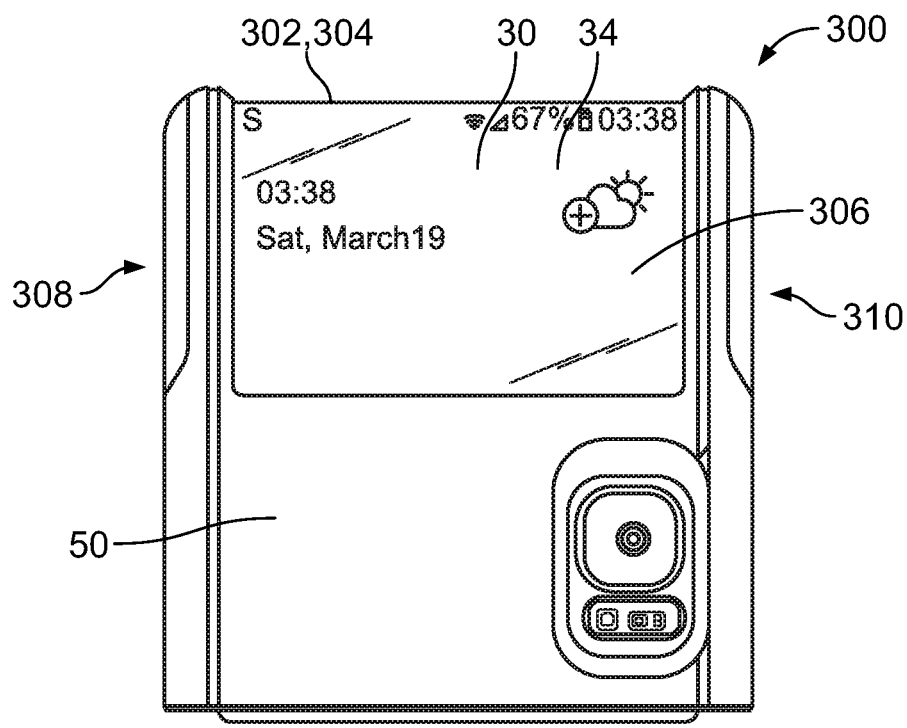

FIG. 7 illustrates an outer view of a further embodiment of a protective enclosure 300 with the encased electronic device 12 in the open first position, and FIG. 8 illustrates a front view of the protective enclosure 300 with the encased electronic device 12 in the closed second position. The protective enclosure 300 may include any or all of the features, functions, elements, or characteristics of any or all of the previously disclosed embodiments, such as the embodiment of the protective enclosure 10 illustrated in FIGS. 1 to 3B, and similar or identical components and elements will have identical reference numbers.

As illustrated in FIG. 7, the outer device display 34 on the outer surface 30 of the top device portion 14 of the electronic device 12 may have an upper edge 302 that is at or adjacent to an upper edge 304 of the outer surface 30 of the top device portion 14. When the electronic device 12 is enclosed in the protective enclosure 300, a first window portion 306 may align with the outer device display 34 to allow the outer device display 34 to be visible. In some embodiments, the first outer case portion 50 may include a first lateral segment 308 and a second lateral segment 310 to define lateral edges of the first window portion 306. Because the upper edge 302 of the outer device display 34 is at or adjacent to the upper edge 304 of the outer surface 30 of the top device portion 14, no portion of the first outer case portion 50 may extend between a top portion of the first lateral segment 308 and a top portion of the second lateral segment 310.

Figure 9:
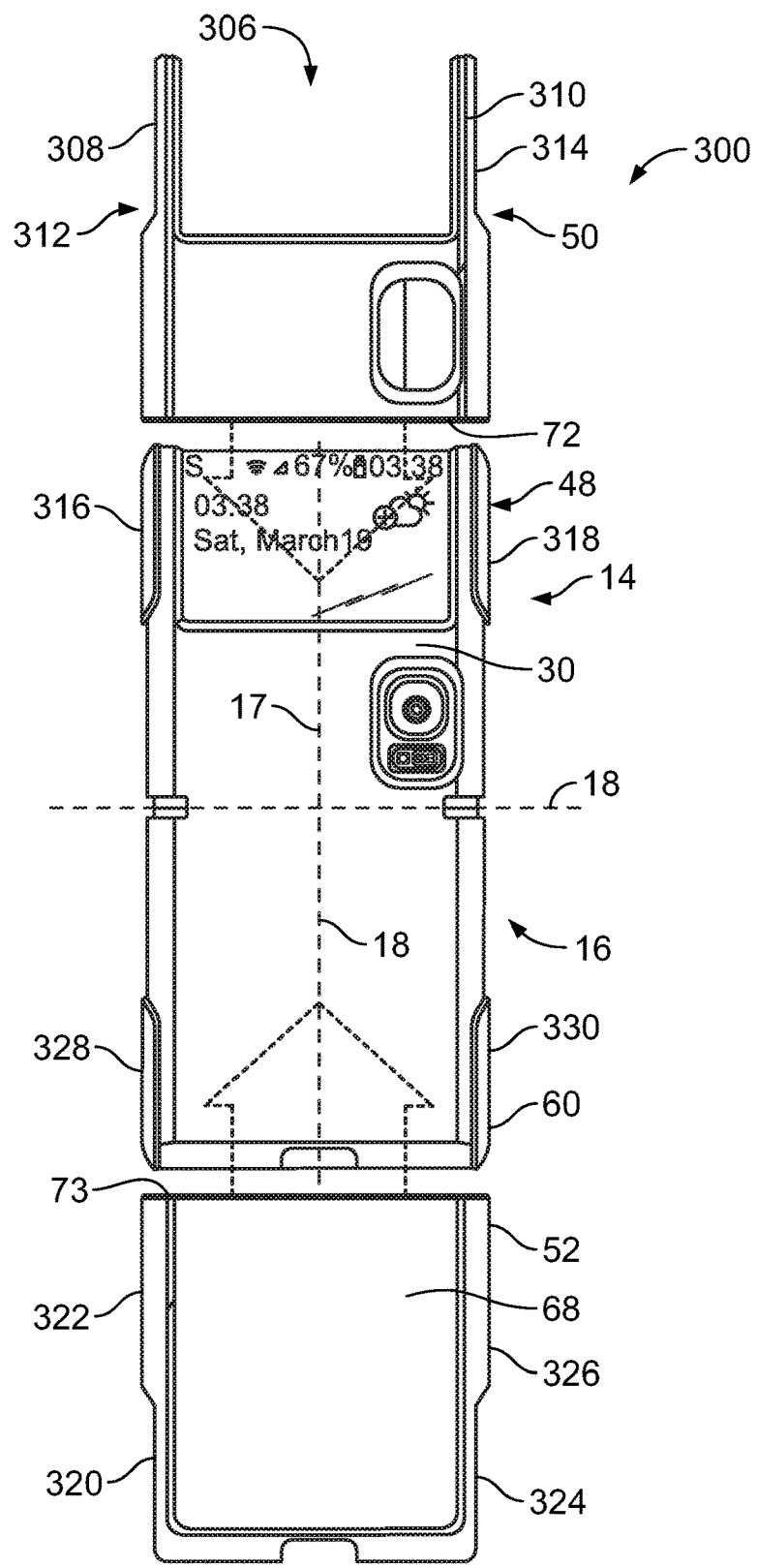

As illustrated in FIG. 9, the first outer case portion 50 may be secured to the first inner case portion 48 to encase or enclose the top device portion 14 of the electronic device 12. The first outer case portion 50 may be secured to the first inner case portion 48 in any suitable manner. For example, the first outer case portion 50 may have a first recess 312 disposed at or adjacent to the first lateral segment 308 and a second recess 314 disposed at or adjacent to the second lateral segment 310. The first outer case portion 50 may be displaced over the outer surface 30 of the top device portion 14 of the electronic device 12 in a direction along the top device axis 17 until the bottom edge 72 of the first outer case portion 50 is adjacent to or at the device hinge axis 18. In such a position, a first wing portion 316 of the first inner case portion 48 will be disposed in the first recess 312 and a second wing portion 318 of the first inner case portion 48 will be disposed in the second recess 314. The first wing portion 316 and the second wing portion 318 may extend upwards (e.g., normal to the inner surface 20 of the top device portion 14) and over lateral portions of the top device portion 14 to secure the top device portion 14 to the first inner case portion 48. The first outer case portion 50 may be secured (e.g., removably secured) to the first inner case portion 48 in any known manner, such as by snaps and/or latches, for example.

Still referring to FIG. 9, the second outer case portion 68 may be secured to the second inner case portion 60 to encase or enclose the top device portion 14 of the electronic device 12. The second outer case portion 68 may be secured to the second inner case portion 60 in any suitable manner. For example, the second outer case portion 68 may have a first recess 320 disposed at or adjacent to a first lateral segment 322 and a second recess 324 disposed at or adjacent to a second lateral segment 326. The second outer case portion 68 may be displaced over the outer surface 32 of the bottom device portion 16 of the electronic device 12 in a direction along the bottom device axis 18 until the top edge 73 of the second outer case portion 68 is adjacent to or at the device hinge axis 18 or is adjacent to the bottom edge 72 of the first outer case portion 50. In such a position, a first wing portion 328 of the second inner case portion 60 will be disposed in the first recess 320 and a second wing portion 330 of the second inner case portion 60 will be disposed in the second recess 324. The first wing portion 328 and the second wing portion 330 may extend upwards (e.g., normal to the inner surface 22 of the bottom device portion 16) and over lateral portions of the bottom device portion 16 to secure the bottom device portion 16 to the second inner case portion 60. The second outer case portion 68 may be secured (e.g., removably secured) to the second inner case portion 60 in any known manner, such as by snaps and/or latches, for example. In some embodiments, a first hinge member 44a (e.g., a flexible portion or a hinge rod portion) is coupled to the first case portion 40 and/or the second case portion 42. In other embodiments, no first hinge member 44a is coupled to the first case portion 40 and/or the second case portion 42. In some embodiments, the first inner case portion 48 is coupled to or secured to the second inner case portion 42. In other embodiments, the first inner case portion 48 is not coupled to or secured to the second inner case portion 42.

Figure 10:
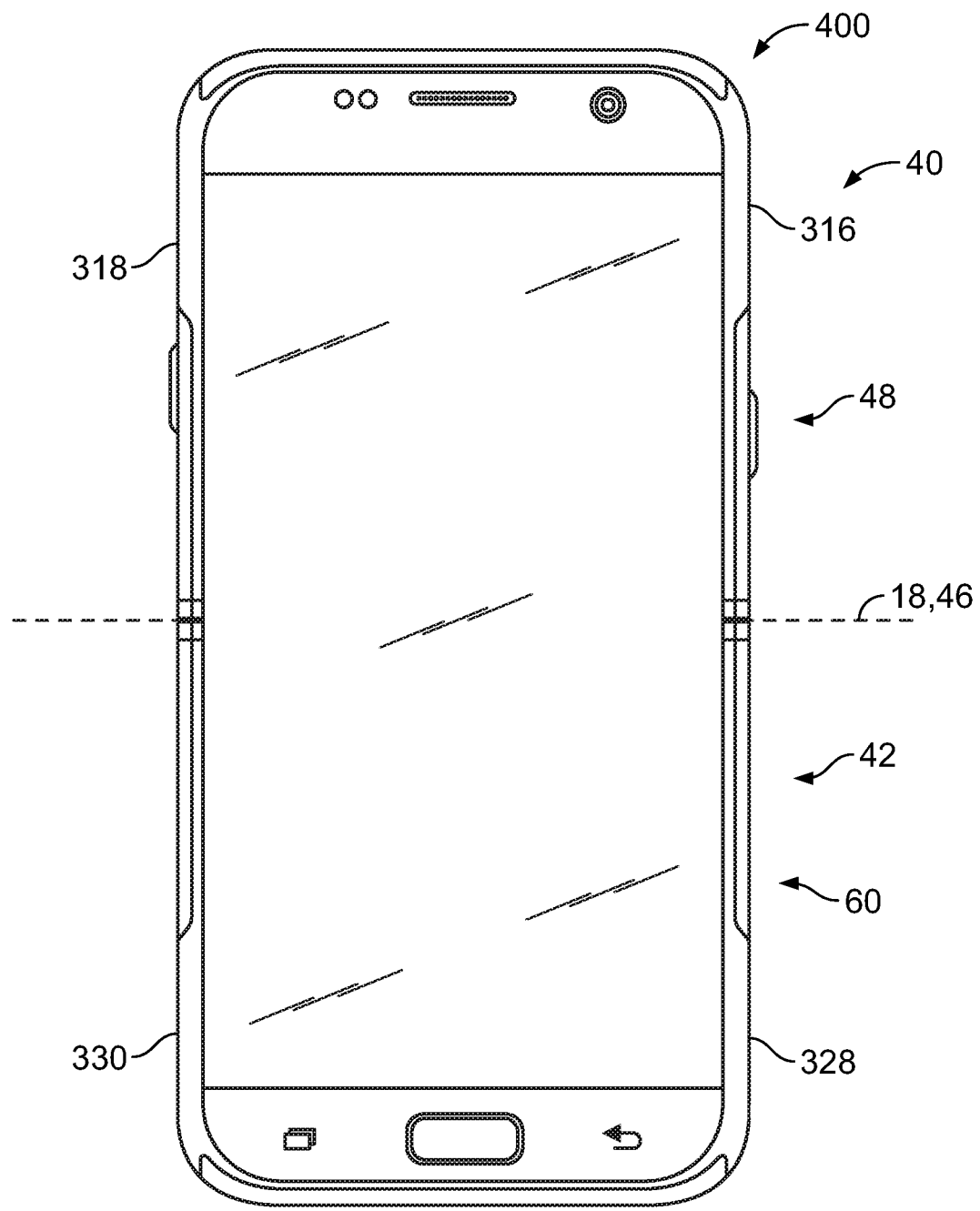
FIGS. 10, 11, 12A and 12B are various views of an embodiment of a protective enclosure for an electronic device.
Figure 11:
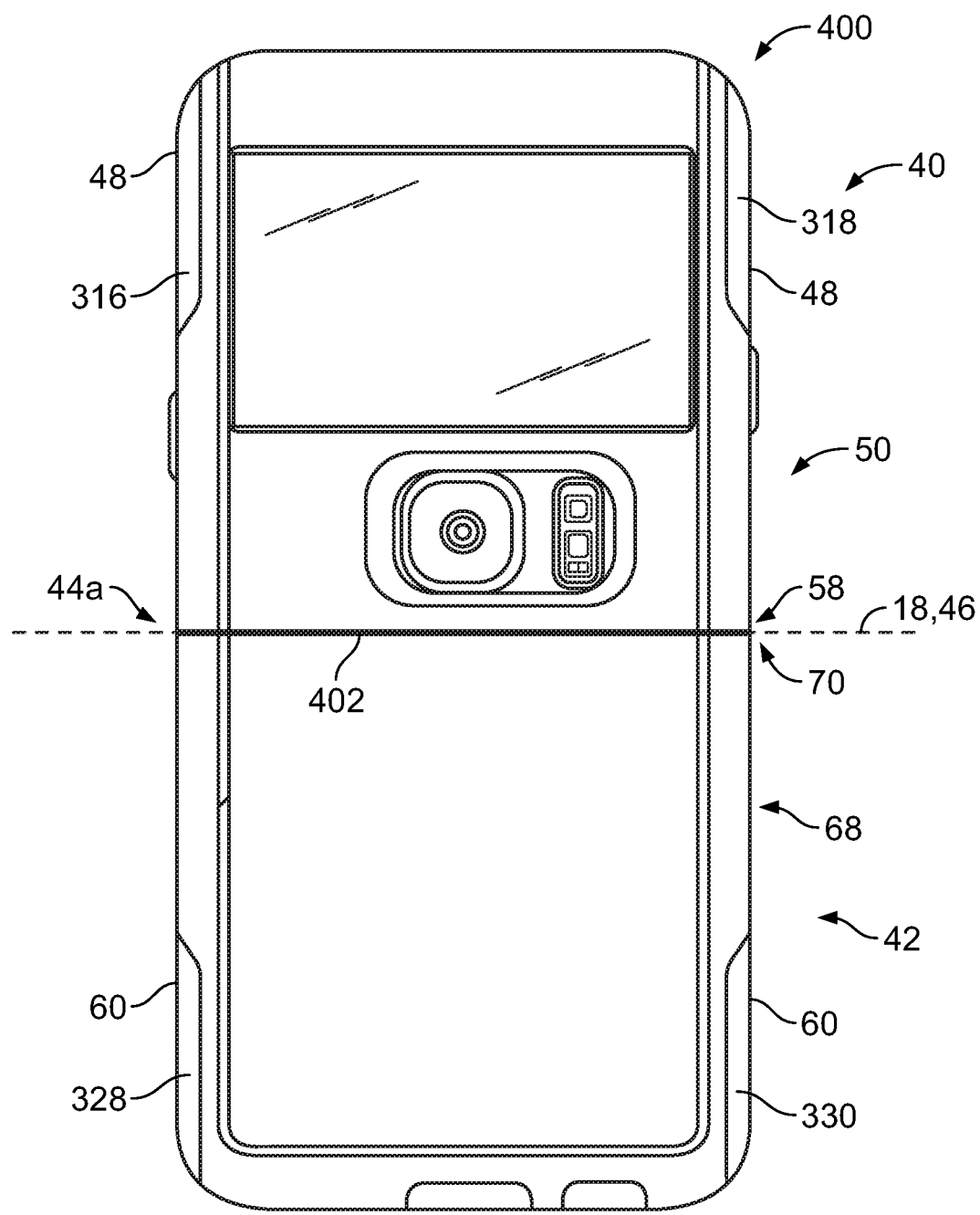

FIG. 10 illustrates an inner view of a further embodiment of a protective enclosure 400 with the encased electronic device 12 in the open first position, and FIG. 11 illustrates an outer view of the protective enclosure 400 with the encased electronic device 12 in the open first position. The protective enclosure 400 may include any or all of the features, functions, elements, or characteristics of any or all of the previously disclosed embodiments, such as the embodiment of the protective enclosure 300 illustrated in FIGS. 7 to 9, and similar or identical components and elements will have identical reference numbers. In the embodiment of the protective enclosure 400, portions of the first case portion 40 and portions of the second case portion 42 may be made from a hard material (e.g., a hard plastic, such as polycarbonate) and portions of the first case portion 40 and portions of the second case portion 42 may be made from a soft material (e.g., a soft plastic, such as a thermoplastic elastomer, or "TPE"). For example, in FIGS. 10 and 11, the first wing portion 316 and/or the second wing portion 318 of the first inner case portion 48 and/or the first wing portion 328 and/or the second wing portion 330 of the second inner case portion 60 may be made from or comprise a soft material. Other portions of the first inner case portion 48 and/or the second inner case portion 60—or the entire first inner case portion 48 and/or the second inner case portion 60—may also be made from or comprise the soft material. Portions of the (or the entire) first outer case portion 50 and/or portions of the (or the entire) second outer case portion 68 may be made from or comprise the hard material.

Figure 12A:
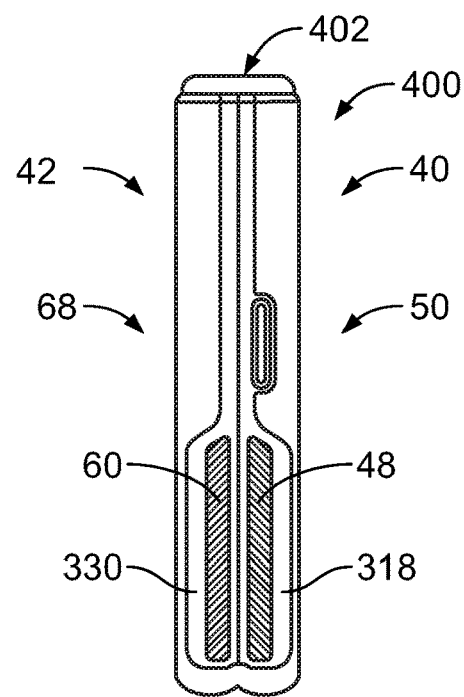
Figure 12B:
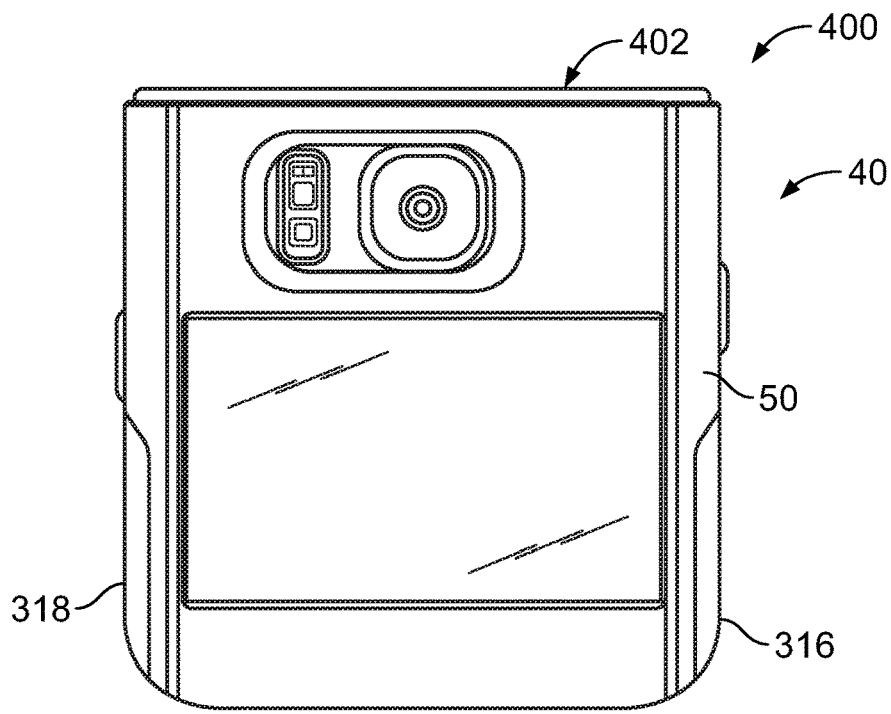

As illustrated in FIG. 11, the first hinge member 44a may include a hinge portion 402 that may couple the second end 58 of the first outer case portion 50 and the second end 70 of the second outer case portion 68. The hinge portion 402 may be flexible and may be a portion of soft material that may extend along all or a part of the device hinge axis 18. FIG. 12A illustrates a side view of the protective enclosure 400 having the hinge portion 402 with the encased electronic device 12 in the closed second position, and FIG. 12B illustrates a front view of the protective enclosure 400 having the hinge portion 402 with the encased electronic device 12 in the closed second position.

Figure 13:
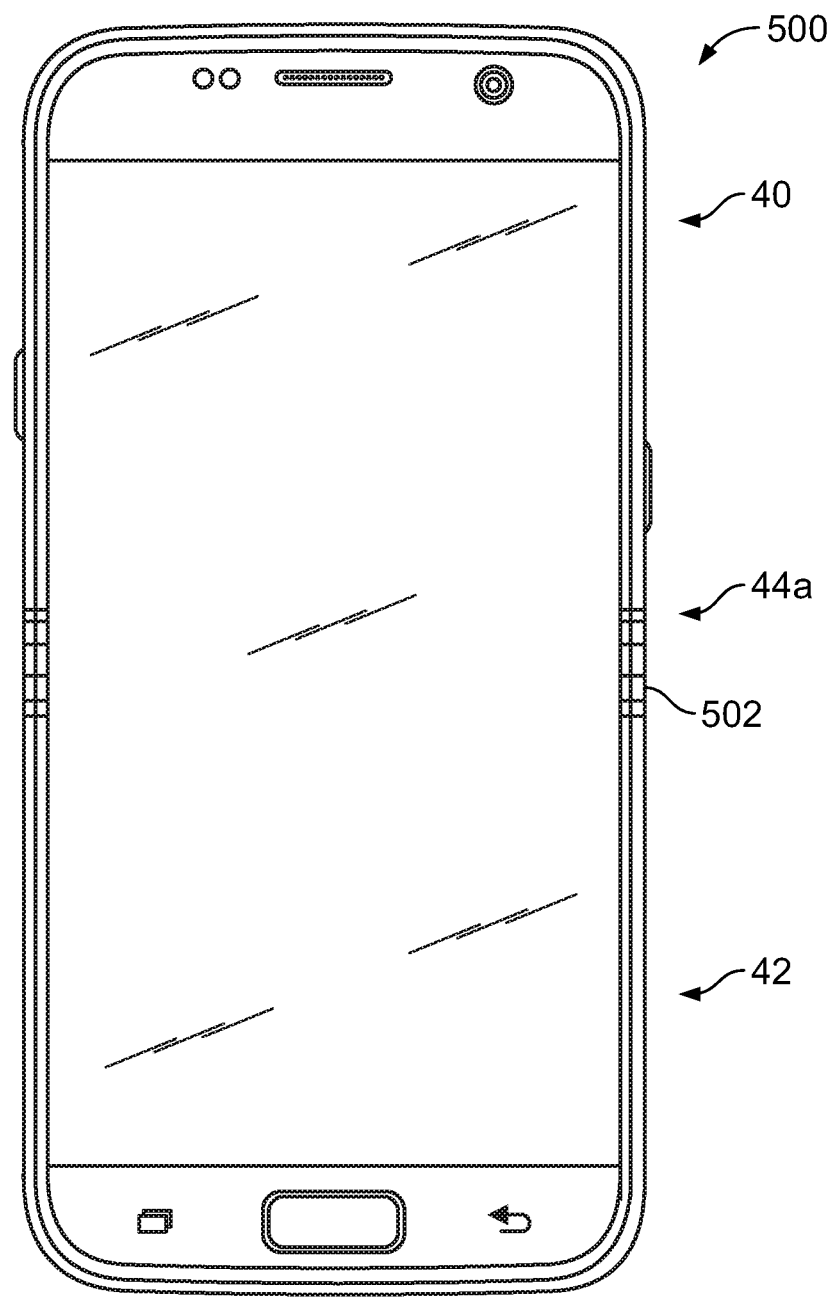
FIGS. 13, 14, 15A and 15B are various views of an embodiment of a protective enclosure for an electronic device.
Figure 14:
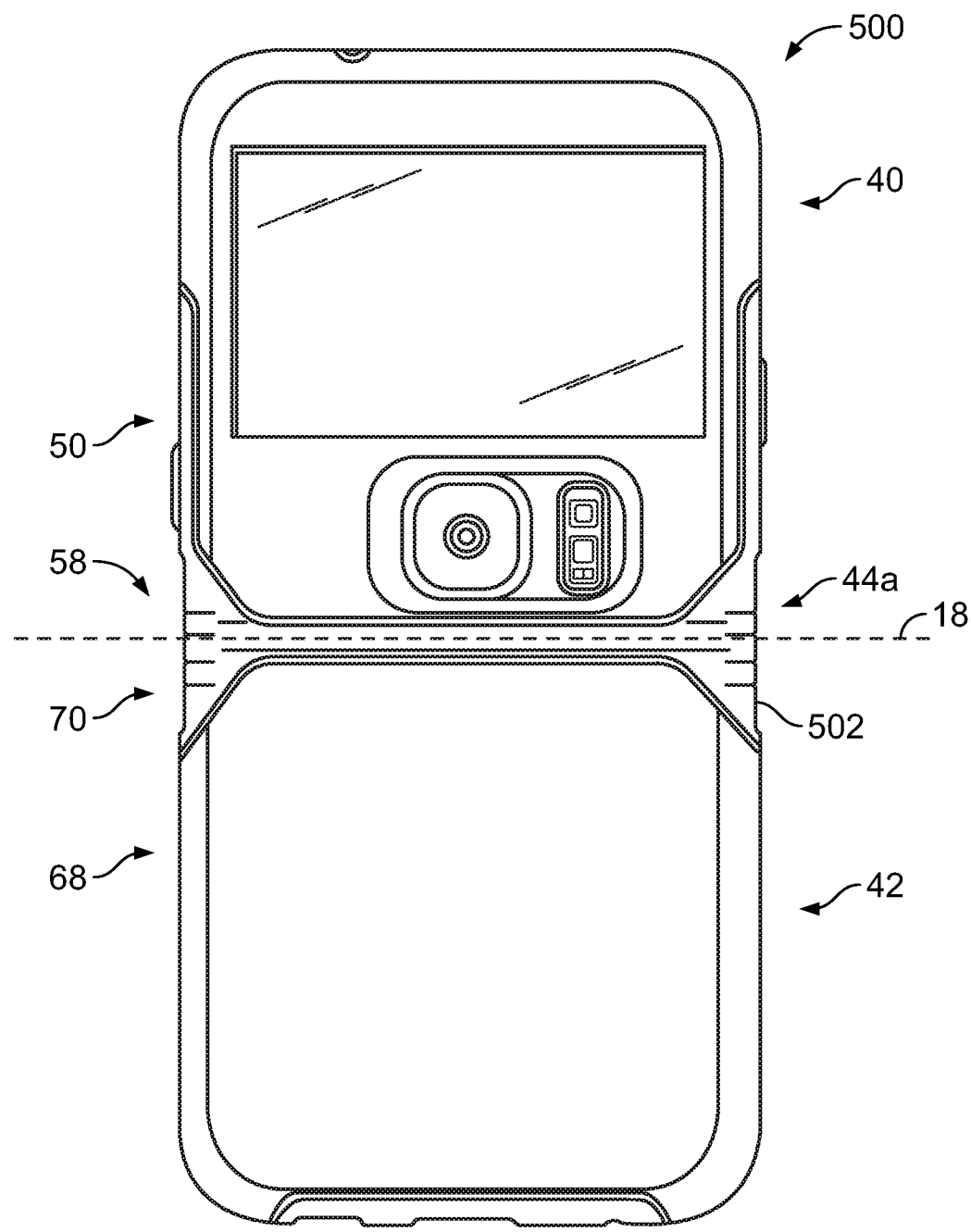

FIG. 13 illustrates an inner view of a further embodiment of a protective enclosure 500 with the encased electronic device 12 in the open first position, and FIG. 14 illustrates an outer view of the protective enclosure 500 with the encased electronic device 12 in the open first position. The protective enclosure 400 may include any or all of the features, functions, elements, or characteristics of any or all of the previously disclosed embodiments, such as the embodiment of the protective enclosure 10 illustrated in FIGS. 1 to 3B, and similar or identical components and elements will have identical reference numbers. In the embodiment of the protective enclosure 500, portions of the first case portion 40 and portions of the second case portion 42 may be made from a hard material (e.g., a hard plastic, such as polycarbonate) and portions of the first case portion 40 and portions of the second case portion 42 may be made from a soft material (e.g., a soft plastic, such as a thermoplastic elastomer, or "TPE"). For example, as illustrated in FIG. 14, the first hinge member 44a may include a hinge portion 502 that may couple the second end 58 of the first outer case portion 50 and the second end 70 of the second outer case portion 68. The hinge portion 502 may be flexible and may be a portion of soft material that may extend along all or a part of the device hinge axis 18. Portions of the first outer case portion 50 and/or the second outer case portion 68 (which may include the portions that are not made of the soft material) may be made from or comprise the hard material. In some embodiments, the soft material may be co-molded with or over the hard material.

Figure 15A:
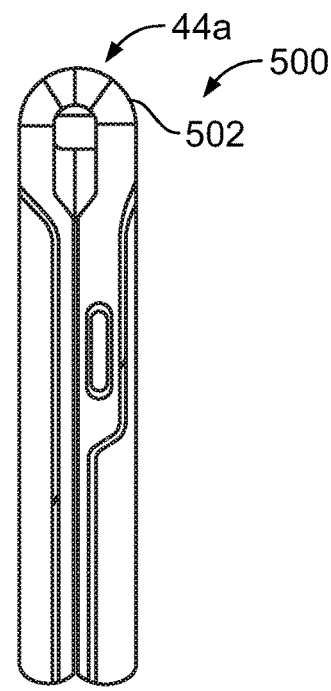
Figure 15B:
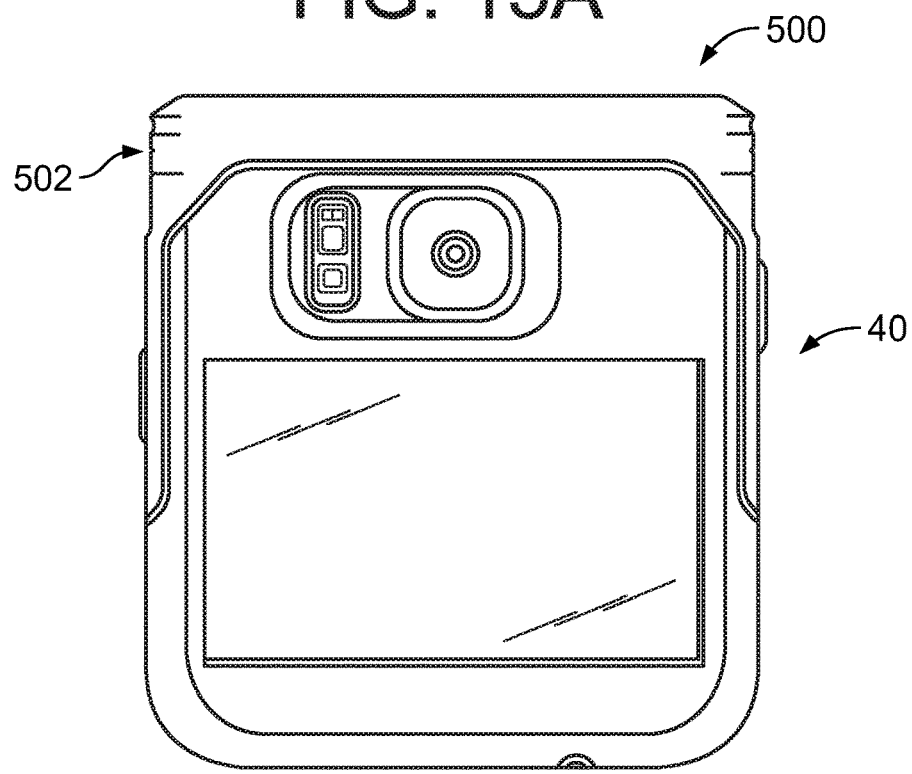

FIG. 15A illustrates a side view of the protective enclosure 500 having the hinge portion 502 with the encased electronic device 12 in the closed second position, and FIG. 15B illustrates a front view of the protective enclosure 500 having the hinge portion 502 with the encased electronic device 12 in the closed second position.

Figure 16:
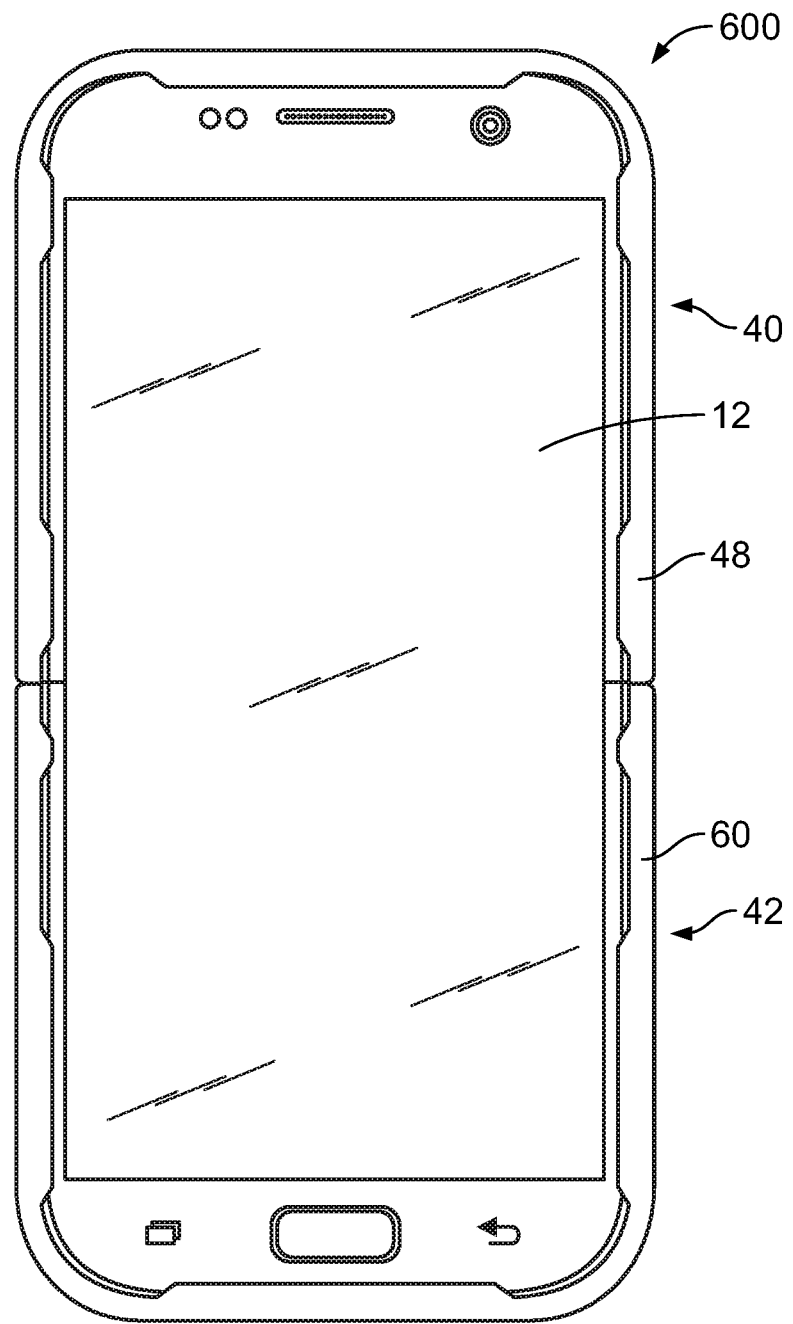
Figure 17:
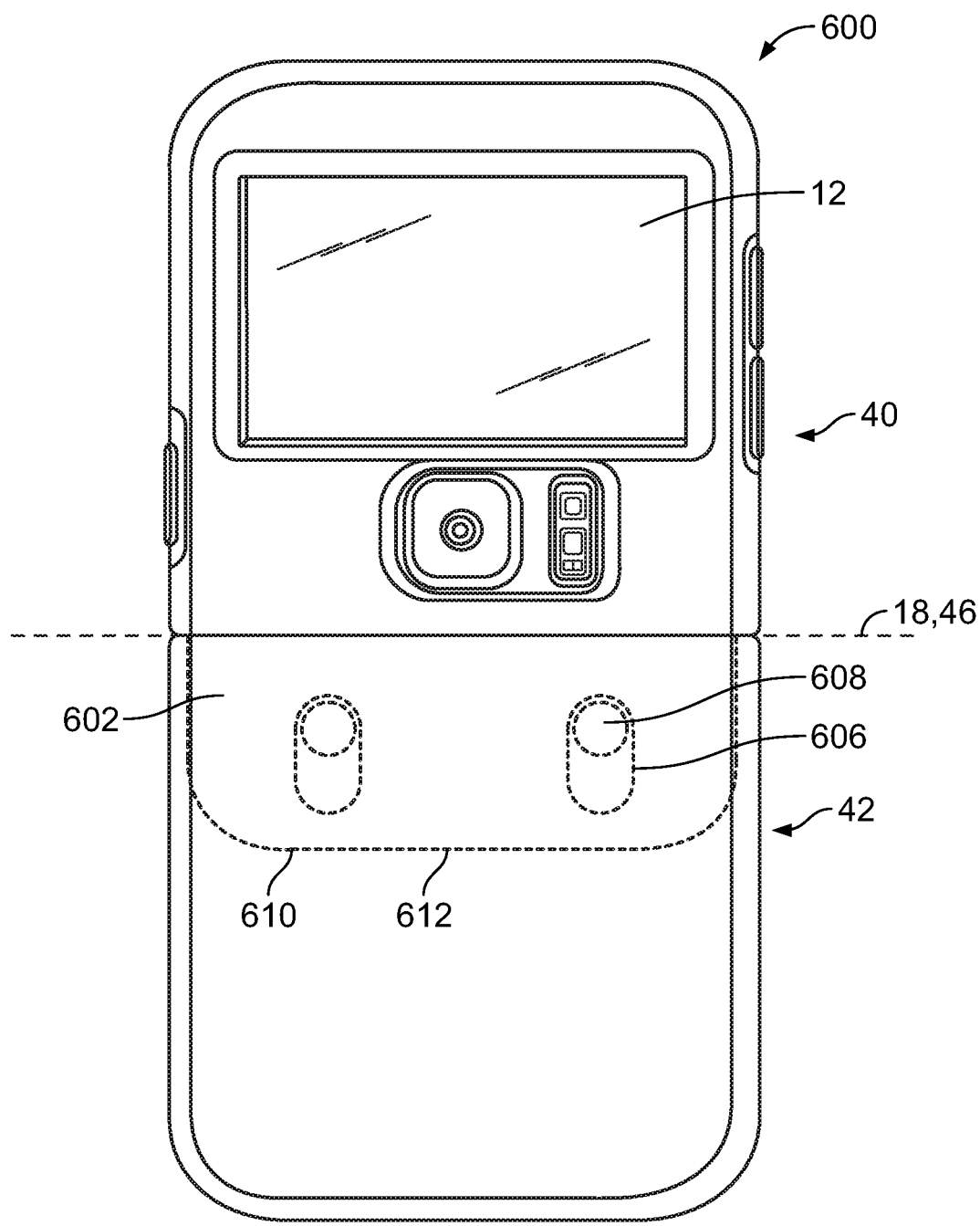

FIG. 16 illustrates an inner view of a further embodiment of a protective enclosure 600 with the encased electronic device 12 in the open first position, and FIG. 17 illustrates an outer view of the protective enclosure 600 with the encased electronic device 12 in the open first position. The protective enclosure 600 may include any or all of the features, functions, elements, or characteristics of any or all of the previously disclosed embodiments, such as the embodiment of the protective enclosure 400 illustrated in FIGS. 10 to 12B, and similar or identical components and elements will have identical reference numbers.

Figure 18:
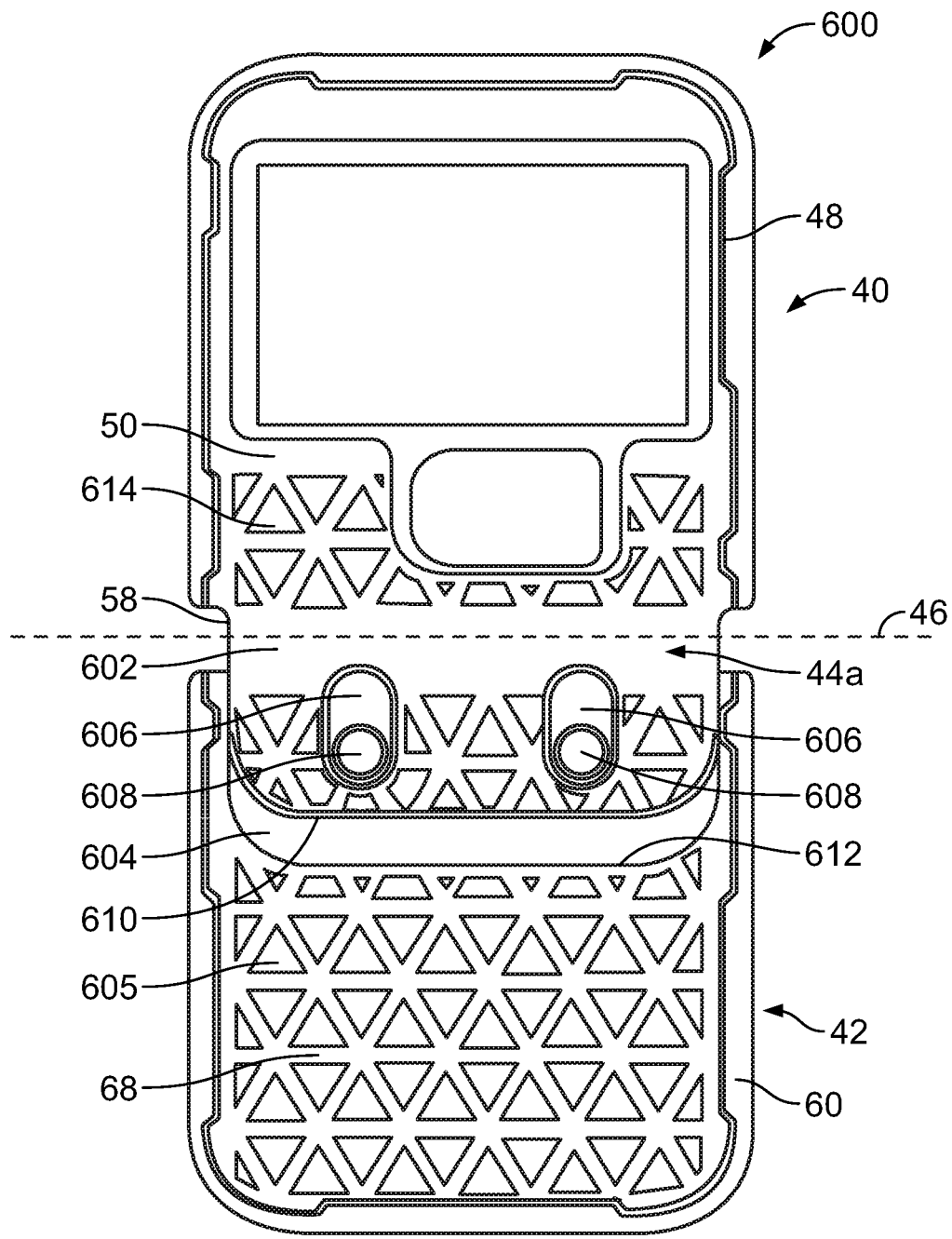

In the embodiment of the protective enclosure 600, the first case portion 40 may be displaceable relative to the second case portion 42 (or vice versa) by any method known in the art to allow an electronic device 12 to be inserted or removed from the protective enclosure 600. Specifically, and as illustrated in FIG. 18, which illustrates an outer view of the protective enclosure 600 (without the encased electronic device 12) generally in the open first position, the protective enclosure 600 may have a projection portion 602 than may extend from the second end 58 of the first outer case portion 50. The projection portion 602 may be received in a corresponding recess 604 formed on an inner surface 605 of the second outer case portion 68 of the second case portion 42. The first hinge member 44a may be a portion of the projection portion 602 that extends across a top portion of the projection portion 602 that is at or adjacent to the second end 58 of the first outer case portion 50, and the first hinge member 44a may be any known hinge mechanism, including a flexible portion of the projection portion 602.

The projection portion 602 may have one or more (e.g., two) slot portions 606 that each slidingly receives a corresponding pin member 608. With each pin member 608 received in a corresponding slot portion 606, the second case portion 42 may be slidably displaceable relative to the first case portion 40 along a direction that would correspond to the bottom device axis 18 (if the electronic device 12 was enclosed) between an open case position (illustrated in FIG. 18) and a closed case position (illustrated in FIG. 17). In the open case position of FIG. 18, each pin member 608 may be disposed at a first end of the corresponding slot portion 606 and a bottom edge 610 of the projection portion 602 may be offset from a bottom edge 612 of the recess 604. In the closed case position of FIG. 17, each pin member 608 (which is shown in dashed lines) may be disposed at a second end of the corresponding slot portion 606 and the bottom edge 610 of the projection portion 602 may be adjacent to or in contact with the bottom edge 612 of the recess 604. In some embodiments, the protective enclosure 600 may be moved to the open case position and the electronic device 12 may be inserted in the protective enclosure 600. The protective enclosure 600 may then be moved to the closed case position to retain the electronic device 12 in the protective enclosure 600. As illustrated in FIG. 18, a resilient and/or soft material may be disposed on or all or a portion of the inner surface 605 of the second outer case portion 68 and/or all or a portion of the inner surface 614 of the first outer case portion 50 to form one or more cushioning layers or cushioning members. The resilient material may comprise all or part the protection portion 102 and/or the first hinge member 44a.

The first inner case portion 48 may be secured to the first outer case portion 50 and the second inner case portion 60 may be secured to the second outer case portion 68, so the first inner case portion 48 and the first outer case portion 50 may displace as a unit relative to the second inner case portion 60 and the second outer case portion 68. In some embodiments, the first inner case portion 48 and the first outer case portion 50 may be removable from the second inner case portion 60 and the second outer case portion 68.

In some embodiments (not shown), the one or more pin members may be disposed on the projection portion 602 and the slot portions 660 may be disposed on the second outer case portion 68. In other embodiments, the projection portion 202 may extend from the second outer case portion 68, but may be otherwise identical to any embodiment discussed.

FIG. 19A illustrates a side view of the protective enclosure 600 with the encased electronic device 12 in the closed second position. FIG. 19B illustrates a front view of the protective enclosure 600 with the encased electronic device 12 in the closed second position, and FIG. 19C illustrates a rear view of the protective enclosure 600 with the encased electronic device 12 in the closed second position, with the projection portion each pin member 608 disposed in the corresponding slot portion 606.

Figure 20:
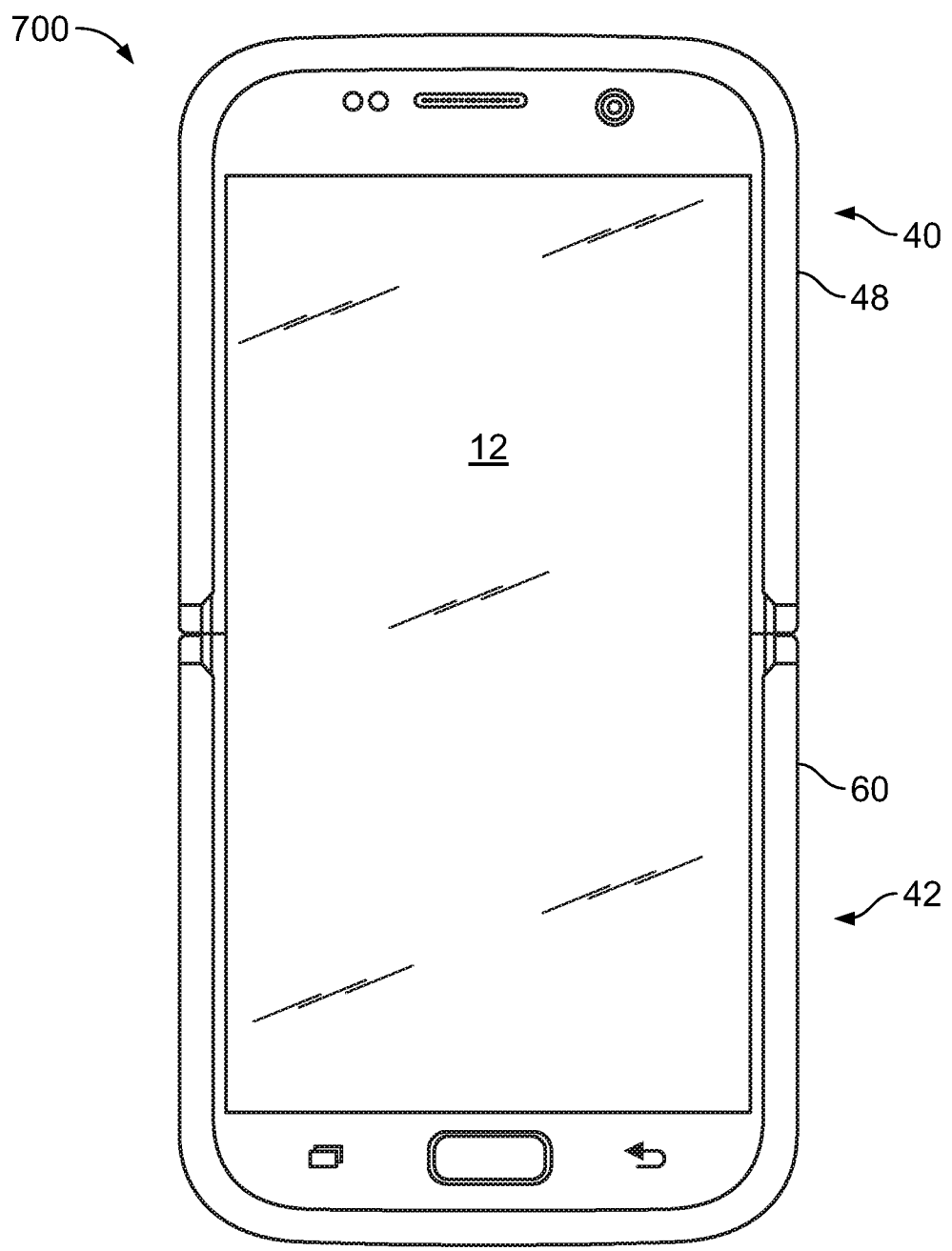
FIGS. 20, 21, 22, 23A, 23B, and 23C are various views of an embodiment of a protective enclosure for an electronic device.
Figure 21:
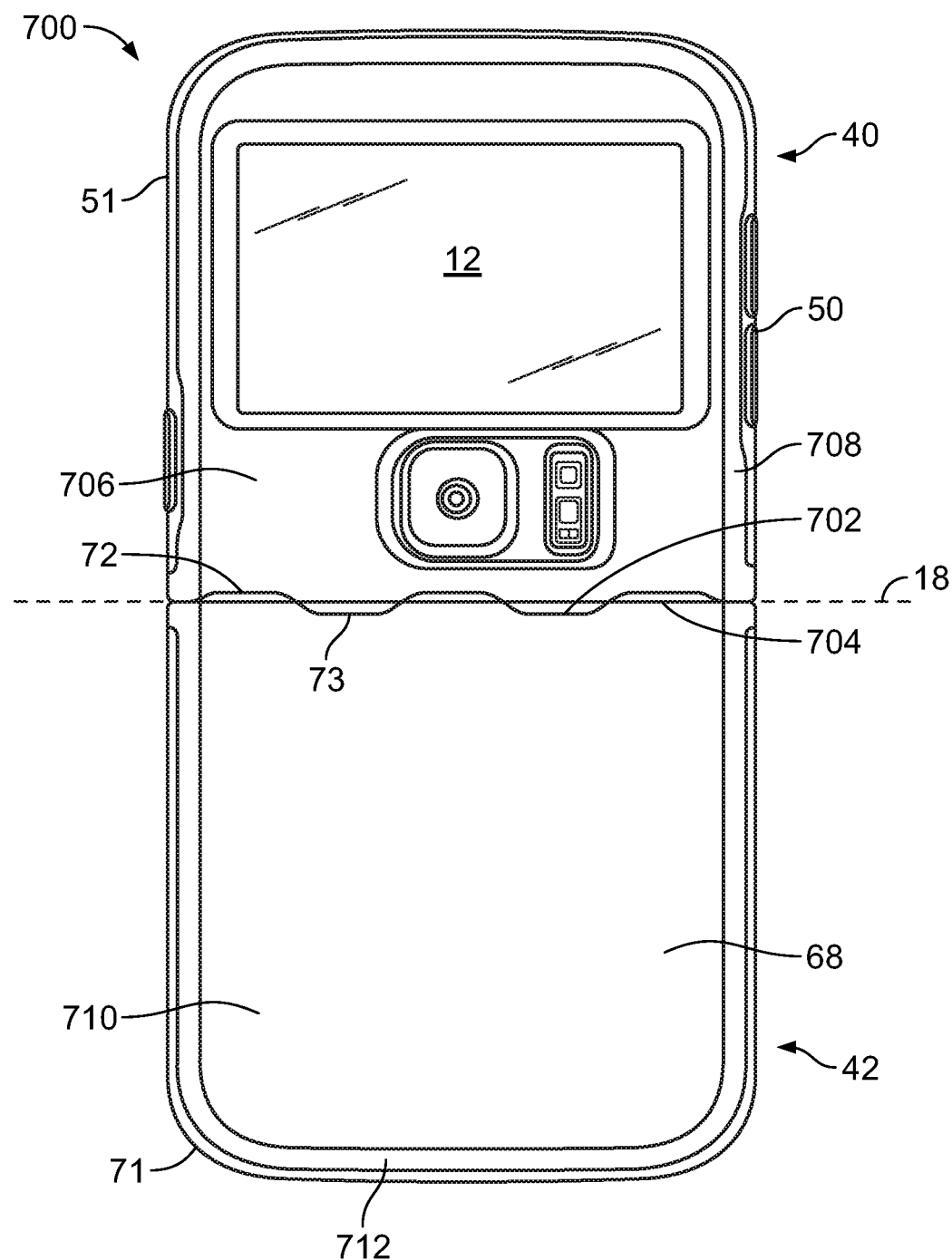

FIG. 20 illustrates an inner view of a further embodiment of a protective enclosure 700 with the encased electronic device 12 in the open first position, and FIG. 21 illustrates an outer view of the protective enclosure 700 with the encased electronic device 12 in the open first position. The protective enclosure 700 may include any or all of the features, functions, elements, or characteristics of any or all of the previously disclosed embodiments, such as the embodiment of the protective enclosure 600 illustrated in FIGS. 16 to 19C, and similar or identical components and elements will have identical reference numbers.

Figure 22:
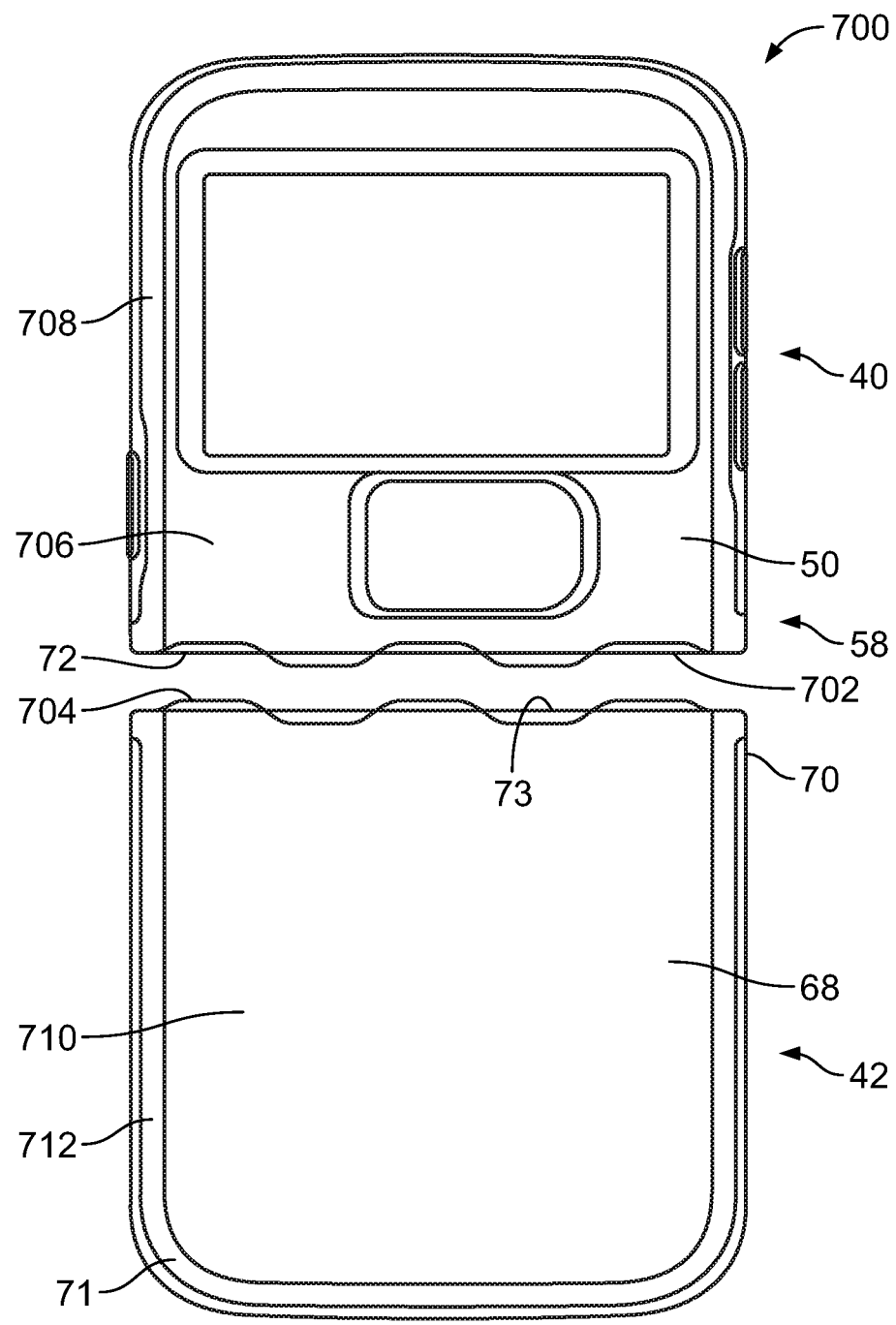

In the embodiment of the protective enclosure 700, the first case portion 40 may be removable and/or displaceable from the second case portion 42 (or vice versa) by any method known in the art to allow an electronic device 12 to be inserted or removed from the protective enclosure 700. Specifically, and as illustrated in FIG. 22, which illustrates an outer view of the protective enclosure 700 (without the encased electronic device 12) in the open first position with the first case portion 40 and the second case portion 42 separated, the second end 58 of the first outer case portion 50 may have a first set of teeth 702 that may generally extend along or adjacent to the bottom edge 72 of the first outer case portion 50. In addition, the second end 70 of the second outer case portion 68 may have a second set of teeth 704 that may generally extend along or adjacent to the top edge 73 of the second outer case portion 68. The first set of teeth 702 may releasably engage the second set of teeth 704 when the electronic device 12 disposed between within the protective enclosure 700, as illustrated in FIG. 21. In some embodiments, an end portion of each of the first set of teeth 702 may releasably engage an end portion of a corresponding one of the second set of teeth 704, such as by overlapping or by snapping.

Figure 23:
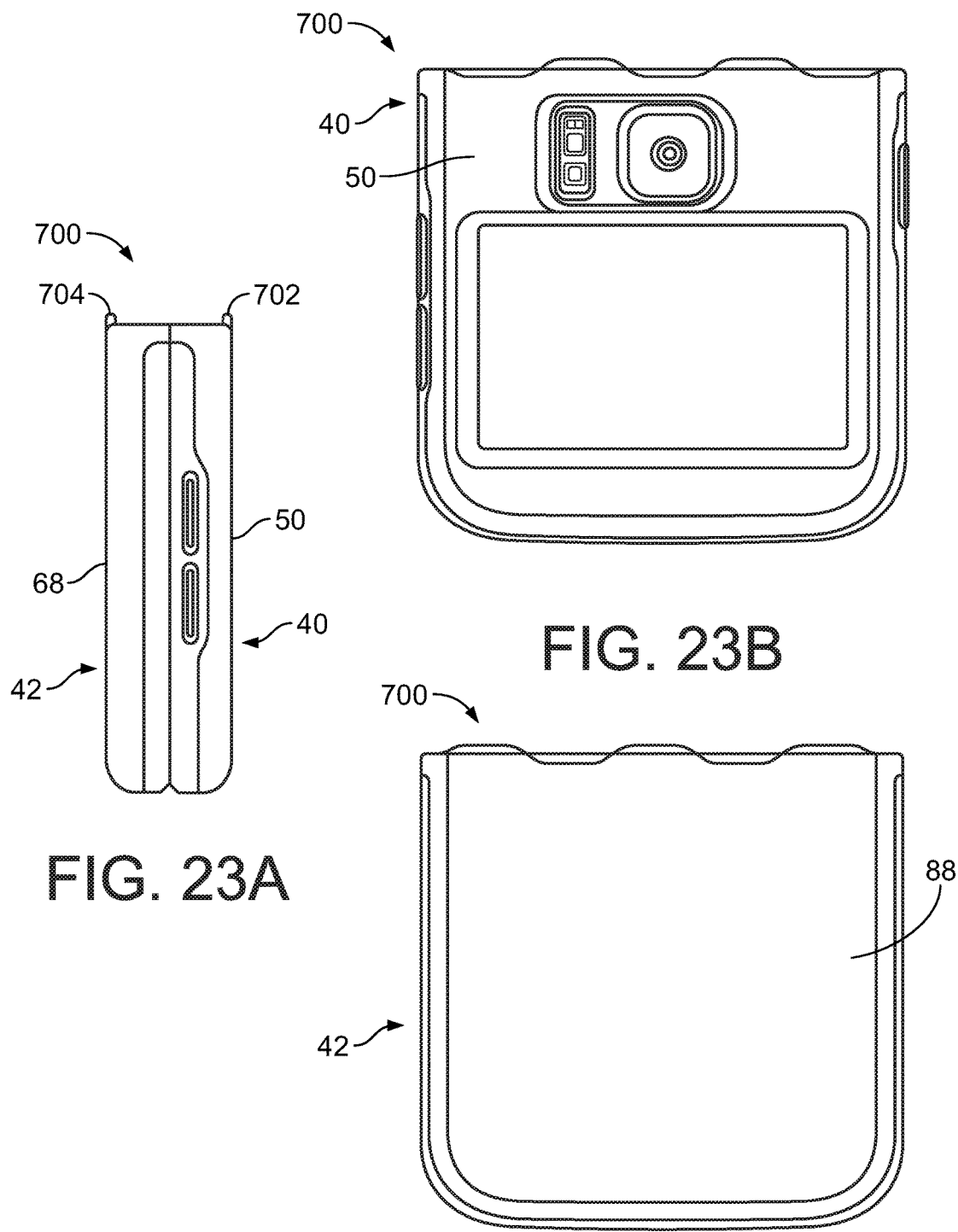

In some embodiments, the protective enclosure 700 does not have a first hinge member 44a. In particular, as illustrated in the side view of the protective enclosure 700 in the closed second position of FIG. 23A, the electronic device 12 may fold around the device hinge axis 18 (illustrated in FIG. 21) and the first set of teeth 702 and the second set of teeth 704 may be offset and disengaged. However, the protective enclosure 800 may include a first hinge member 44a that may be any known hinge that couples the first case portion 40 and the second case portion 42.

As illustrated in FIG. 21, a portion 706 (or all) of the first outer case portion 50 may be made from or comprise a transparent or semi-transparent material (such as a clear polycarbonate material). In addition, a portion 708 of the first outer case portion 50 may be made from or comprise a bumper material, that may be an opaque material or a transparent or semi-transparent material. The bumper material may be resilient and may be capable of absorbing shocks from falls or impact. For example, the portion 708 may include a portion along the first outer perimeter edge 51, but may not include a portion along the bottom edge 72. A portion 710 (or all) of the second outer case portion 68 may be made from or comprise a transparent or semi-transparent material (such as a clear polycarbonate material). In addition, a portion 712 of the second outer case portion 68 may be made from or comprise the bumper material. For example, the portion 712 may include a portion along the second outer perimeter edge 71, but may not include a portion along the top edge 73. In addition, referring to FIG. 20, a portion (or all) of the first inner case portion 48 and/or a portion (or all) of the second inner case portion 60 may be made from or comprise the bumper material and/or a transparent or semi-transparent material. The transparent, semi-transparent, and/or bumper material may be coupled by any method known in the art, such as by overmolding, co-molding, adhesives, ultrasonic welding, or mechanical fastening, for example.

FIG. 23B illustrates a front view of the protective enclosure 700 with the encased electronic device 12 in the closed second position, and FIG. 23C illustrates a rear view of the protective enclosure 700 with the encased electronic device 12 in the closed second position.

Figure 24:
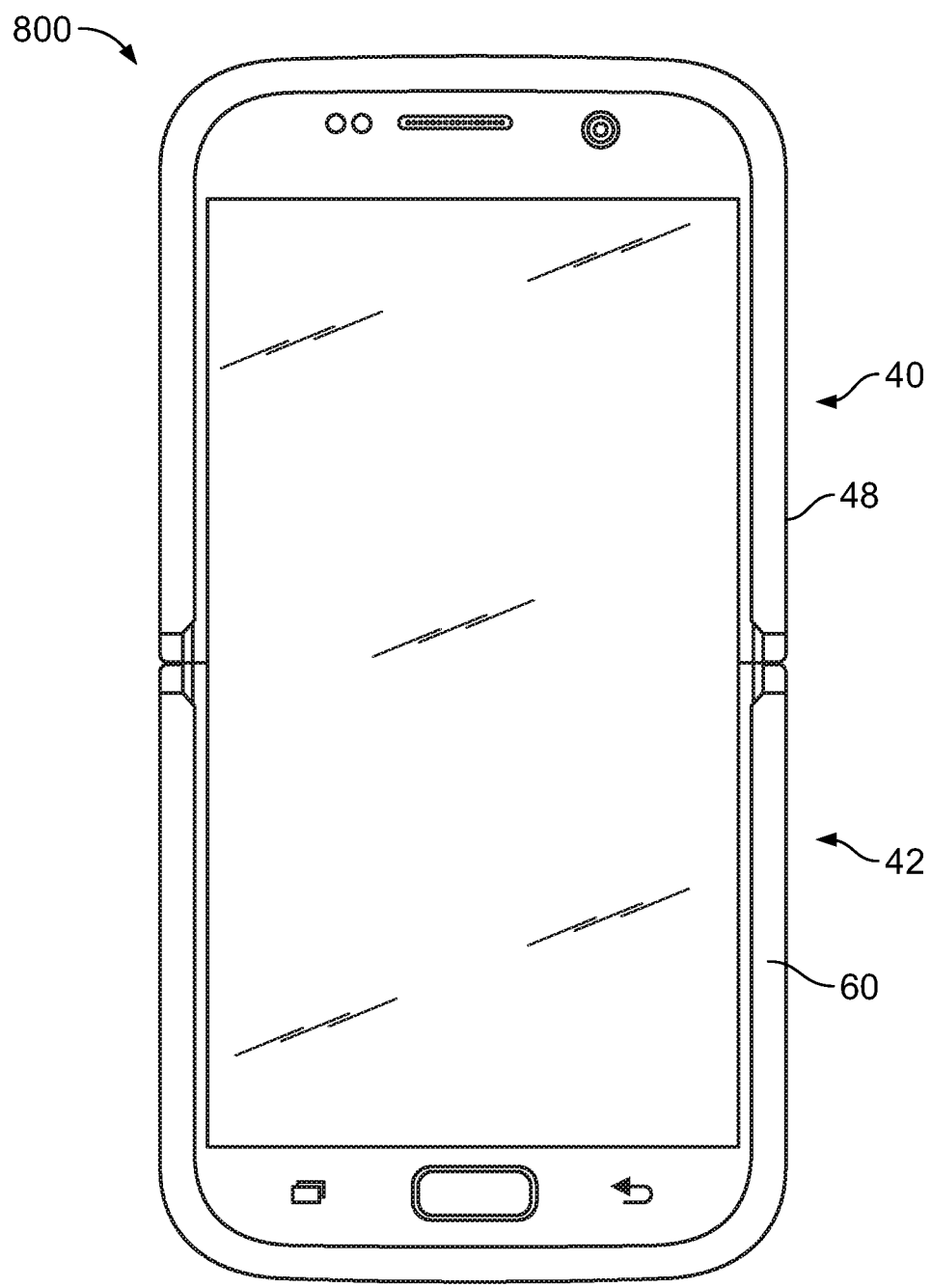
Figure 25:
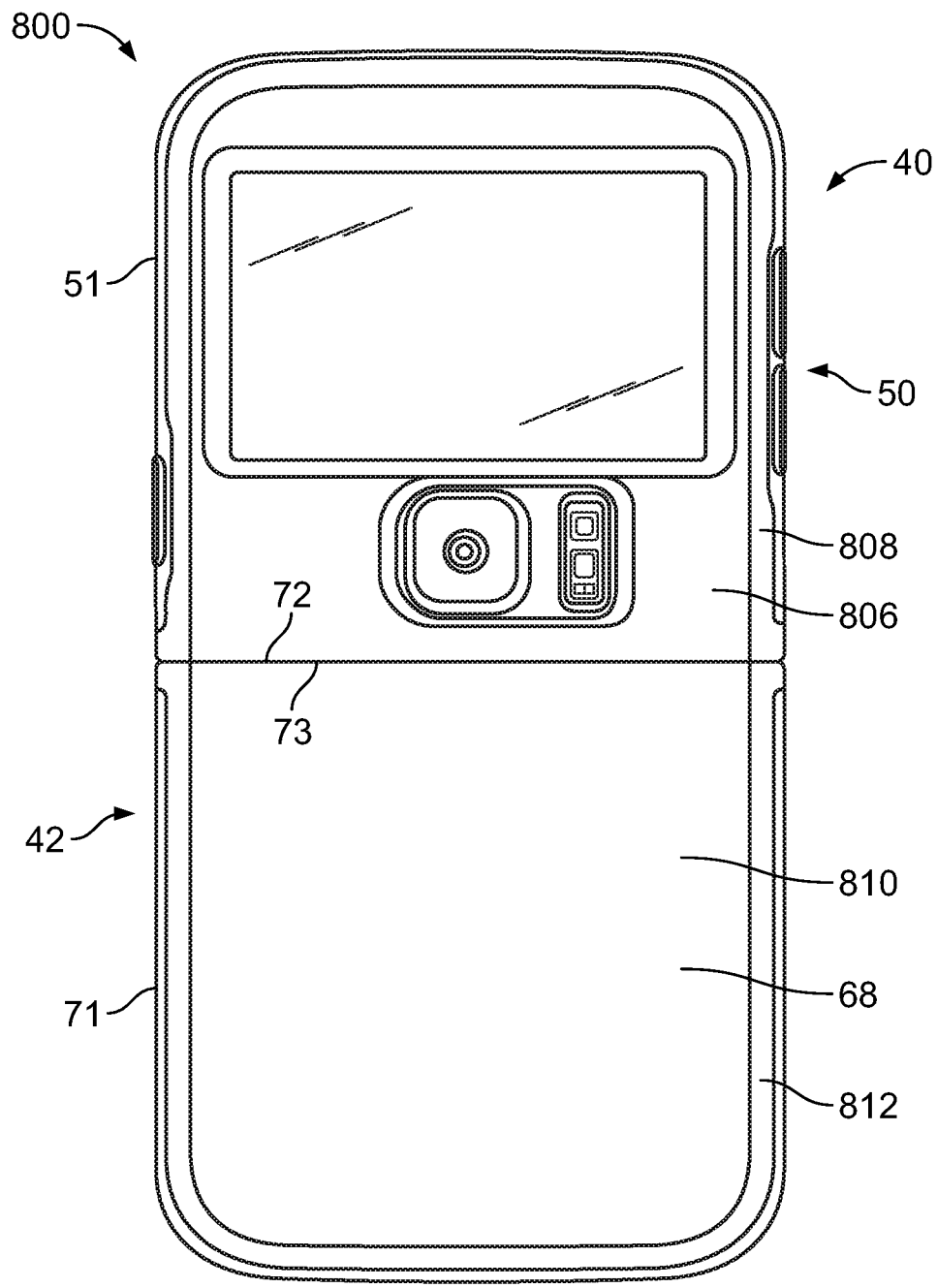
Figure 26:
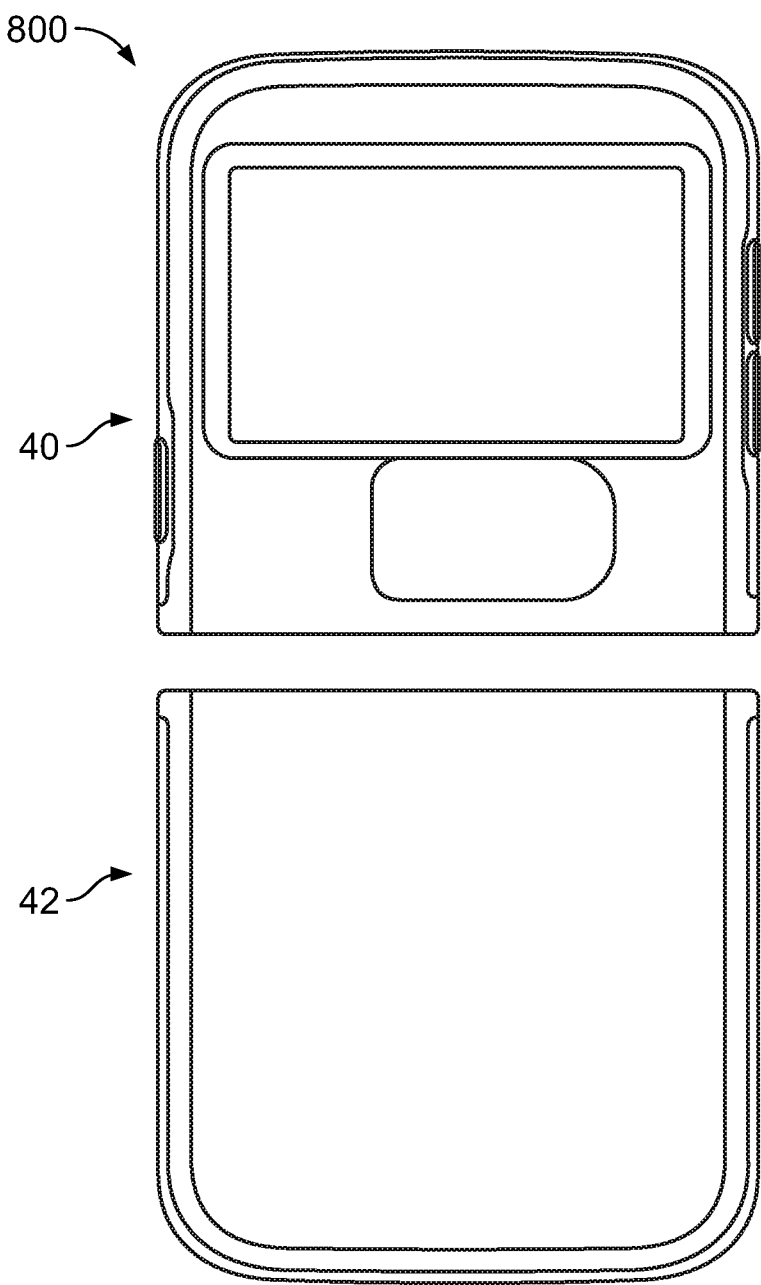

FIG. 24 illustrates an inner view of a further embodiment of a protective enclosure 800 with the encased electronic device 12 in the open first position, and FIG. 25 illustrates an outer view of the protective enclosure 800 with the encased electronic device 12 in the open first position. The protective enclosure 800 may include any or all of the features, functions, elements, or characteristics of any or all of the previously disclosed embodiments, such as the embodiment of the protective enclosure 700 illustrated in FIGS. 19 to 23C, and similar or identical components and elements will have identical reference numbers. In the embodiment of the protective enclosure 800, the first case portion 40 may be removable and/or displaceable from the second case portion 42 (or vice versa) by any method known in the art to allow an electronic device 12 to be inserted or removed from the protective enclosure 800. Specifically, and as illustrated in FIG. 26, which illustrates an outer view of the protective enclosure 800 (without the encased electronic device 12) in the open first position with the first case portion 40 and the second case portion 42 separated, the bottom edge 72 at the second end 58 of the first outer case portion 50 may be flat or substantially flat. In addition, the top edge 73 at the second end 70 of the second outer case portion 68 may be flat or substantially flat and may be in contact with or adjacent to the bottom edge 72 of the first outer case portion 50 in the open first position.

As illustrated in FIG. 25, a portion 806 (or all) of the first outer case portion 50 may be made from or comprise a transparent or semi-transparent material (such as a glass material). In addition, a portion 808 of the first outer case portion 50 may be made from or comprise the bumper material that may be an opaque material or a transparent or semi-transparent material. The bumper material may be resilient and may be capable of absorbing shocks from falls or impact. For example, the portion 808 may include a portion along the first outer perimeter edge 51, but may not include a portion along the bottom edge 72. A portion 810 (or all) of the second outer case portion 68 may be made from or comprise a transparent or semi-transparent material (such as a glass material). In addition, a portion 812 of the second outer case portion 68 may be made from or comprise the bumper material. For example, the portion 812 may include a portion along the second outer perimeter edge 71, but may not include a portion along the top edge 73. In addition, referring to FIG. 24, a portion (or all) of the first inner case portion 48 and/or a portion (or all) of the second inner case portion 60 may be made from or comprise the bumper material and/or a transparent or semi-transparent material (such as a clear polycarbonate material). The transparent, semi-transparent, and/or bumper material may be coupled by any method known in the art, such as by overmolding, adhesives, ultrasonic welding, or mechanical fastening, for example.

In some embodiments, the protective enclosure 800 does not have a first hinge member 44a. In particular, as illustrated in the side view of the protective enclosure 800 in the closed second position of FIG. 27A, the electronic device 12 may fold around the device hinge axis 18 (illustrated in FIG. 21). However, the protective enclosure 800 may include a first hinge member 44a that may be any known hinge that couples the first case portion 40 and the second case portion 42.

FIG. 27B illustrates a front view of the protective enclosure 800 with the encased electronic device 12 in the closed second position, and FIG. 27C illustrates a rear view of the protective enclosure 800 with the encased electronic device 12 in the closed second position.

Figure 28:
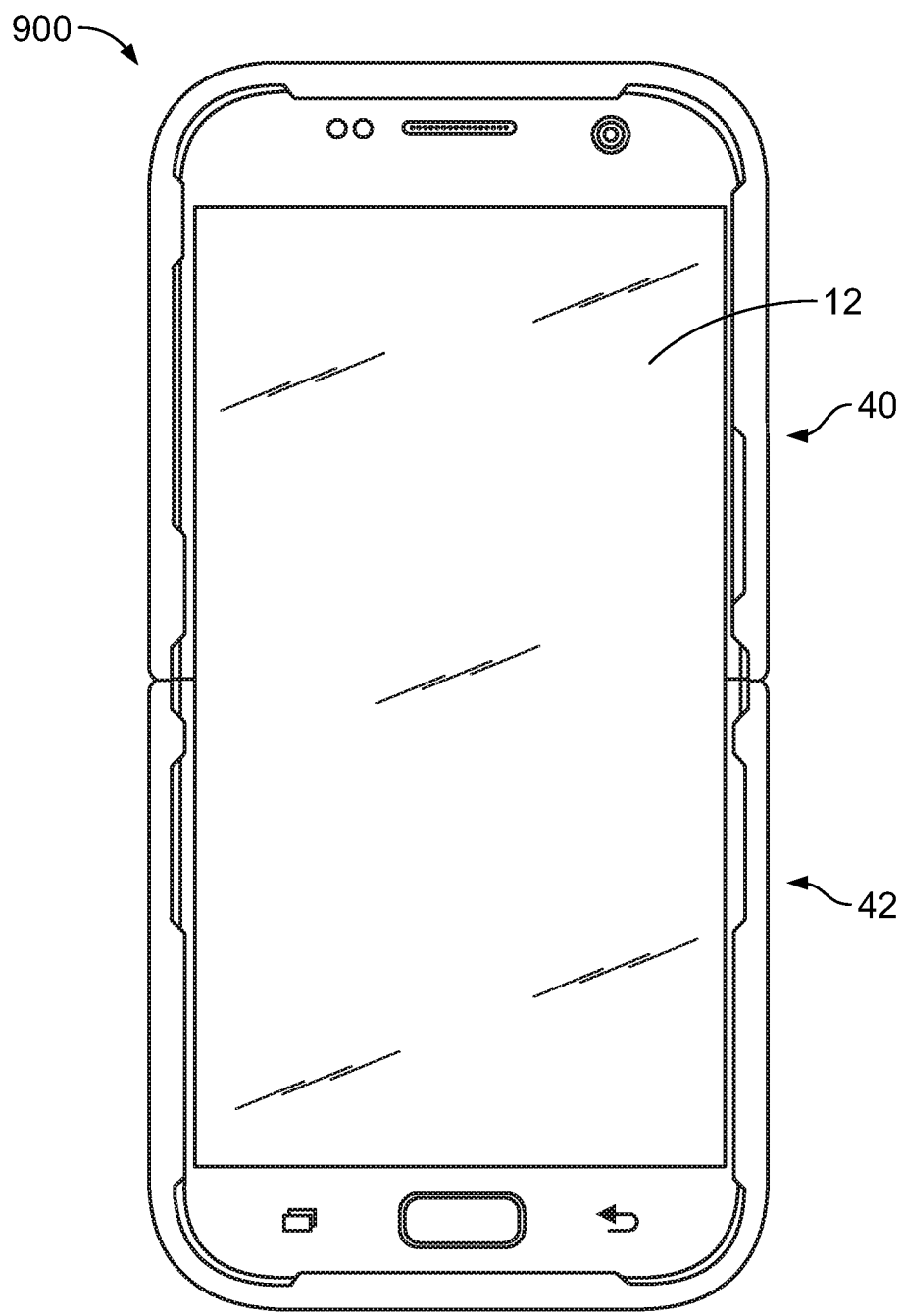
Figure 29:
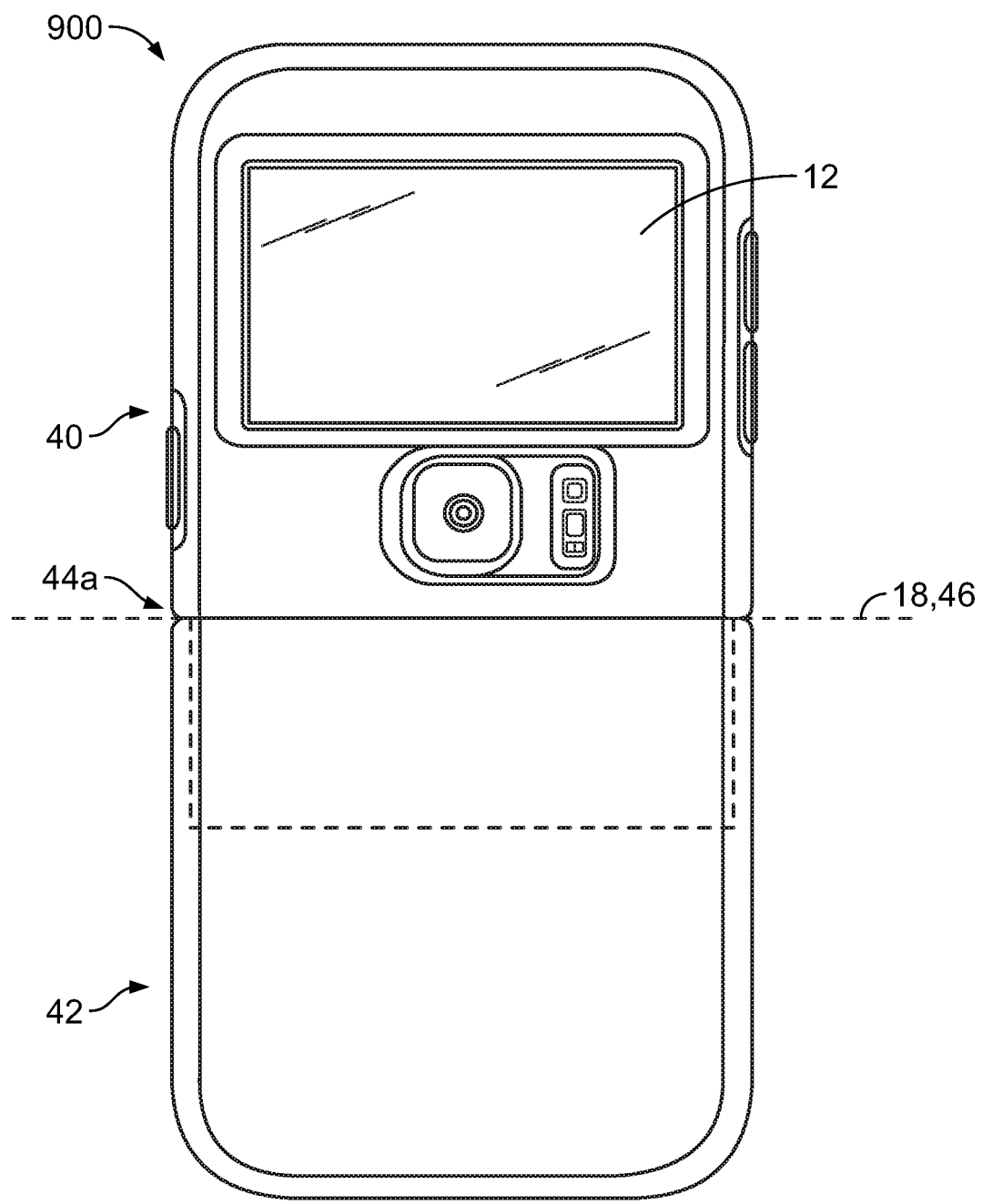

FIG. 28 illustrates an inner view of a further embodiment of a protective enclosure 900 with the encased electronic device 12 in the open first position, and FIG. 29 illustrates an outer view of the protective enclosure 900 with the encased electronic device 12 in the open first position. The protective enclosure 900 may include any or all of the features, functions, elements, or characteristics of any or all of the previously disclosed embodiments, such as the embodiment of the protective enclosure 600 illustrated in FIGS. 16 to 19C, and similar or identical components and elements will have identical reference numbers.

Figure 30:
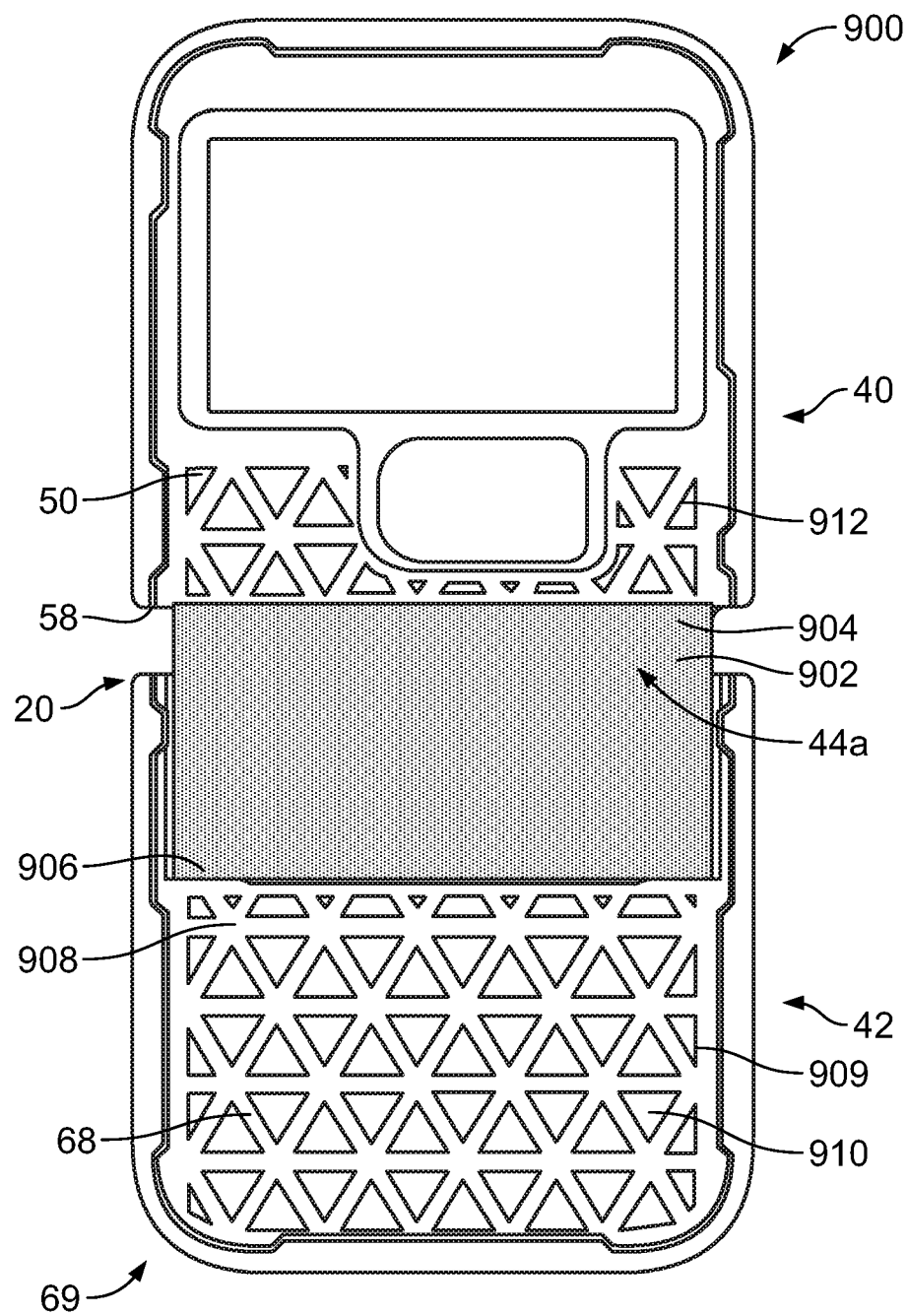

In the embodiment of the protective enclosure 900, the first case portion 40 may be displaceable relative to the second case portion 42 (or vice versa) by any method known in the art to allow an electronic device 12 to be inserted or removed from the protective enclosure 900. Specifically, and as illustrated in FIG. 30, which illustrates an outer view of the protective enclosure 900 (without the encased electronic device 12) generally in the open first position, the protective enclosure 900 may have a projection portion 902 that may have a first end 904 that extends from the second end 58 of the first outer case portion 50. The projection portion 902 may have a second end 906 coupled to the second outer case portion 68 (e.g., coupled to a portion of the inner surface 908) at a point between the first end 69 and the second end 70 of the second outer case portion 68. The first hinge member 44a may be a portion of the projection portion 902 that extends across a top portion of the projection portion 902 that is at or adjacent to the second end 58 of the first outer case portion 50, and the first hinge member 44a may be any known hinge mechanism, including a flexible portion of the projection portion 902. The projection portion 902 may be made from or comprise an elastic, stretchable, or resilient material that may be deformable and may have a spring-like tendency to resist elongation.

In the embodiment of the protective enclosure 900, the first case portion 40 may be displaceable relative to the second case portion 42 (or vice versa) from an open case position (illustrated in FIG. 30) and a closed case position (illustrated in FIG. 29). In the open case position, the first case portion 40 may be displaced away from the second case portion along an axis that may correspond to the top device axis 17 (if the electronic device 12 was enclosed) to allow the electronic device 12 to be inserted in the protective enclosure 900. When the electronic device 12 is in the protective enclosure 900, the elastic property of the projection portion 902 pulls the second case portion 42 towards the first case portion 40 to assist in retaining the electronic device 12 in the protective enclosure 900 such that the protective enclosure 900 is the closed case position. As illustrated in FIG. 30, a resilient material 909 may be disposed on or all or a portion of the inner surface 910 of the second outer case portion 68 and/or all or a portion of the inner surface 912 of the first outer case portion 50.

FIG. 31A illustrates a side view of the protective enclosure 900 with the encased electronic device 12 in the closed second position. FIG. 31B illustrates a front view of the protective enclosure 900 with the encased electronic device 12 in the closed second position, and FIG. 31C illustrates a rear view of the protective enclosure 900 with the encased electronic device 12 in the closed second position.

Figure 32:
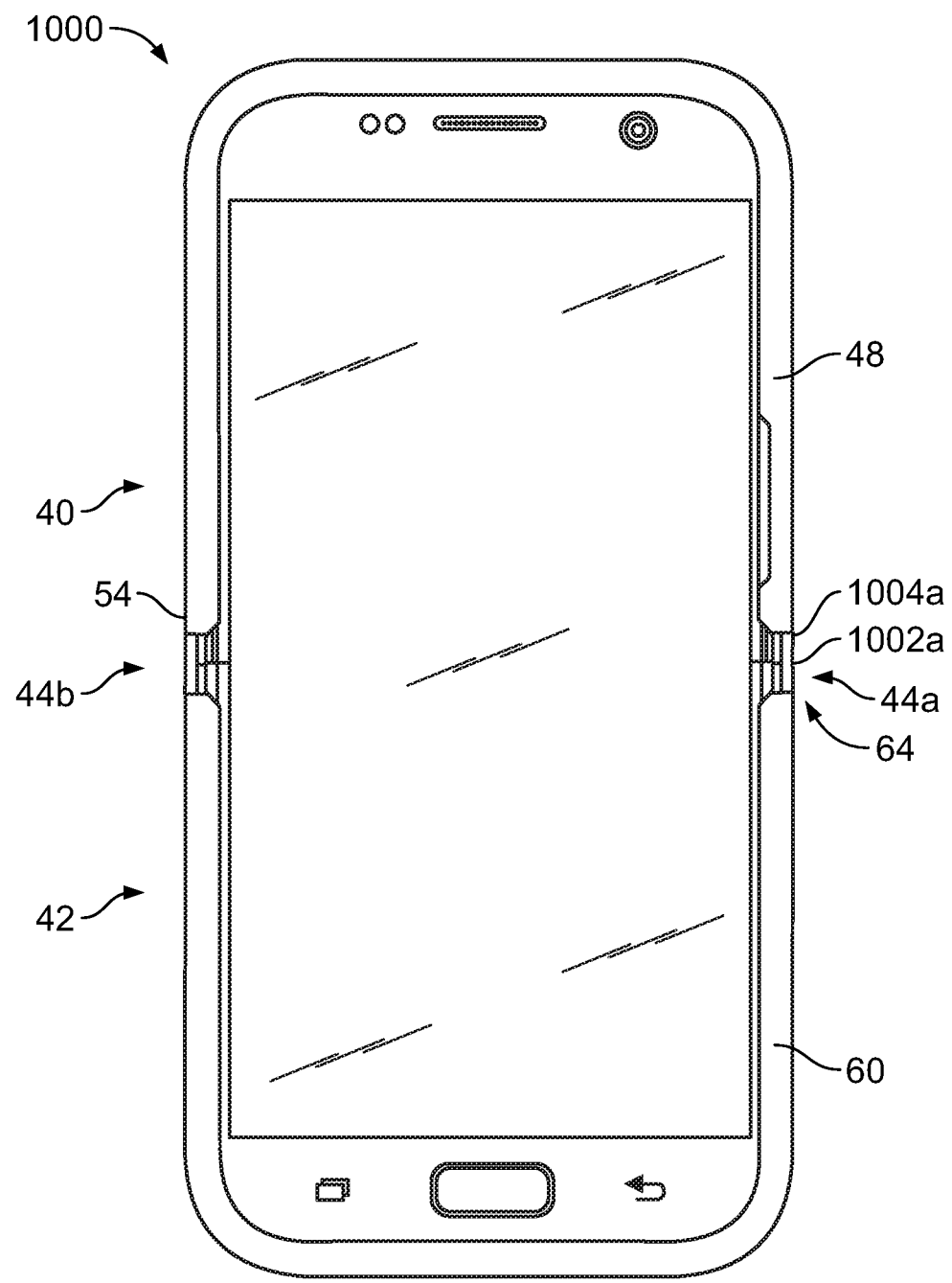
Figure 33:
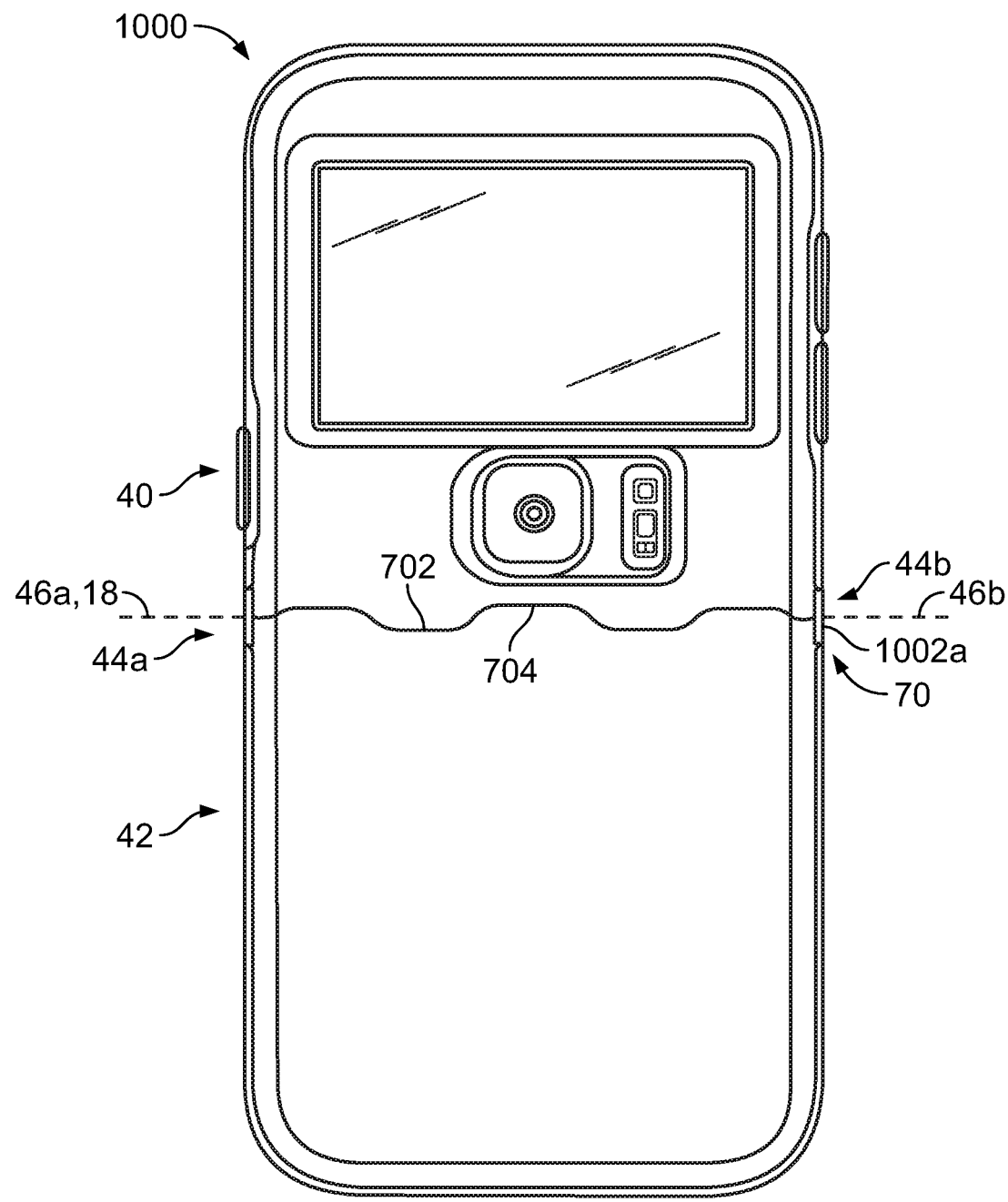

FIG. 32 illustrates an inner view of a further embodiment of a protective enclosure 1000 with the encased electronic device 12 in the open first position, and FIG. 33 illustrates an outer view of the protective enclosure 1000 with the encased electronic device 12 in the open first position. The protective enclosure 1000 may include any or all of the features, functions, elements, or characteristics of any or all of the previously disclosed embodiments, such as the embodiment of the protective enclosure 700 illustrated in FIGS. 20 to 23C, and similar or identical components and elements will have identical reference numbers.

Figure 34:
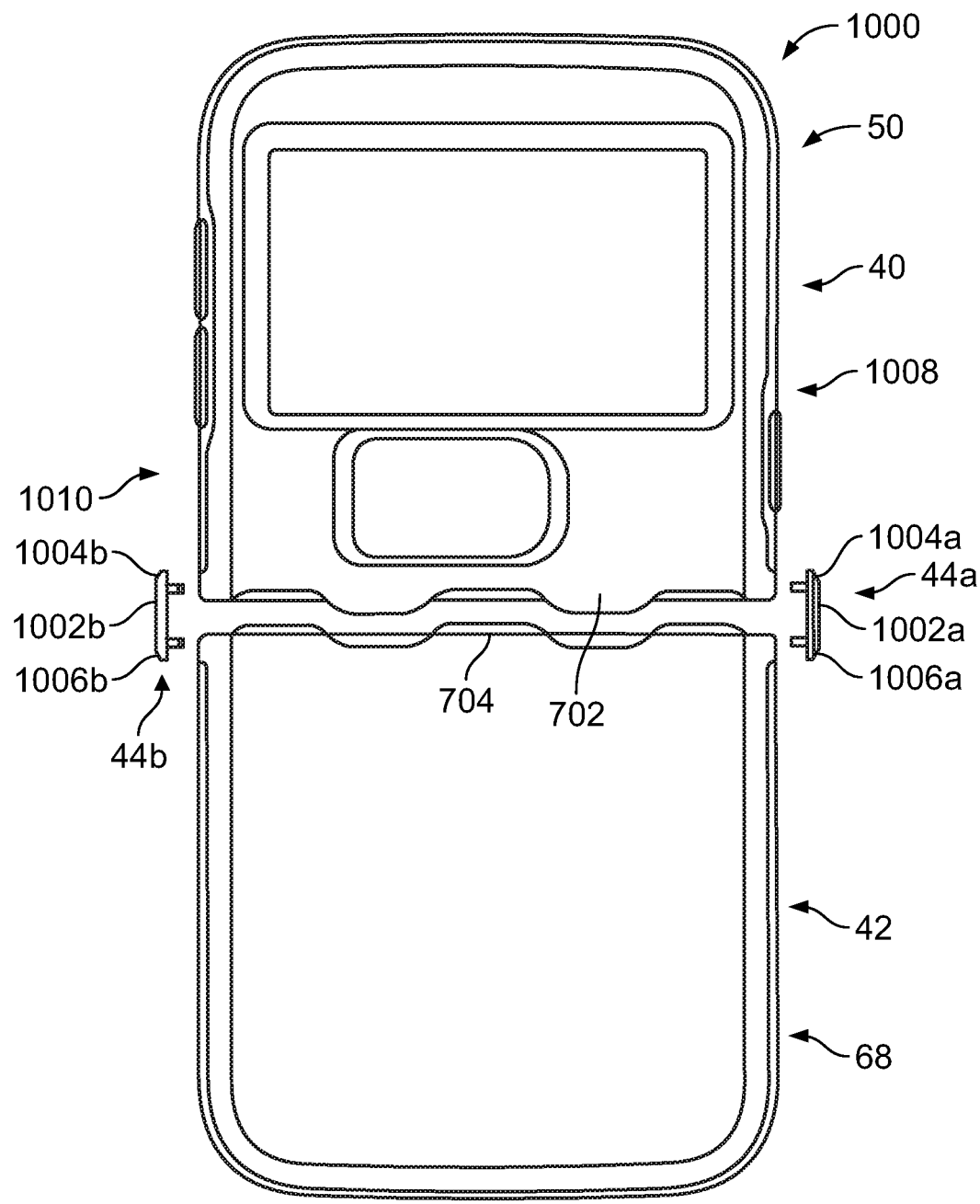

In the embodiment of the protective enclosure 1000, the first case portion 40 may be removable and/or displaceable from the second case portion 42 (or vice versa) by any method known in the art to allow an electronic device 12 to be inserted or removed from the protective enclosure 1000. In addition, the first case portion 40 may be pivotable relative to the second case portion 42 by any method known in the art. For example, as illustrated in FIG. 34 (which illustrates the protective enclosure 1000 without an encased electronic device 12 and in a semi-exploded state), the first hinge member 44a of the protective enclosure 1000 may be or include a first hinge element 1002a that may be elongated and may extend from a first end 1004a to a second end 1006a. The first hinge element 1002a may be made from a rigid material (such as a plastic material) or a flexible material (or a combination of rigid and flexible materials). The first end 1004a may be coupled to a portion of the first outer case portion 50 (and/or a portion of the first inner case portion 48 of FIG. 32) at or adjacent to the second end 58 of the first outer case portion 50 (and/or at or adjacent to the second end 54 of the first inner case portion 48 of FIG. 32). The first end 1004a may be coupled to the portion of the first outer case portion 50 (and/or the portion of the first inner case portion 48) by any method that allows the first end 1004a to rotate relative to the first outer case portion 50, such as by a pin that is received into an aperture formed in the first outer case portion 50 (and/or the first inner case portion 48).

Still referring to FIG. 34, the second end 1006a of the first hinge element 1002a may be coupled to a portion of the second outer case portion 68 (and/or a portion of the second inner case portion 60 of FIG. 32) at or adjacent to the second end 70 of the second outer case portion 68 (and/or at or adjacent to the second end 64 of the second inner case portion 60 of FIG. 32). The second end 1006a may be coupled to the portion of the second outer case portion 68 (and/or the portion of the second inner case portion 60) by any method that allows the second end 1006a to rotate relative to the second outer case portion 68, such as by a pin that is received into an aperture formed in the second outer case portion 68 (and/or the second inner case portion 60).

The first hinge axis 46a may be any axis of rotation of the first hinge member 44a or may be a first axis of rotation of the first hinge member 44a (such as the pin at or adjacent to the first end 1004a of the first hinge element 1002a or a second axis of rotation of the first hinge member 44a (such as the pin at or adjacent to the second end 1006a of the first hinge element 1002a). In some embodiments, the first hinge axis 46a may be an effective axis of rotation of the combination of rotational axes of the first hinge element 1002a.

Still referring to FIG. 34, the protective enclosure 1000 may also include a second hinge member 44b that may be identical to the first hinge member 44a, but disposed on an opposite lateral side of the protective enclosure. For example, if the first hinge member 44a is disposed along or adjacent to a first lateral end 1008 of the first outer case portion 50 and the second outer case portion 68, the second hinge member 44b may be disposed along a second lateral end 1010 of the first outer case portion 50 and the second outer case portion 68. The first lateral end 1008 and the second lateral end 1010 may each be normal or substantially normal to the device hinge axis 18 when the electronic device 12 is encased in the protective enclosure 1000.

In the protective enclosure 1000, the second hinge member 44b may be a second hinge element 1002b that may be elongated and may extend from a first end 1004b to a second end 1006b. The first end 1004b may be coupled to a portion of the first outer case portion 50 (and/or a portion of the first inner case portion 48 of FIG. 32) at or adjacent to the second end 58 of the first outer case portion 50 (and/or at or adjacent to the second end 54 of the first inner case portion 48 of FIG. 32). The first end 1004b may be coupled to the portion of the first outer case portion 50 (and/or the portion of the first inner case portion 48) by any method that allows the first end 1004b to rotate relative to the first outer case portion 50, such as by a pin that is received into an aperture formed in the first outer case portion 50 (and/or the first inner case portion 48).

Still referring to FIG. 34, the second end 1006b of the second hinge element 1002b may be coupled to a portion of the second outer case portion 68 (and/or a portion of the second inner case portion 60 of FIG. 32) at or adjacent to the second end 70 of the second outer case portion 68 (and/or at or adjacent to the second end 64 of the second inner case portion 60 of FIG. 32). The second end 1006b may be coupled to the portion of the second outer case portion 68 (and/or the portion of the second inner case portion 60) by any method that allows the second end 1006b to rotate relative to the second outer case portion 68, such as by a pin that is received into an aperture formed in the second outer case portion 68 (and/or the second inner case portion 60).

The second hinge axis 46b may be any axis of rotation of the second hinge member 44b or may be a first axis of rotation of the second hinge member 44b (such as the pin at or adjacent to the first end 1004b of the second hinge element 1002b or a second axis of rotation of the second hinge member 44b (such as the pin at or adjacent to the second end 1006b of the second hinge element 1002a). In some embodiments, the second hinge axis 46b may be an effective axis of rotation of the combination of rotational axes of the second hinge element 1002b.

When the electronic device 12 is moved between the open first position and the closed second position, the first case portion 40 rotates or pivots about the first and second hinge axes 46a, 46b as described due to the first hinge member 44a and the second hinge member 44b.

FIG. 35A illustrates a side view of the protective enclosure 1000 with the encased electronic device 12 in the closed second position. FIG. 35B illustrates a front view of the protective enclosure 1000 with the encased electronic device 12 in the closed second position, and FIG. 35C illustrates a rear view of the protective enclosure 1000 with the encased electronic device 12 in the closed second position.

Figure 36:
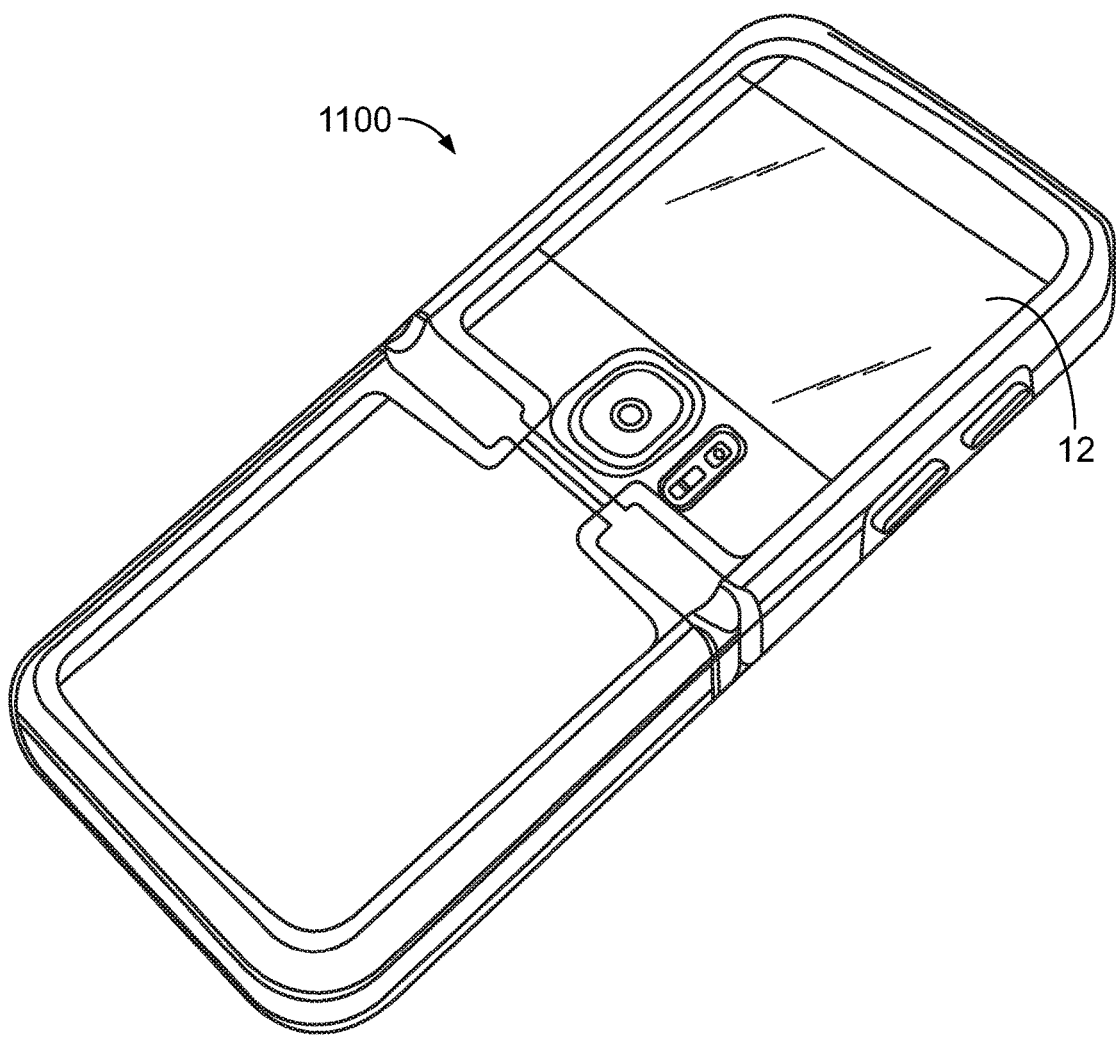
FIGS. 36 to 38 are various views of an embodiment of a protective enclosure for an electronic device.
Figure 38:
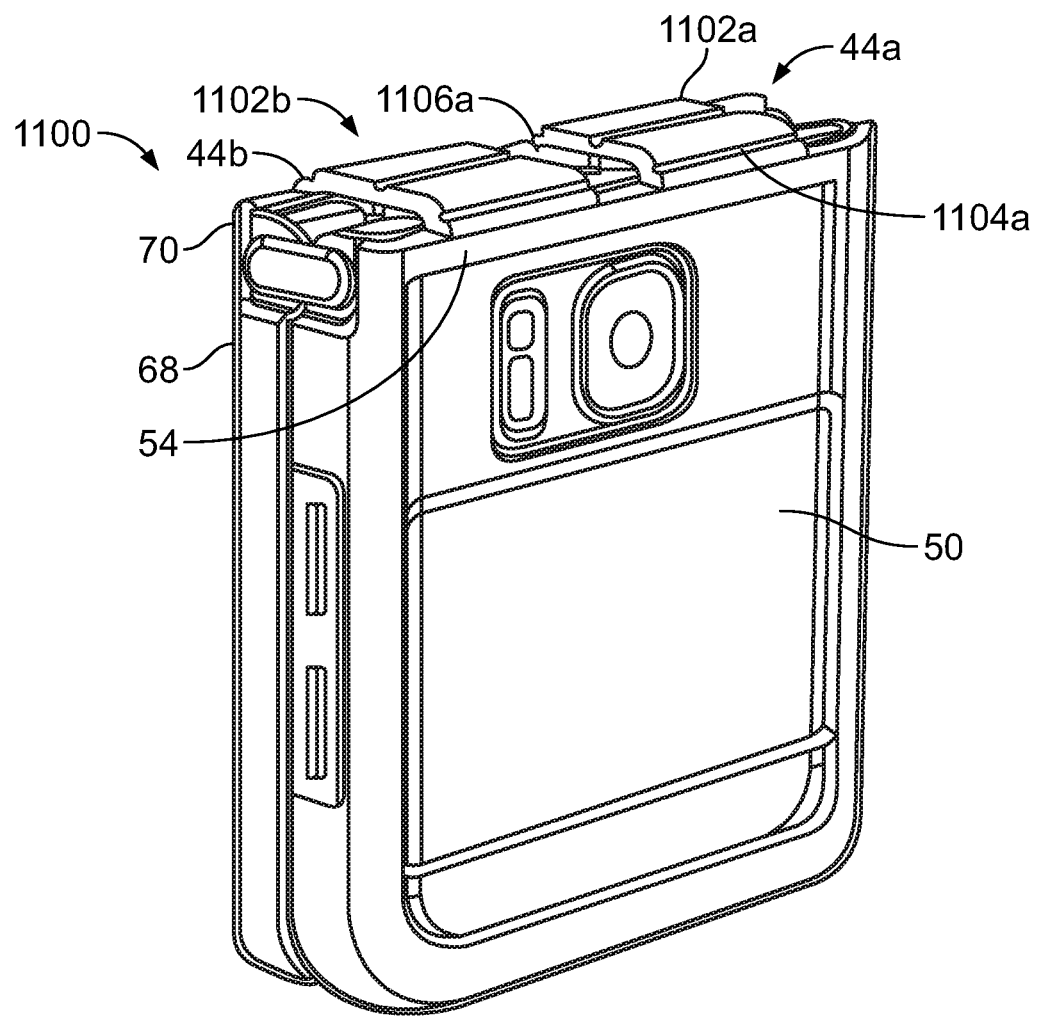

FIG. 36 illustrates a perspective inner view of a further embodiment of a protective enclosure 1100 with the encased electronic device 12 in the open first position, and FIG. 38 illustrates a perspective outer view of the protective enclosure 1100 with the encased electronic device 12 in the closed second position. The protective enclosure 1100 may include any or all of the features, functions, elements, or characteristics of any or all of the previously disclosed embodiments, such as the embodiment of the protective enclosure 700 illustrated in FIGS. 20 to 23C, and similar or identical components and elements will have identical reference numbers.

In the embodiment of the protective enclosure 1100, the first case portion 40 may be removable and/or displaceable from the second case portion 42 (or vice versa) by any method known in the art to allow an electronic device 12 to be inserted or removed from the protective enclosure 1100. In addition, the first case portion 40 may be pivotable relative to the second case portion 42 by any method known in the art. For example, as illustrated in FIG. 38, the protective enclosure 1100 may include the first hinge member 44a (that may be a first hinge element 1102a) and, optionally, a second hinge member 44b (that may be a second hinge element 1102b). Additional hinge members may also be included.

The first hinge element 1102a may be elongated and resilient and extend from a first end 1104a to a second end 1106a. The first hinge element 1102a may be made from any suitable material, such as a clear TPE, for example. The first end 1104a may be coupled to a portion of the first outer case portion 50 at or adjacent to the second end 54 of the first outer case portion 50. The first end 1104a of the first hinge element 1102a may be coupled to the portion of the first outer case portion 50 in any suitable manner. For example, the first end 1104a of the first hinge element 1102a may include a hook portion that engages a corresponding ridge at or adjacent to the second end 54 of the first outer case portion 50. The second end 1106a may be coupled to a portion of the second outer case portion 68 at or adjacent to the second end 70 of the second outer case portion 68. The second end 1106a of the first hinge element 1102a may be coupled to the portion of the second outer case portion 68 in any suitable manner. For example, second end 1106a of the first hinge element 1102a may include a hook portion that engages a corresponding ridge at or adjacent to the second end 70 of the second outer case portion 68.

The second hinge element 1102b may be substantially identical to the first hinge element 1102a and may be offset from the first hinge element 1102a along the device hinge axis 18. The second hinge element 1102b may be elongated and resilient and extend from a first end 1104b to a second end 1106b. The second hinge element 1102b may be made from any suitable material, such as a clear TPE, for example. The first end 1104b may be coupled to a portion of the first outer case portion 50 at or adjacent to the second end 54 of the first outer case portion 50. The first end 1104b of the second hinge element 1102b may be coupled to the portion of the first outer case portion 50 in any suitable manner. For example, the first end 1104b of the second hinge element 1102b may include a hook portion that engages a corresponding ridge at or adjacent to the second end 54 of the first outer case portion 50. The second end 1106b may be coupled to a portion of the second outer case portion 68 at or adjacent to the second end 70 of the second outer case portion 68. The second end 1106b of the second hinge element 1102b may be coupled to the portion of the second outer case portion 68 in any suitable manner. For example, second end 1106b of the second hinge element 1102b may include a hook portion that engages a corresponding ridge at or adjacent to the second end 70 of the second outer case portion 68.

The first hinge axis 46a (and the second hinge axis 46b) may be any axis of rotation of the first hinge element 1102a (and/or the second hinge element 1102b) as the first case portion 40 and the second case portion 42 pivot as the electronic device 12 pivots about the device hinge axis 18 between the open first position and the closed second position.

Figure 37:
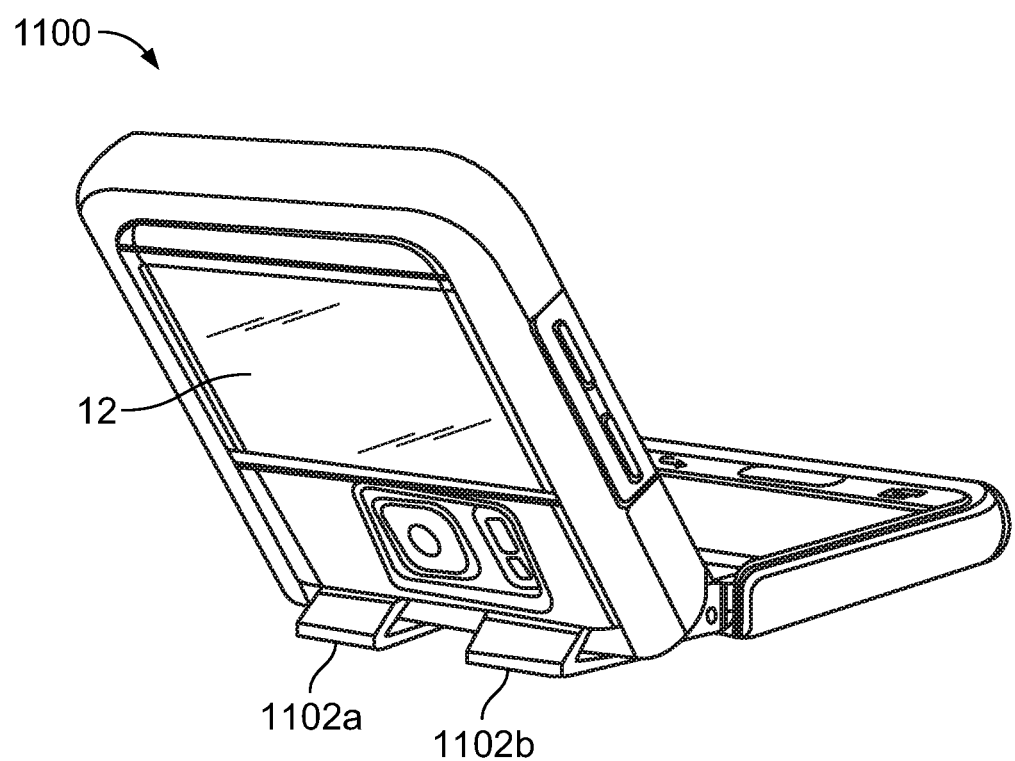

FIG. 37 illustrates a perspective outer view of the protective enclosure 1100 with the encased electronic device 12 in a "stand position" between the open first position and the closed second position. In the stand position, the first hinge element 1102a and the second hinge element 1102b maintain the first case portion 40 and the second case portion 42 at an angle less than 180° to allow a user to more easily view the top inner device display 24 (not shown).

Figure 39:
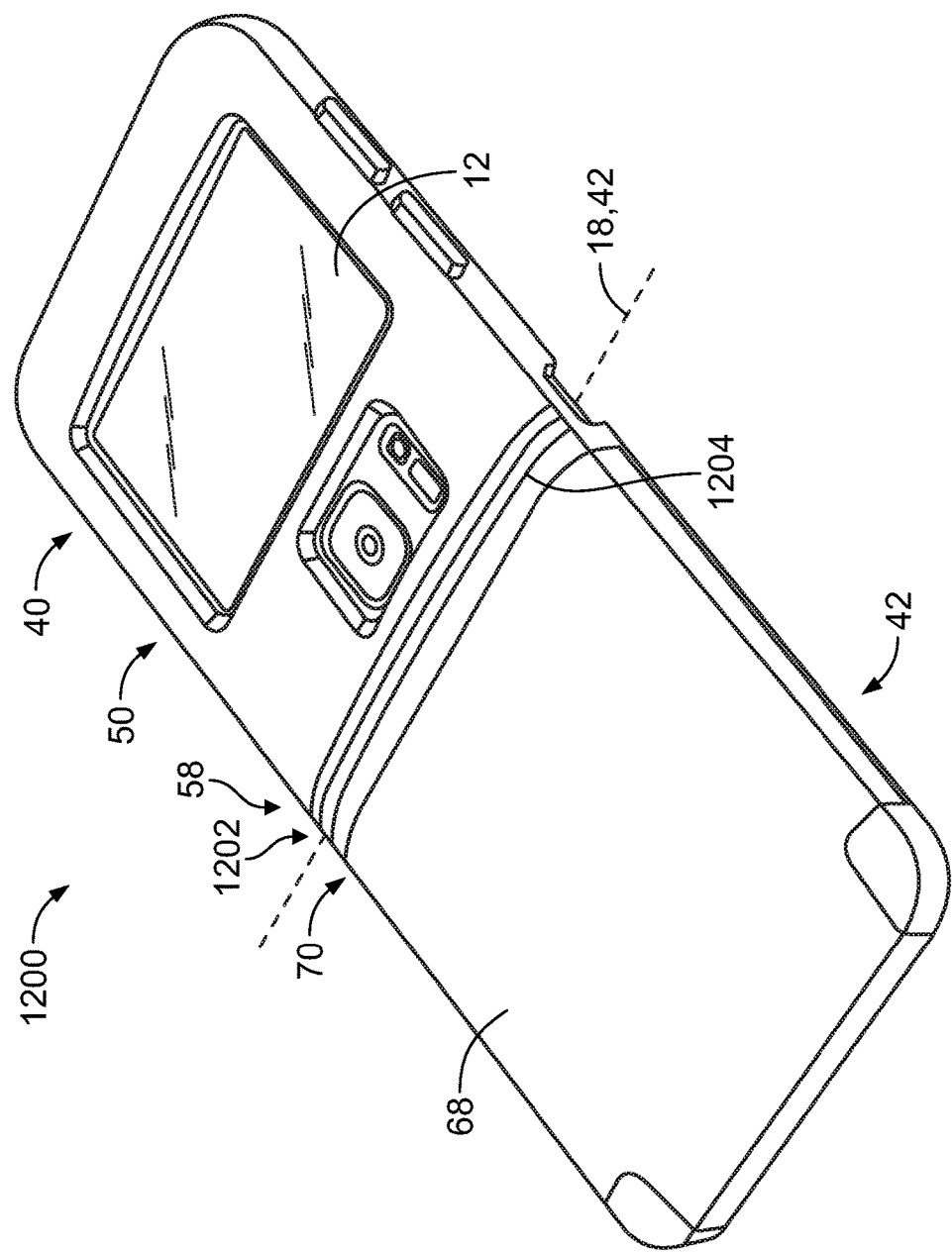
FIGS. 39 to 41 are various views of an embodiment of a protective enclosure for an electronic device.

FIG. 39 illustrates an outer perspective view of a further embodiment of a protective enclosure 1200 with the encased electronic device 12 in the open first position. The protective enclosure 1200 may include any or all of the features, functions, elements, or characteristics of the embodiment of the protective enclosure 200 illustrated in FIGS. 5 to 6B, and similar or identical components and elements will have identical reference numbers.

In this embodiment of the protective enclosure 1200, the first hinge member 44a includes a portion 1202 of material that extends from the second end 58 of the first outer case portion 50 to the second end 70 of the second outer case portion 68. The portion 1202 of material may be coupled to the second end 58 of the first outer case portion 50 and/or to the second end 70 of the second outer case portion 68. In some embodiments, the portion 1202 of material may be integrally and unitarily formed with the second end 58 of the first outer case portion 50 and/or with the second end 70 of the second outer case portion 68. The portion 1202 of material may be a single, unitary portion of flexible material or may be an assembly of two or more elements, portions, or types of flexible and non-flexible materials. In some embodiments, the portion 1202 of material may include two or more channels or recesses 1204 that extend parallel to the device hinge axis 18 and that facilitate the bending of the portion 1202 about the first hinge axis 46. In some embodiments, the two or more channels or recesses 1204 may include folds that cooperate to form a bellows or accordion-like structure. In this embodiment, the first hinge axis 46 may be an overall bending axis (or an effective bending axis) of the portion 1202 of material.

Figure 40:
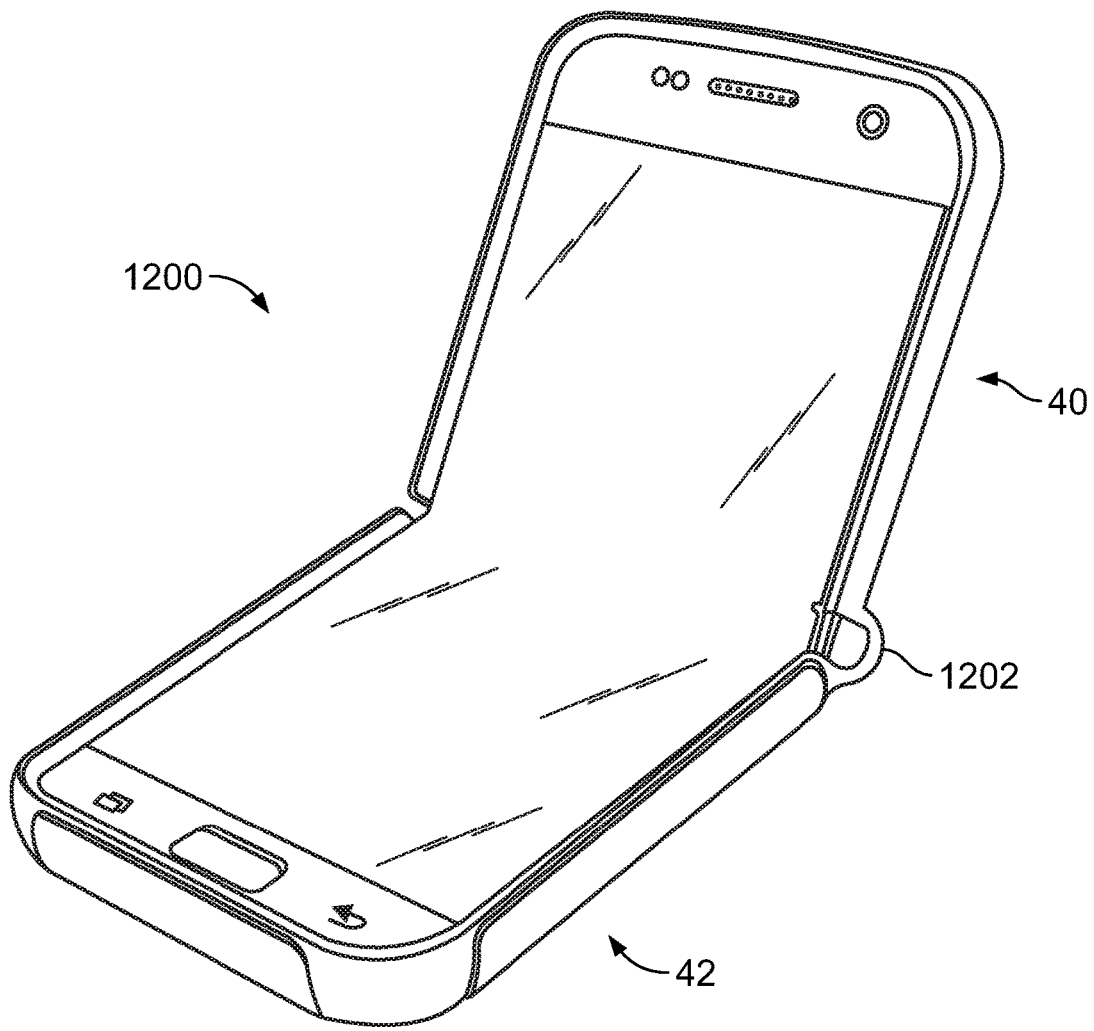
Figure 41:
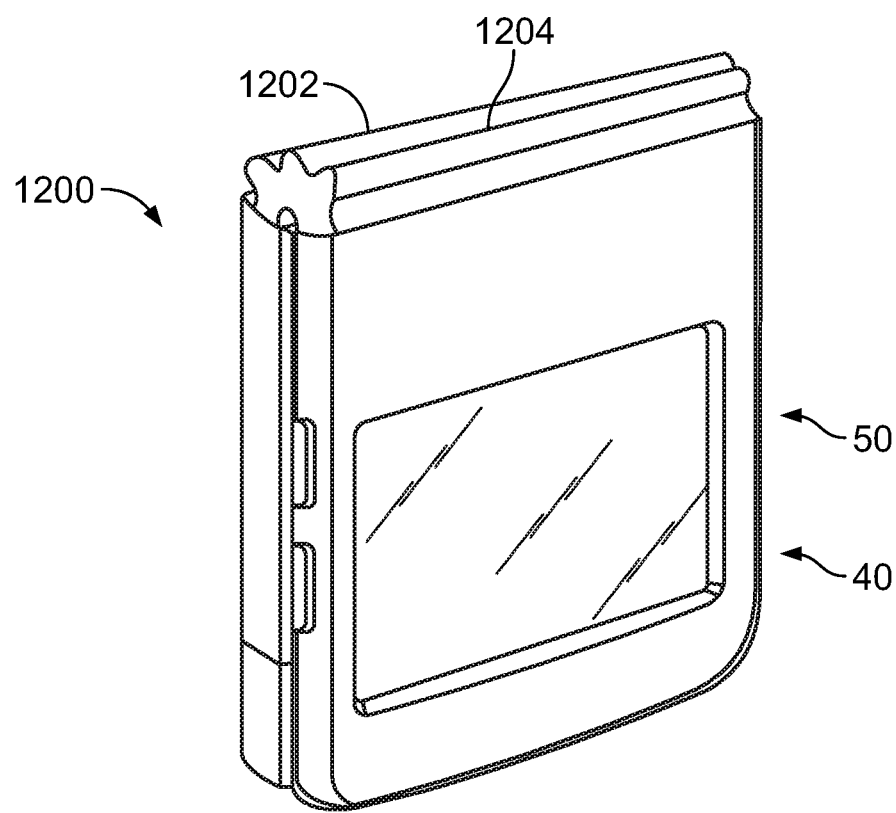

FIG. 40 illustrates a perspective inside view of the embodiment of the protective enclosure 1200 with the encased electronic device 12 in a position between the open first position and the second closed position. FIG. 41 illustrates a perspective front view of the embodiment of the protective enclosure 1200 with the encased electronic device 12 in the closed second position. The protective enclosure 1200 may be made from or comprise any suitable material or combination of materials. For example, the first case portion 50 and/or the second case portion 68 may have a hard inner shell (for example, a plastic material, such as polycarbonate) and a soft outer layer (for example, a resilient material, such as TPE).

Figure 42:
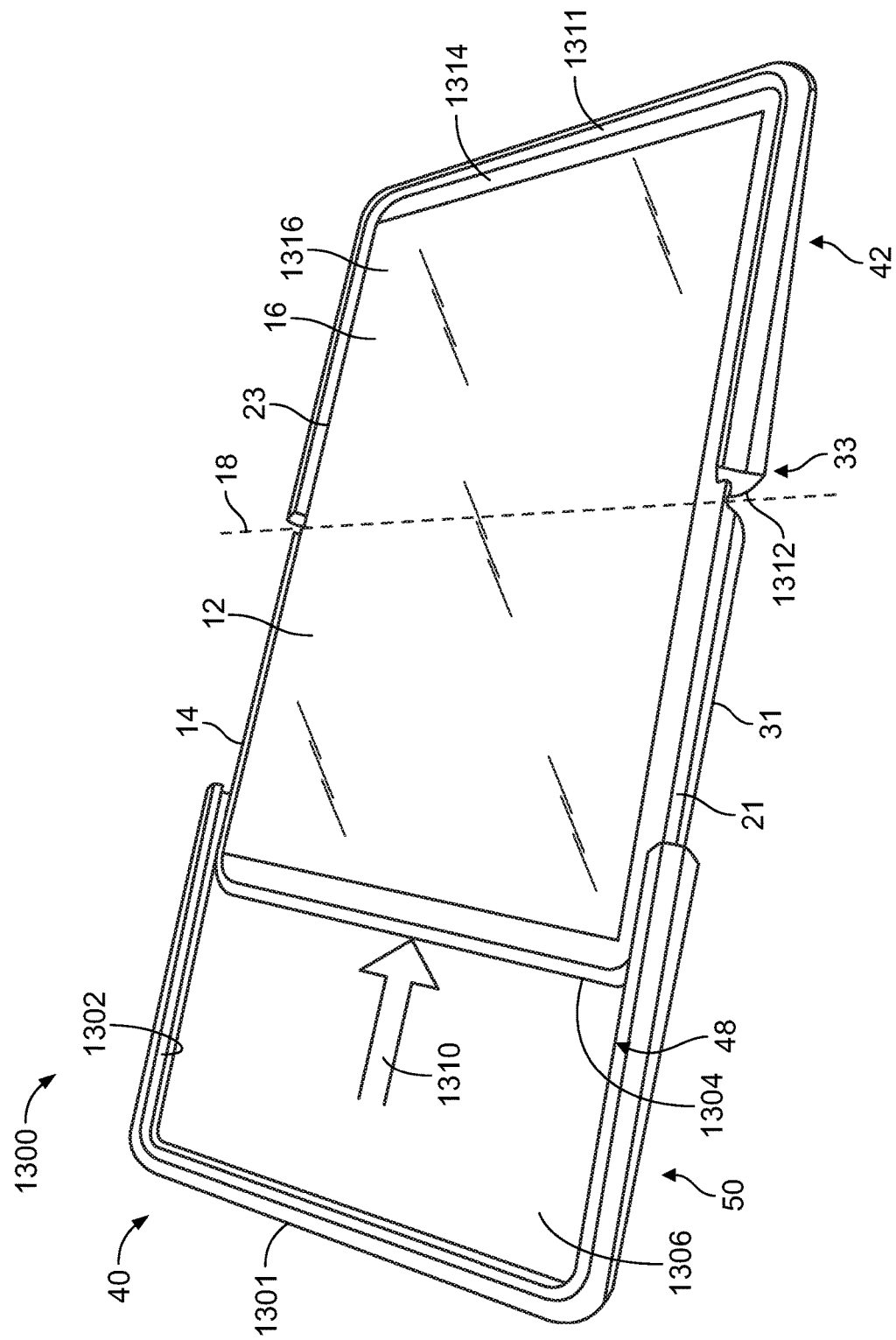
FIGS. 42 and 43 are various views of an embodiment of a protective enclosure for an electronic device.
Figure 43:
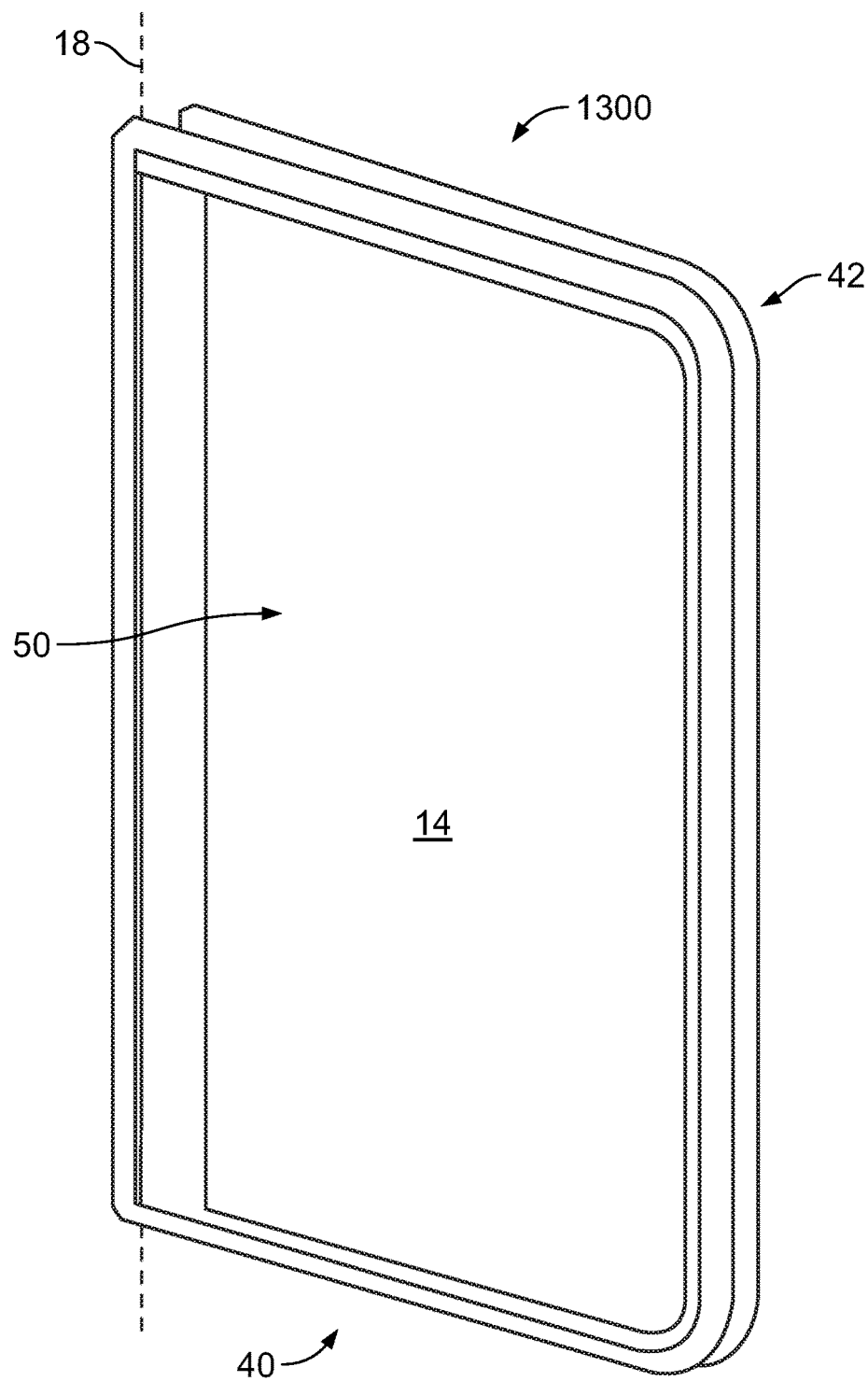

FIG. 42 illustrates a perspective partially-assembled view of a further embodiment of a protective enclosure 1300 with the encased electronic device 12 in the open first position, and FIG. 43 illustrates a perspective view of the protective enclosure 1300 with the encased electronic device 12 in the closed second position. The protective enclosure 1300 may include any or all of the features, functions, elements, or characteristics of the embodiment of the protective enclosure 800 illustrated in FIGS. 24 to 27C, and similar or identical components and elements will have identical reference numbers. The protective enclosure 1300 may be adapted to encase an electronic device 12 (e.g., a tablet or other mobile device) having a top device portion 14 pivotable relative to the bottom device portion 16 about the device hinge axis 18. In use, the electronic device 12 may be viewed in any of several configurations, including a configuration in which the device hinge axis 18 is vertically orientated relative to a user, and the top device portion 14 may be on a left side of the device hinge axis 18 and the bottom device portion 16 may be on a right side of the device hinge axis 18 (or vice versa).

In the embodiment of the protective enclosure 1300, the first case portion 40 may be removable and/or displaceable from the second case portion 42 (or vice versa) by any method known in the art to allow an electronic device 12 to be inserted or removed from the protective enclosure 1300. Specifically, and as illustrated in FIG. 42, the first inner case portion 48 and the first outer case portion 50 of the first case portion 40 may be removable from and insertable on the top device portion 14. For example, a peripheral portion 1301 of the first inner case portion 48 and/or the first outer case portion 50 may cooperate to form a peripheral channel 1302 that receives a corresponding portion of a peripheral edge 1304 of the top device portion 14. The peripheral edge 1304 of the top device portion 14 may correspond to top and lateral side portions of the top inner peripheral edge 21 and/or top and lateral side portions of the top outer peripheral edge 31. The peripheral channel 1302 of the first case portion 40 may include top and lateral side portions of the first inner case portion 48 and/or the first outer case portion 50 that correspond to the top and lateral side portions of the top inner peripheral edge 21 and/or top and lateral side portions of the top outer peripheral edge 31 of the top device portion 14. The first outer case portion 50 and/or the first inner case portion 48 may include a clear portion 1306 that is adapted to protect the inner surface 20 and/or the outer surface 30 of the top device portion 14. The clear portion 1306 may be made from or comprise a transparent or semi-transparent material (such as a glass material or polycarbonate material). The clear portion 1306 may be surrounded or partially surrounded by the peripheral portion 1301 of the first inner case portion 48 and/or the first outer case portion 50. In some embodiments, the first inner case portion 48 and/or the first outer case portion 50 may not include the clear portion 1306 and may just include the peripheral portion 1301 of the first inner case portion 48 and/or the first outer case portion 50. The peripheral portion 1301 may be made from or comprise a bumper material that may be an opaque material or a transparent or semi-transparent material. The bumper material may be resilient and may be capable of absorbing shocks from falls or impact. To insert the top device portion 14 into the first case portion 40, the first case portion 40 may be displaced along the arrow 1310 (indicating a direction normal to the device hinge axis 18) to cover all or a portion of the top device portion 14.

As illustrated in FIG. 42, the second inner case portion 60 and the second outer case portion 68 of the second case portion 42 may be removable from and insertable on the bottom device portion 16. For example, a peripheral portion 1311 of the second inner case portion 60 and/or the second outer case portion 68 may cooperate to form a peripheral channel 1312 that receives a corresponding portion of a peripheral edge 1314 of the bottom device portion 16. The peripheral edge 1314 of the bottom device portion 16 may correspond to top and lateral side portions of the bottom inner peripheral edge 23 and/or top and lateral side portions of the bottom outer peripheral edge 33. The peripheral channel 1312 of the bottom device portion 16 may include top and lateral side portions of the second inner case portion 60 and/or the second outer case portion 68 that correspond to the top and lateral side portions of the bottom inner peripheral edge 23 and/or top and lateral side portions of the bottom outer peripheral edge 33 of the bottom device portion 16. The second outer case portion 68 and/or the second inner case portion 60 may include a clear portion 1316 that is adapted to protect the inner surface 22 and/or the outer surface 32 of the bottom device portion 16. The clear portion 1316 may be surrounded or partially surrounded by the peripheral portion 1311 of the second inner case portion 60 and/or the first outer case portion 50. In some embodiments, the second outer case portion 68 and/or the second inner case portion 60 may not include the clear portion 1316 and may just include the peripheral portion 1311 of the second inner case portion 60 and/or the first outer case portion 50. The peripheral portion 1311 may be made from or comprise the bumper material previously described. The second case portion 42 may be displaced in a direction opposite the arrow 1310 (indicating a direction normal to the device hinge axis 18) to cover all or a portion of the bottom device portion 16.

With the top device portion 14 disposed and/or secured in the first case portion 40 and the bottom device portion 16 disposed and/or secured in the second case portion 42, the electronic device may be pivoted about the device hinge axis 18 between the first open position and the second closed position, which is illustrated in the perspective view of FIG. 43.

Figure 44:
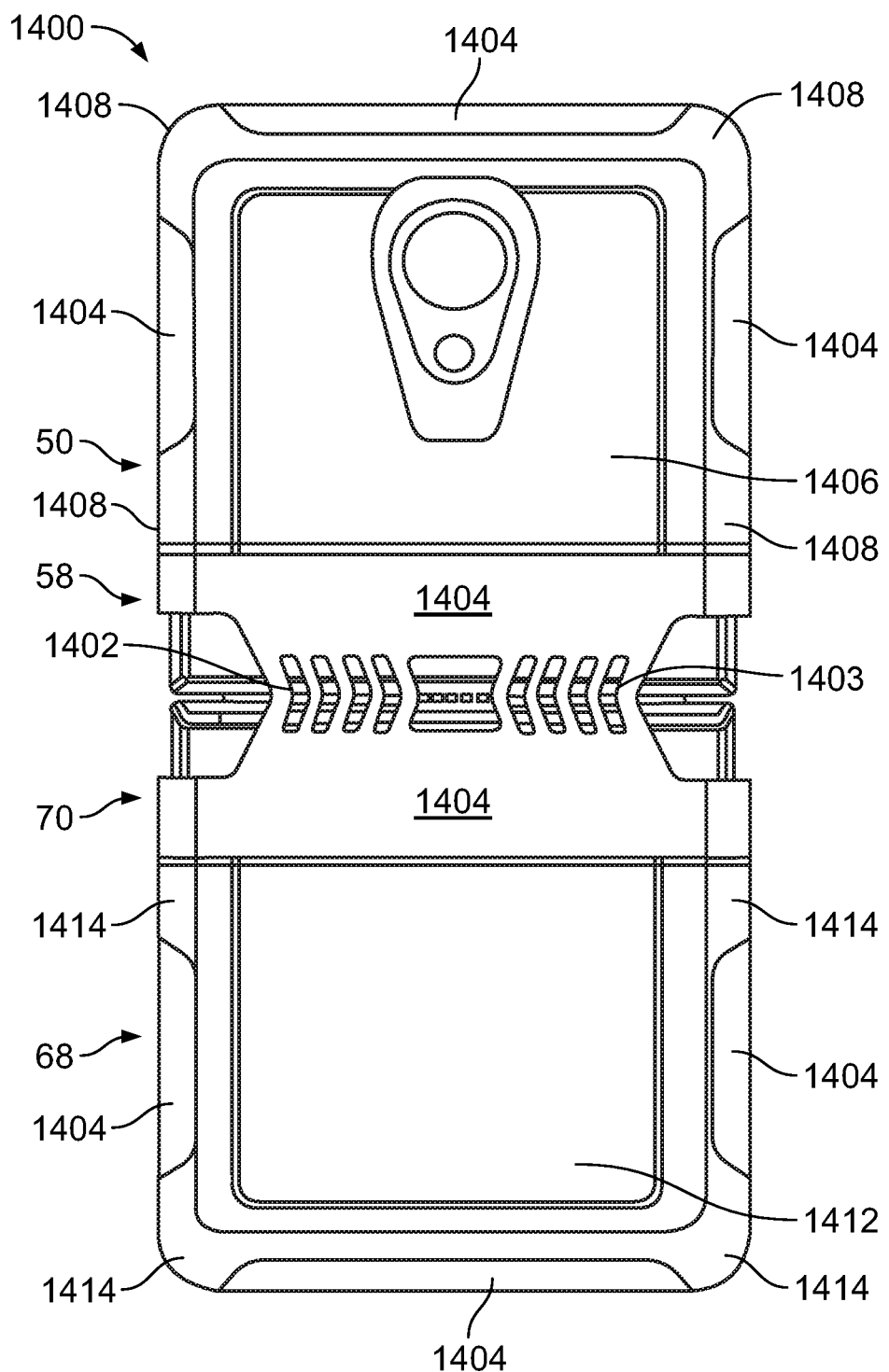
FIGS. 44 and 45 are various views of an embodiment of a protective enclosure for an electronic device.

FIG. 44 illustrates an outer view of a further embodiment of a protective enclosure 1400 with the encased electronic device 12 in the open first position. The protective enclosure 1400 may include any or all of the features, functions, elements, or characteristics of any or all of the previously disclosed embodiments, such as the embodiment of the protective enclosure 200 illustrated in FIGS. 5 to 6B, and similar or identical components and elements will have identical reference numbers.

In this embodiment of the protective enclosure 1400, the first hinge member 44a includes a portion 1402 of material that extends from the second end 58 of the first outer case portion 50 to the second end 70 of the second outer case portion 68. The portion 1402 of material may be coupled to the second end 58 of the first outer case portion 50 and/or to the second end 70 of the second outer case portion 68. In some embodiments, the portion 1402 of material may be integrally and unitarily formed with the second end 58 of the first outer case portion 50 and/or with the second end 70 of the second outer case portion 68. The portion 1402 of material may be a single, unitary portion of flexible material or may be an assembly of two or more elements, portions, or types of flexible and non-flexible materials. In some embodiments, the portion 1402 of material may include two or more apertures or slots 1403 that extend generally normal to the device hinge axis 18 and that facilitate the bending of the portion 1402 about the first hinge axis 46. In this embodiment, the first hinge axis 46 may be an overall bending axis (or an effective bending axis) of the portion 1402 of material.

Figure 45:
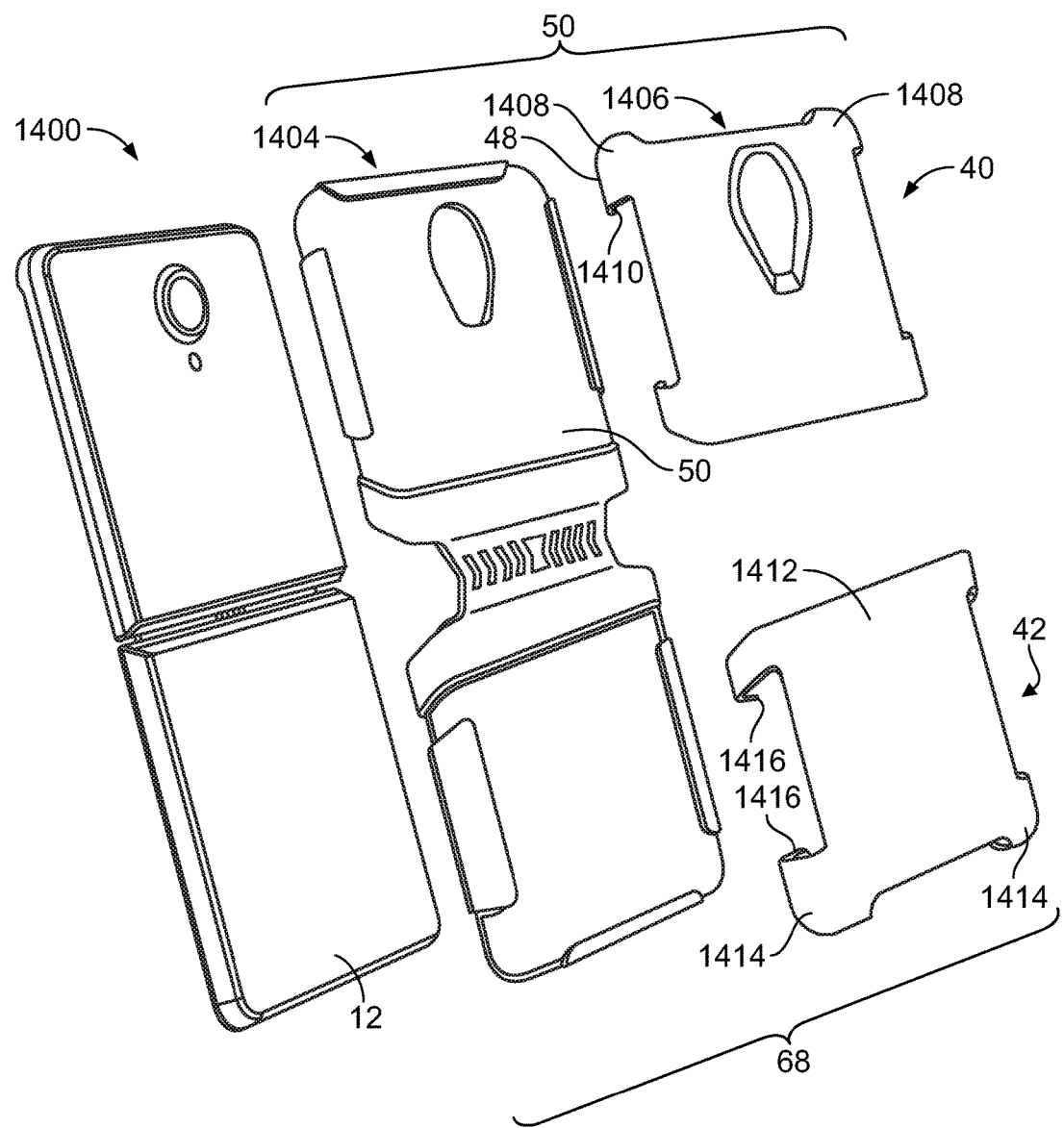

The material comprising the portion 1402 may be unitarily formed with an underlayer 1403 that partially comprises all or a portion of the first outer case portion 50 and the second outer case portion 68. The material may be soft and resilient, such as a TPE, and the layer may be a shock-absorbing protective layer. The material may also form part or all of the first inner case portion 48 and the second inner case portion 60. The first outer case portion 50 may also include a first outer shell 1406 that covers at least a portion of the first outer case portion 50 to provide additional protection to the first outer case portion 50. The first outer shell 1406 may be made from or comprise a hard and/or rigid material, such as polycarbonate. FIG. 45 illustrates a partially exploded perspective view of the protective enclosure 1400, and FIG. 45 illustrates that the first outer shell 1406 may include two or more wing portions 1408 that may each have undercut portions 1410 that may each be adapted to capture a portion (e.g., a corner portion and/or a lateral portion) of the electronic device 12 to secure the electronic device 12 within the first case portion 40. In some embodiments, the two or more wing portions 1408 (or portions of the two or more wing portions 1408) may be the first inner case portion 48. Portions of the underlayer 1404 may be recessed in areas that mate with the first outer shell 1406 such that the first outer case portion 50 may have a surface with a substantially uniform height.

The second outer case portion 68 may also include a second outer shell 1412 that covers at least a portion of the second outer case portion 68 to provide additional protection to the second outer case portion 68. The second outer shell 1412 may be made from or comprise a hard and/or rigid material, such as polycarbonate. As illustrated in FIG. 45, the second outer shell 1412 may include two or more wing portions 1414 that may each have undercut portions 1416 that may each be adapted to capture a portion (e.g., a corner portion and/or a lateral portion) of the electronic device 12 to secure the electronic device 12 within the second case portion 42. In some embodiments, the two or more wing portions 1414 (or portions of the two or more wing portions 1414) may be the second inner case portion 68. Portions of the underlayer 1404 may be recessed in areas that mate with the second outer shell 1412 such that the second outer case portion 68 may have a surface with a substantially uniform height.

FIG. 46A illustrates a perspective view of a further embodiment of a protective enclosure 1500 with the encased electronic device 12 in the open first position and with a stand portion 1502 in a usage position. The protective enclosure 1500 may include any or all of the features, functions, elements, or characteristics of all of the previously disclosed embodiments, such as the embodiment of the protective enclosure 800 illustrated in FIGS. 24 to 27C and/or the embodiment of the protective enclosure 1000 illustrated in FIGS. 32 to 35C, and similar or identical components and elements will have identical reference numbers.

In some embodiments, the stand portion 1502 may have a first arm portion 1504a and a second arm portion 1504b. The first arm portion 1504a may be elongated and may extend from a first end 1506a to a second end 1508a. The first end 1506a may be pivotably secured to a first lateral portion 1510 of the first case portion 40 and/or the second case portion 42. The second arm portion 1504b may be elongated and may extend from a first end 1506b to a second end 1508b. The first end 1506b may be pivotably secured to a second lateral portion 1512 of the first case portion 40 and/or the second case portion 42. A cross-arm portion 1514 may extend from the second end 1508a of the first arm portion 1504a to the second end 1508b of the second arm portion 1504b, and the first arm portion 1504a, the second arm portion 1504b, and the cross-arm portion 1514 may cooperate to form a U-shape that may generally correspond in shape and dimensions to corresponding portions of the second outer perimeter edge 71 of the second outer case portion 68. Accordingly, when the stand portion 1502 is in a stowed position (as illustrated in FIG. 46B), the stand portion 1502 may extend around corresponding portions of the second outer perimeter edge 71 of the second outer case portion 68 to minimize the overall size of the protective enclosure 1500.

The first end 1506a of the first arm portion 1504a and the first end 1506b of the second arm portion 1504b may be pivotably coupled to any portion of the first case portion 40 and/or the second case portion 42 in any suitable manner and in any suitable position (e.g., a portion at, adjacent to, or aligned with) the first hinge axis 48 and/or the device hinge axis 18). In addition, the first end 1506a of the first arm portion 1504a and/or the first end 1506b of the second arm portion 1504b may be directly or indirectly coupled to any portion of the first case portion 40 and/or the second case portion 42.

During normal use of the electronic device 12, the stand portion 1502 may be maintained in the stowed position. For example, FIG. 46B illustrates a perspective view of the protective enclosure 1500 with the encased electronic device 12 in the closed position and with a stand portion 1502 in the stowed position. When it is desired to use the stand portion 1502, any portion of the stand portion 1502 may be grasped by a user and the first end 1506a of the first arm portion 1504a and the first end 1506b of the second arm portion 1504b may be pivoted into the usage position. The stand portion 1502 may be capable of a single usage position or two or more usage positions. In some embodiments, a mechanical stop (or stops) or friction may maintain the stand portion 1502 in the usage position(s). With the stand portion 1502 in one or more of the usage positions, the stand portion 1502 may be used as a kickstand to maintain the electronic device 12 (in the first open position) in a vertical or substantially vertical orientation. Alternatively, the stand portion 1502 may be used as a brace to maintain the electronic device 12 (in the first open position) in a horizontal or substantially horizontal orientation. Any other suitable uses for the stand portion 1502 are also contemplated.

Figure 47B:
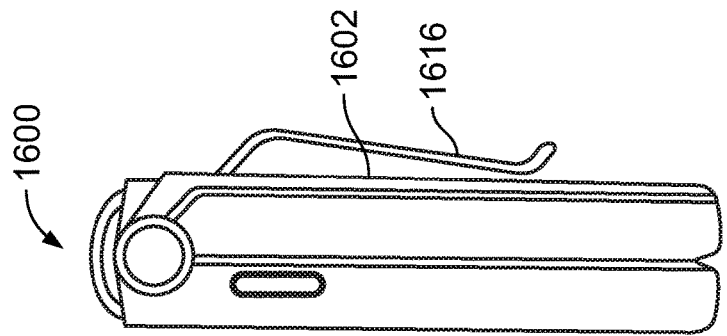
FIGS. 47A and 47B are various views of an embodiment of a protective enclosure for an electronic device.
Figure 47A:
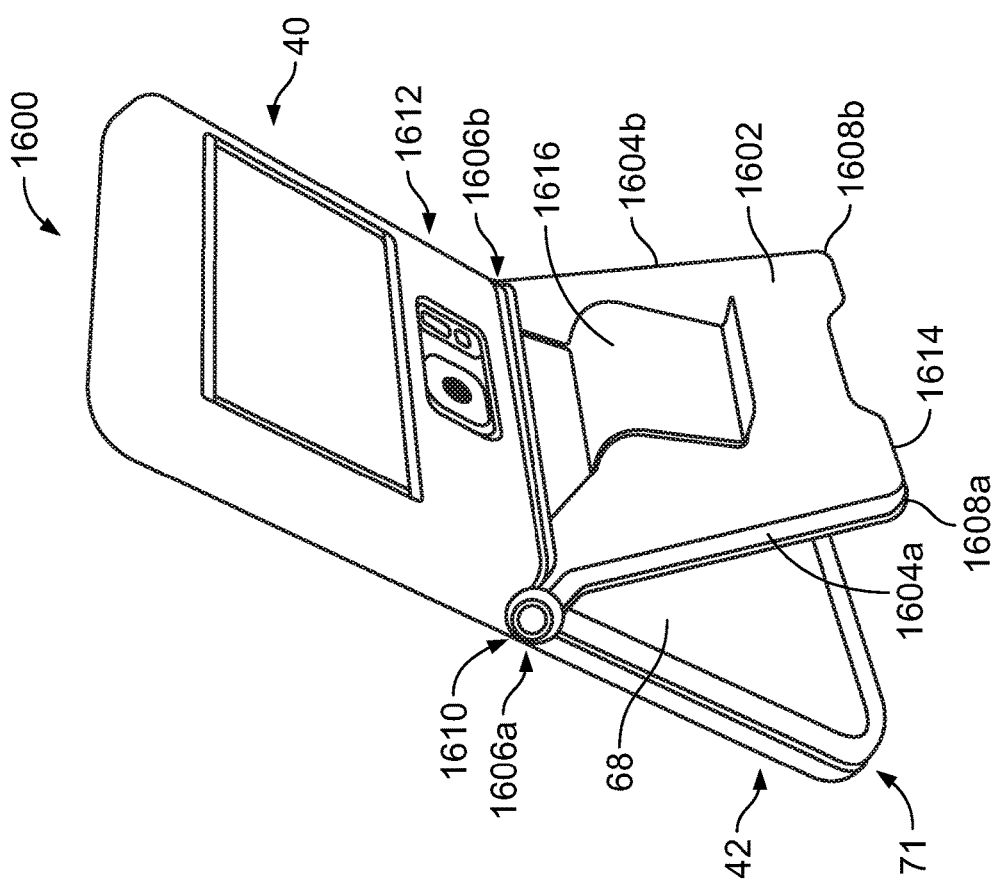

FIG. 47A illustrates a perspective view of a further embodiment of a protective enclosure 1600 with the encased electronic device 12 in the open first position and with a stand portion 1602 in a usage position. The protective enclosure 1600 may include any or all of the features, functions, elements, or characteristics of any or all of the previously disclosed embodiments, such as the embodiment of the protective enclosure 800 illustrated in FIGS. 24 to 27C and/or the embodiment of the protective enclosure 1000 illustrated in FIGS. 32 to 35C, and similar or identical components and elements will have identical reference numbers.

In some embodiments, the stand portion 1602 of the protective enclosure 1600 may be substantially similar to stand portion 1502 of the protective enclosure 1500 but may cover all or a portion of the second outer case portion 68 when the stand portion 1602 in the usage position. More specifically, the stand portion 1602 may be planar, partially planar, or substantially planar and may be adapted to cover all or a portion the second outer case portion 68 when the stand portion 1602 in the usage position.

In some embodiments, the stand portion 1602 may have a first edge portion 1604a and a second edge portion 1604b. The first edge portion 1604a may be elongated and may extend from a first end 1606a to a second end 1608a. The first end 1606a may be pivotably secured to a first lateral portion 1610 of the first case portion 40 and/or the second case portion 42. The second edge portion 1604b may be elongated and may extend from a first end 1606b to a second end 1608b. The first end 1606b may be pivotably secured to a second lateral portion 1612 of the first case portion 40 and/or the second case portion 42. A bottom edge portion 1614 may extend from the second end 1608a of the first edge portion 1604a to the second end 1608b of the second edge portion 1604b, and the first edge portion 1604a, the second edge portion 1604b, and the cross-edge portion 1614 may cooperate to form a shape that may generally correspond in shape and dimensions to corresponding portions of the second outer perimeter edge 71 of the second outer case portion 68.

The first end 1606a of the first edge portion 1604a and the first end 1606b of the second edge portion 1604b may be pivotably coupled to any portion of the first case portion 40 and/or the second case portion 42 in any suitable manner and in any suitable position. In addition, the first end 1606a of the first edge portion 1604a and/or the first end 1606b of the second edge portion 1604b may be directly or indirectly coupled to any portion of the first case portion 40 and/or the second case portion 42.

During normal use of the electronic device 12, the stand portion 1602 may be maintained in the stowed position. For example, FIG. 47B illustrates a side view of the protective enclosure 1600 with the encased electronic device 12 in the closed position and with a stand portion 1602 in the stowed position. When it is desired to use the stand portion 1602, any portion of the stand portion 1602 may be grasped by a user and the first end 1606a of the first edge portion 1604a and the first end 1606b of the second edge portion 1604b may be pivoted into the usage position. The stand portion 1602 may be capable of a single usage position or two or more usage positions. In some embodiments, a mechanical stop (or stops) or friction may maintain the stand portion 1602 in the usage position(s). With the stand portion 1602 in one or more of the usage positions, the stand portion 1602 may be used as a kickstand to maintain the electronic device 12 (in the first open position) in a vertical or substantially vertical orientation, as illustrated in FIG. 47A. Any other suitable uses for the stand portion 1602 are also contemplated. In some embodiments, a belt clip 1616 may be attached to any suitable portion of the stand portion 1602 in any suitable manner.

FIG. 48A illustrates an outer view of a further embodiment of a protective enclosure 1700 with the encased electronic device 12 in the open first position. The protective enclosure 1700 may include any or all of the features, functions, elements, or characteristics of any or all of the previously disclosed embodiments, such as the embodiment of the protective enclosure 200 illustrated in FIGS. 5 to 6B, and similar or identical components and elements will have identical reference numbers.

As illustrated in FIG. 48A, the first hinge member 44a of the protective enclosure 1700 includes a portion 1702 of material that extends from the second end 58 of the first outer case portion 50 to the second end 70 of the second outer case portion 68. The portion 1702 of material may be coupled to the second end 58 of the first outer case portion 50 and/or to the second end 70 of the second outer case portion 68. In some embodiments, the portion 1702 of material may be integrally and unitarily formed with the second end 58 of the first outer case portion 50 and/or with the second end 70 of the second outer case portion 68. The portion 1702 of material may be a single, unitary portion of flexible material or may be an assembly of two or more elements, portions, or types of flexible and non-flexible materials. In this embodiment, the first hinge axis 46 may be an overall bending axis (or an effective bending axis) of the portion 1702 of material.

As illustrated in FIG. 48B, which illustrates a side view of the embodiment of the protective enclosure 1700 with the encased electronic device 12 in the second closed position, the material comprising the portion 1702 may be unitarily formed with an underlayer 1704 that partially comprises all or a portion of the first outer case portion 50 and the second outer case portion 68. The material may be soft and resilient, such as a mesh or a TPE, and the layer may be a shock-absorbing protective layer. The material may also form part or all of the first inner case portion 48 and the second inner case portion 60. The first outer case portion 50 may also include a first outer shell 1706 that covers at least a portion of the first outer case portion 50 to provide additional protection to the first outer case portion 50. The first outer shell 1706 may be made from or comprise a hard and/or rigid material, such as polycarbonate. The first outer shell 1706 may be attached to the first case portion 40 and/or the top device portion 14 in any suitable manner. In some embodiments, the first outer shell 1706 may also include all or portions of the first inner case portion 48. In some embodiments, the first outer shell 1706 may include wing portions (not shown) that may each have undercut portions that may each be adapted to capture a portion (e.g., a corner portion and/or a lateral portion) of the electronic device 12 to secure the electronic device 12 within the first case portion 40. In some embodiments, the two or more wing portions (or portions of the two or more wing portions) may comprise all or part of the first inner case portion 48. FIG. 48C illustrates a cross-section of the first outer case portion 50 having the first outer shell 1706 and the underlayer 1704.

The second outer case portion 68 may also include a second outer shell 1708 that covers at least a portion of the second outer case portion 68 to provide additional protection to the second outer case portion 68. The second outer shell 1708 may be made from or comprise a hard and/or rigid material, such as polycarbonate. The second outer shell 1708 may be attached to the second case portion 42 and/or the bottom device portion 16 in any suitable manner. In some embodiments, the second outer shell 1708 may also include all or portions of the second inner case portion 60. In some embodiments, the second outer shell 1708 may include wing portions (not shown) that may each have undercut portions that may each be adapted to capture a portion (e.g., a corner portion and/or a lateral portion) of the electronic device 12 to secure the electronic device 12 within the second case portion 42. In some embodiments, the two or more wing portions (or portions of the two or more wing portions) may comprise all or part of the second inner case portion 60.

As illustrated in FIG. 48A, one or more hinge shell portions 1712 may extend over all or a part of the portion 1702 of material in a direction parallel to the device hinge axis 18 and/or the first hinge axis 46, and the one or more hinge shell portions 1712 may protect the portion 1702 of material from abrasion while allowing the portion 1702 to bend along the first hinge axis 46.

While various embodiments have been described above, this disclosure is not intended to be limited thereto. Variations can be made to the disclosed embodiments that are still within the scope of the appended claims. For example, any element or feature of any or all of the disclosed protective enclosures may be included with or omitted from any or all of the other disclosed protective enclosures.

What is claimed is:

1. A protective enclosure for at least partially enclosing an electronic device that includes a top device portion having an inner device display and a bottom device portion displaceable relative to the top device portion about a device hinge axis, the protective enclosure comprising:
   a first case portion adapted to surround at least a portion of the top device portion when the electronic device is at least partially enclosed in the protective enclosure, wherein the first case portion includes a first outer case portion adapted to surround at least a portion of an outer surface of the top device portion, the first outer case portion including a first aperture adapted to align with at least a portion of an outer device display of the electronic device when the electronic device is at least partially enclosed in the protective enclosure;
   a second case portion adapted to surround at least a portion of the bottom device portion when the electronic device is at least partially enclosed in the protective enclosure; and
   a hinge member connecting the first case portion and the second case portion, the hinge member including:
      a first hinge arm coupled to the first case portion;
      a second hinge arm coupled to the second case portion; and
      an intermediary member coupled to the first hinge arm and the second hinge arm and adapted to allow rotation of the first hinge arm relative to the second hinge arm about a first hinge axis adapted to be parallel to the device hinge axis when the electronic device is at least partially enclosed in the protective enclosure.

2. The protective enclosure of claim 1, wherein the first hinge arm is coupled to the intermediary member with a first mechanism adapted to allow the first hinge arm to rotate relative to the intermediary member about a first axis and the second hinge arm is coupled to the intermediary member with a second mechanism adapted to allow the second hinge arm to rotate relative to the intermediary member about a second axis.

3. The protective enclosure of claim 2, wherein the first mechanism and the second mechanism are each a pin and slot mechanism.

4. The protective enclosure of claim 1, wherein the first case portion includes a first inner case portion adapted to surround at least a portion of the top device portion when the electronic device is at least partially enclosed in the protective enclosure, the first inner case portion including a first lateral segment, a second lateral segment, and an upper segment that extends between an end of the first lateral segment and an end of the second lateral segment, and wherein the second case portion includes a second inner case portion adapted to surround at least a portion of the bottom device portion when the electronic device is at least partially enclosed in the protective enclosure, the second inner case portion including a third lateral segment, a fourth lateral segment, and a lower segment that extends between an end of the third lateral segment and an end of the fourth lateral segment.

5. The protective enclosure of claim 4, wherein the first lateral segment, the second lateral segment, and the upper segment of the first inner case portion and the third lateral segment, the fourth lateral segment, and the lower segment of the second inner case portion form a frame adapted to surround a main device display of the electronic device when the electronic device is at least partially enclosed in the protective enclosure.

6. A protective enclosure for at least partially enclosing an electronic device that includes a top device portion having an inner device display and a bottom device portion displaceable relative to the top device portion about a device hinge axis, the protective enclosure comprising:
   a first case portion including a first end and a second end opposite the first end, the first case portion adapted to surround at least a portion of the top device portion when the electronic device is at least partially enclosed in the protective enclosure, wherein the first case portion includes a first outer case portion adapted to surround at least a portion of an outer surface of the top device portion, the first outer case portion including a first aperture adapted to align with at least a portion of an outer device display of the electronic device when the electronic device is at least partially enclosed in the protective enclosure;
   a second case portion including a third end and a fourth end opposite the third end, the second case portion adapted to surround at least a portion of the bottom device portion when the electronic device is at least partially enclosed in the protective enclosure; and
   a hinge member connecting the first case portion and the second case portion, the hinge member including two or more hinged segments, the hinge member coupling the second end of the first case portion with the third end of the second case portion, the hinge member adapted to allow rotation of the first case portion relative to the second case portion about a first hinge axis adapted to be parallel to the device hinge axis when the electronic device is at least partially enclosed in the protective enclosure.

7. The protective enclosure of claim 6, wherein the hinge member comprises three hinged segments.

8. The protective enclosure of claim 6, wherein the two or more hinged segments extend in a direction parallel to the first hinge axis.

9. The protective enclosure of claim 6, wherein the two or more hinged segments are adapted to extend in a direction parallel to the device hinge axis when the electronic device is at least partially enclosed in the protective enclosure.

10. The protective enclosure of claim 6, wherein the hinge member includes one or more recesses extending in a direction parallel to the first hinge axis, the one or more recesses adapted to assist the hinge member in bending along the first hinge axis.

11. A protective enclosure for at least partially enclosing an electronic device that includes a top device portion and a bottom device portion displaceable relative to the top device portion about a device hinge axis, the protective enclosure comprising:
   a first case portion including a first end and a second end opposite the first end, the first case portion adapted to surround at least a portion of the top device portion when the electronic device is at least partially enclosed in the protective enclosure;

a second case portion including a third end and a fourth end opposite the third end, the second case portion adapted to surround at least a portion of the bottom device portion when the electronic device is at least partially enclosed in the protective enclosure; and a hinge member connecting the first case portion and the second case portion and adapted to allow rotation of the first case portion relative to the second case portion about a first hinge axis adapted to be parallel to the device hinge axis when the electronic device is at least partially enclosed in the protective enclosure, the hinge member including a first elongated hinge element extending from a first end to a second end, the first end of the first elongated hinge element coupled to the second end of the first case portion, and the second end of the first elongated hinge element coupled to the third end of the second case portion.

12. The protective enclosure of claim 11, wherein the first end of the first elongated hinge element includes a first pin received in a first aperture formed in the first case portion and adapted to allow the first end of the first elongated hinge element to rotate relative to the first case portion.

13. The protective enclosure of claim 12, wherein the second end of the first elongated hinge element includes a second pin received in a second aperture formed in the second case portion and adapted to allow the second end of the first elongated hinge element to rotate relative to the second case portion.

14. The protective enclosure of claim 11, wherein the first elongated hinge element is formed from a rigid material.

15. The protective enclosure of claim 11, wherein the hinge member further comprises a second elongated hinge element extending from a first end to a second end, the first end of the second elongated hinge element coupled to the second end of the first case portion, and the second end of the second elongated hinge element coupled to the fourth end of the second case portion.

16. The protective enclosure of claim 11, wherein the first case portion includes a first set of teeth along the second end and the second case portion includes a second set of teeth along the third end, the first set of teeth adapted to releasably engage the second set of teeth.

17. The protective enclosure of claim 16, wherein an end portion of each tooth of the first set of teeth is adapted to releasably engage an end portion of a corresponding tooth of the second set of teeth.

18. The protective enclosure of claim 11, wherein the first end of the first elongated hinge element includes a first hook portion adapted to engage a first corresponding ridge of the second end of the first case portion and the second end of the first elongated hinge element includes a second hook portion adapted to engage a second corresponding ridge of the third end of the second case portion.

* * * * *